US008349688B2

(12) United States Patent
Masuoka et al.

(10) Patent No.: US 8,349,688 B2
(45) Date of Patent: Jan. 8, 2013

(54) NONVOLATILE SEMICONDUCTOR MEMORY TRANSISTOR AND METHOD FOR MANUFACTURING NONVOLATILE SEMICONDUCTOR MEMORY

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 48 days.

(21) Appl. No.: 13/178,315

(22) Filed: Jul. 7, 2011

(65) Prior Publication Data
US 2012/0025292 A1 Feb. 2, 2012

Related U.S. Application Data

(60) Provisional application No. 61/368,749, filed on Jul. 29, 2010.

(30) Foreign Application Priority Data

Jul. 29, 2010 (JP) ................... 2010-170870

(51) Int. Cl.
H01L 21/336 (2006.01)
H01L 29/788 (2006.01)
(52) U.S. Cl. ........................ 438/267; 257/316
(58) Field of Classification Search ............. 365/185.28, 365/185.29; 438/266–272; 257/316–320
See application file for complete search history.

(56) References Cited

U.S. PATENT DOCUMENTS 7,009,888 B2 * 3/2006 Masuoka et al. ......... 365/185.28
7,940,573 B2 * 5/2011 Masuoka et al. ......... 365/185.29

OTHER PUBLICATIONS

Ohba, Takuya et al., "A novel tri-control gate surrounding gate transistor (TCG-SGT) nonvolatile memory cell for flash memory," Solid State Electronics, 2006, vol. 50, pp. 924-928.

* cited by examiner

Primary Examiner — Calvin Lee
(74) Attorney, Agent, or Firm — Brinks Hofer Gilson & Lione

(57) ABSTRACT

A nonvolatile semiconductor memory transistor includes an island-shaped semiconductor having a source region, a channel region, and a drain region formed in this order from the Si substrate side, a floating gate surrounding the outer periphery of the channel region with a tunnel insulating film interposed therebetween, a control gate surrounding the outer periphery of the floating gate with an inter-polysilicon insulating film interposed therebetween, and a control gate line connected to the control gate and extending in a predetermined direction. The floating gate extends to regions below and above the control gate and to a region below the control gate line. The inter-polysilicon insulating film is interposed between the floating gate and the upper surface, lower surface, and inner side surface of the control gate and between the control gate line and a portion of the floating gate that extends to the region below the control gate line.

3 Claims, 50 Drawing Sheets

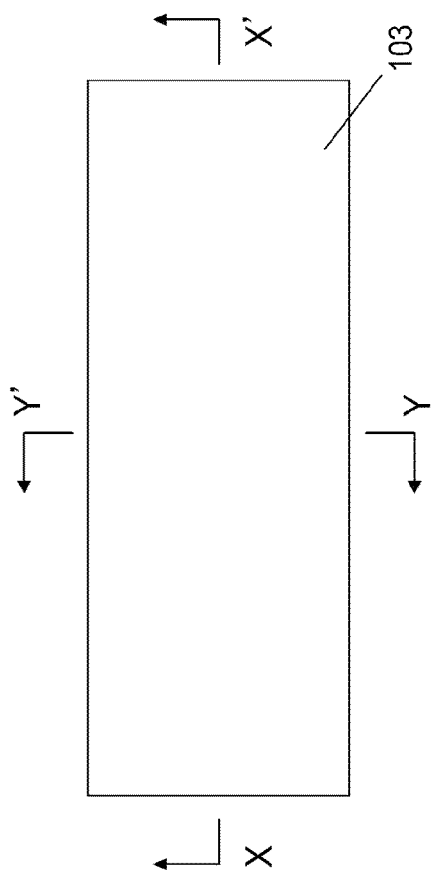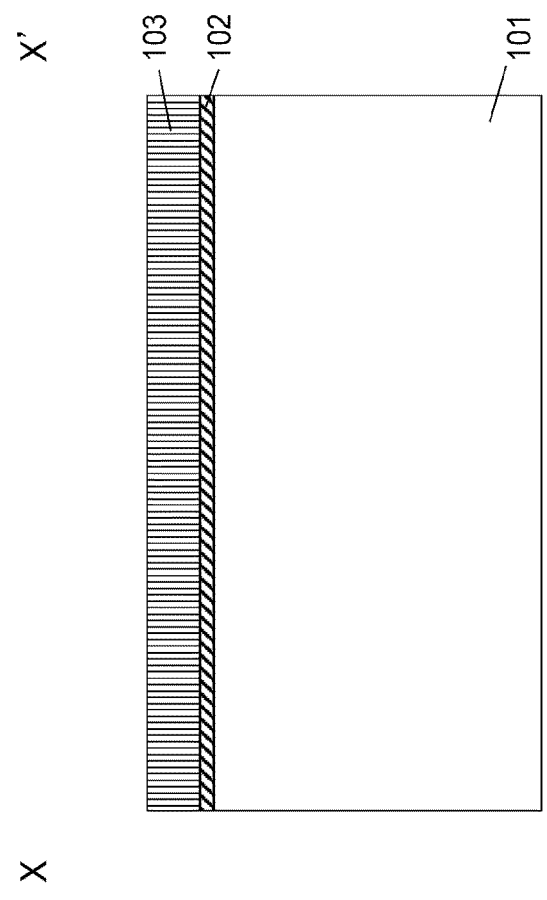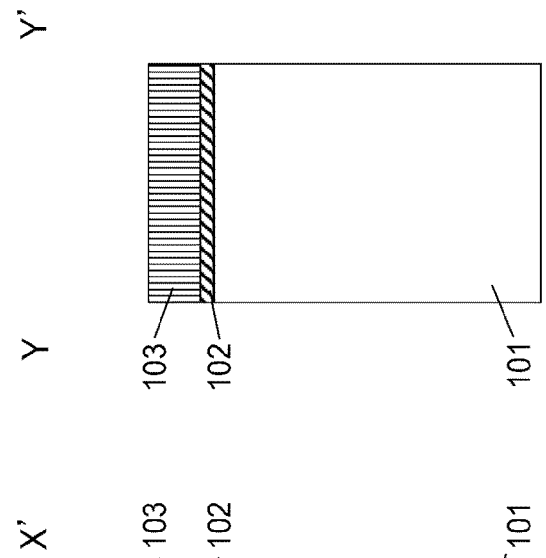

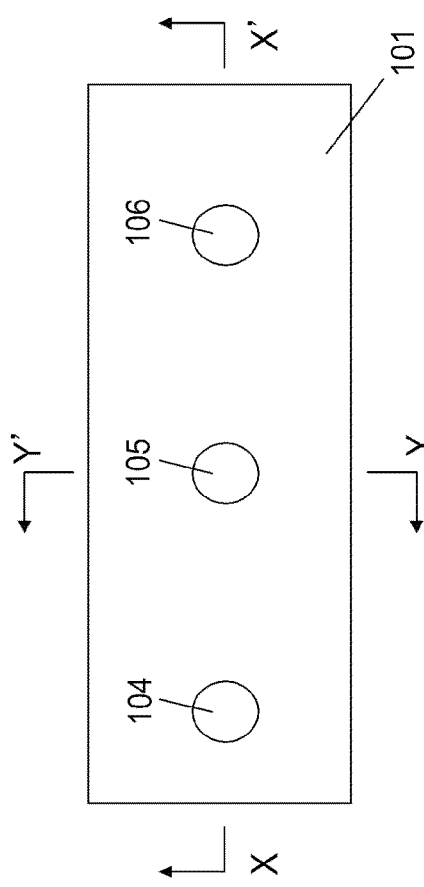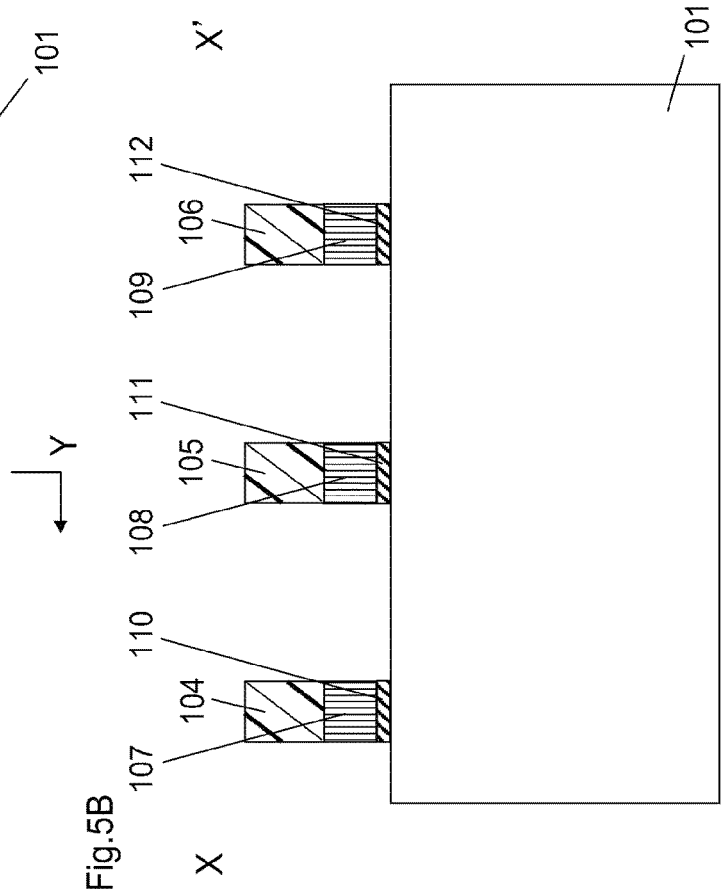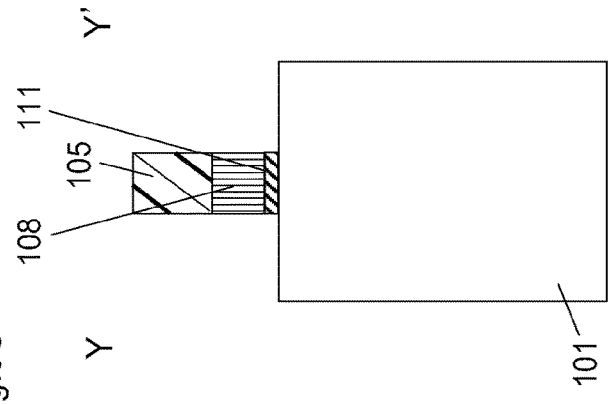

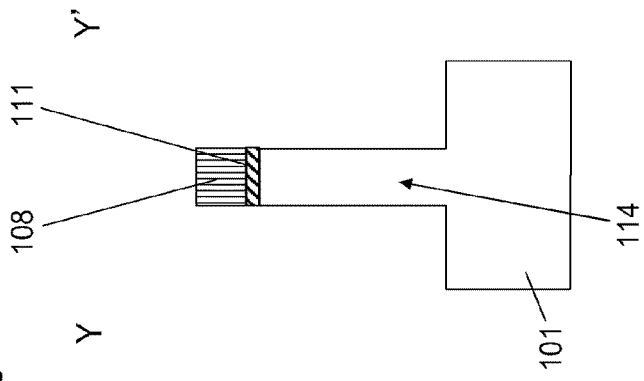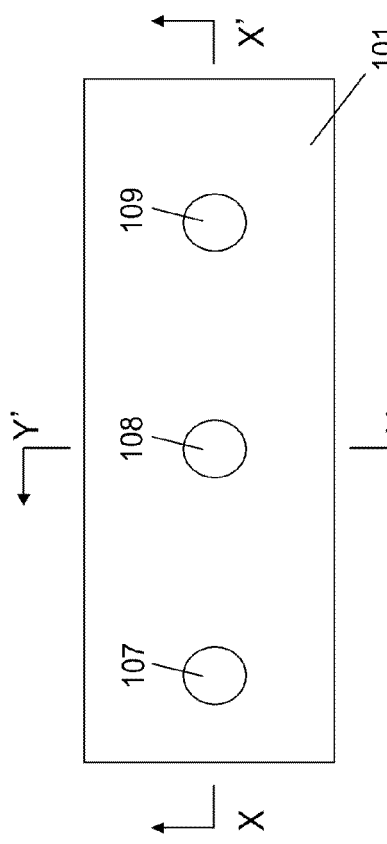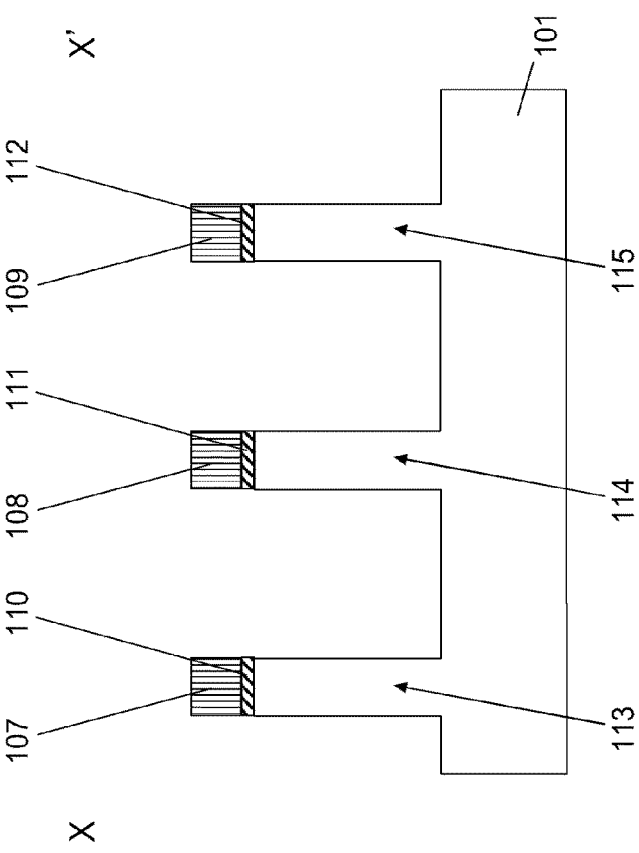

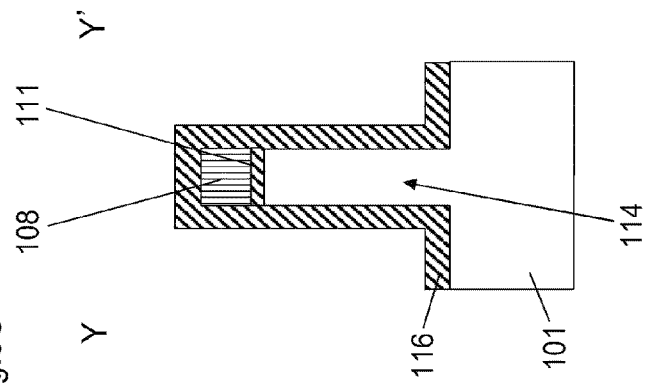
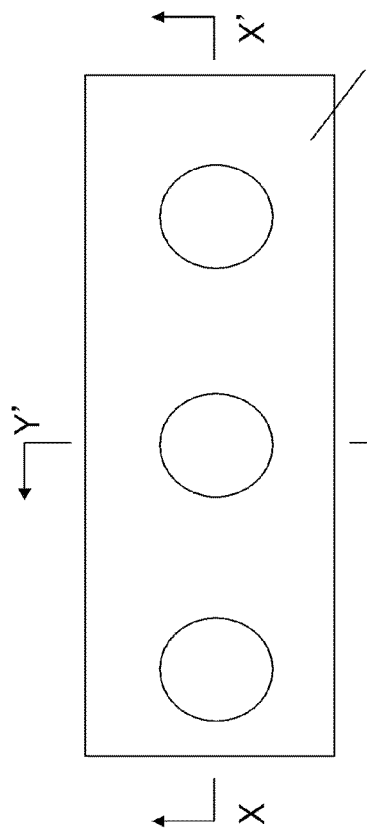
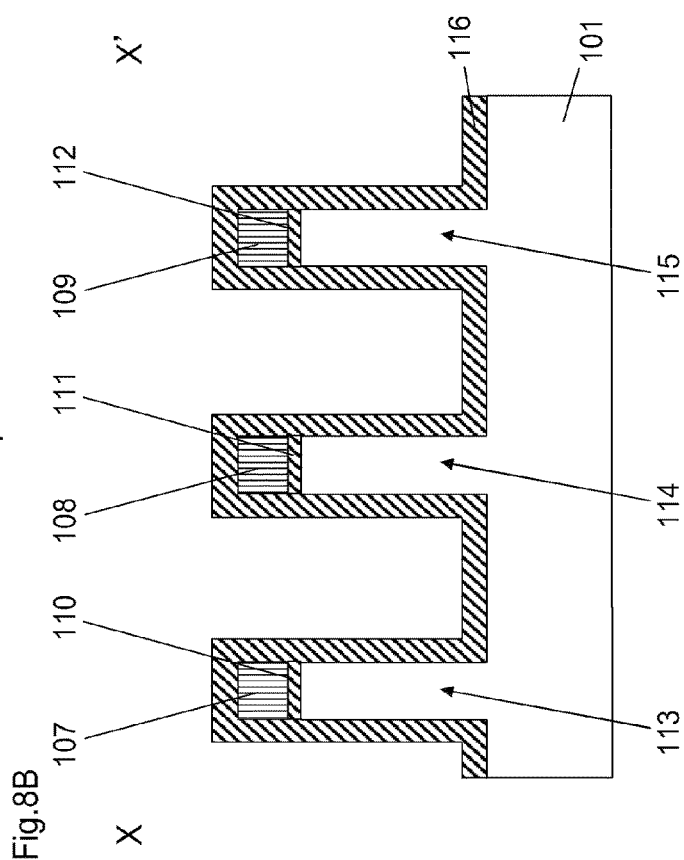
Fig.8A
Fig.8B
Fig.8C

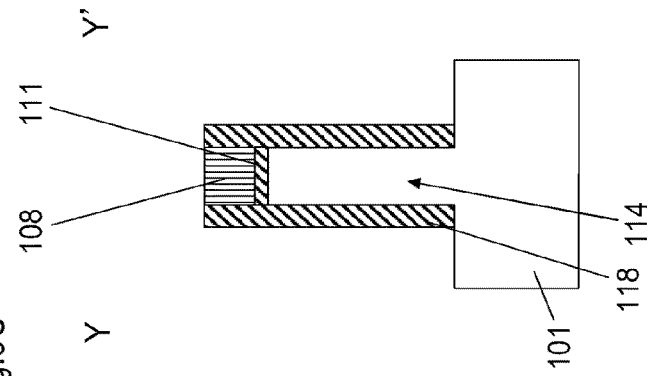
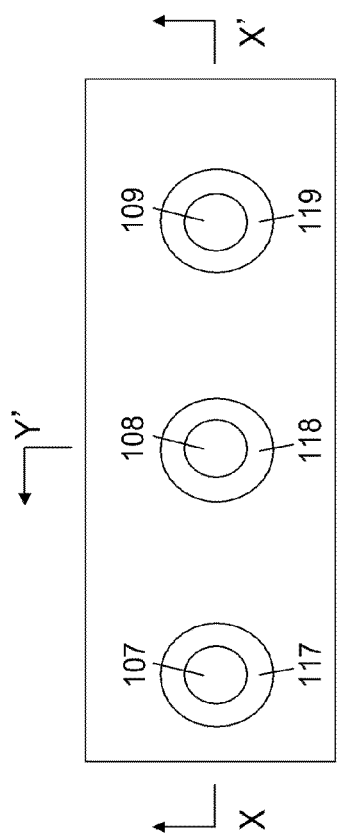
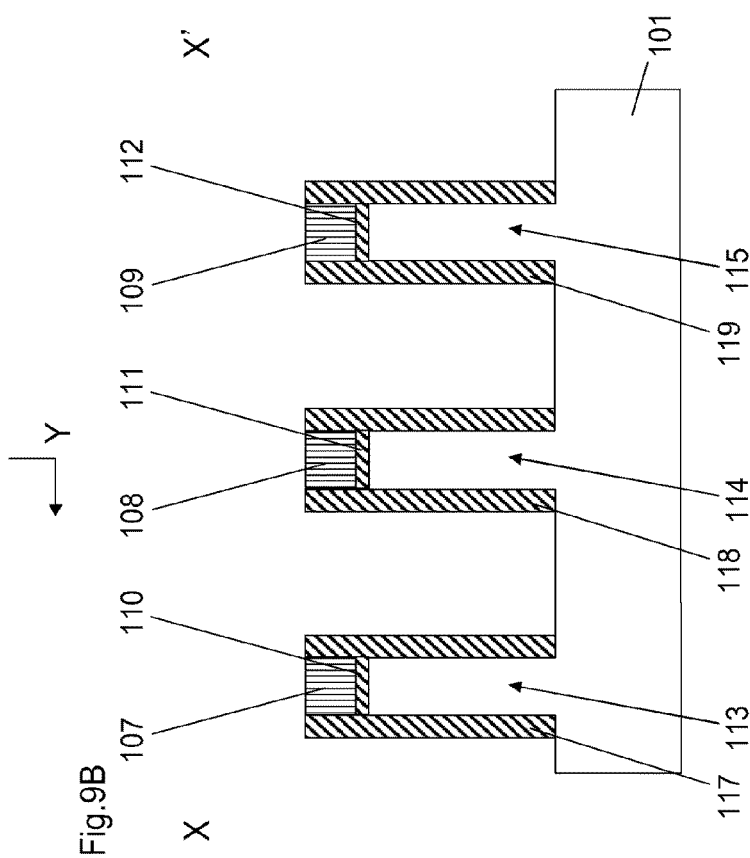
Fig.9A
Fig.9B
Fig.9C

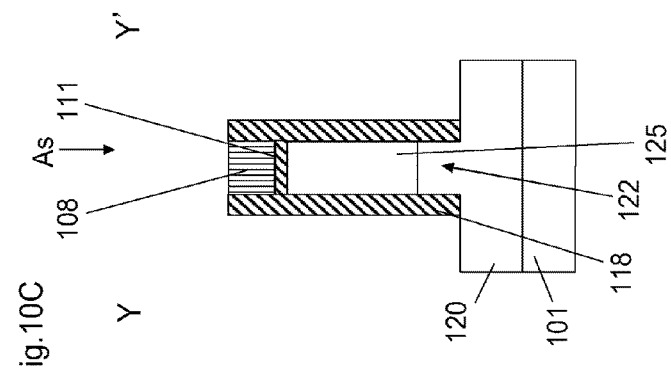
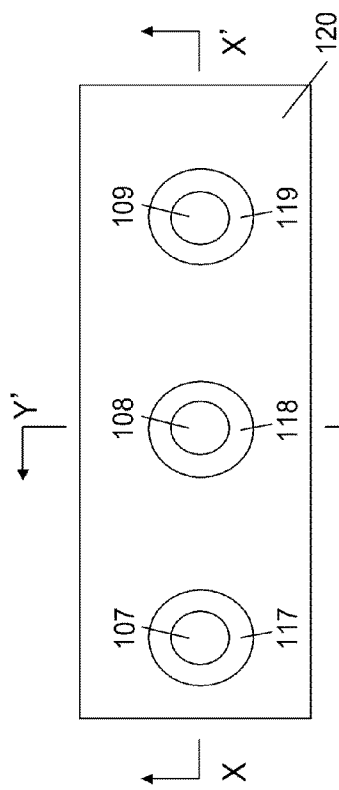
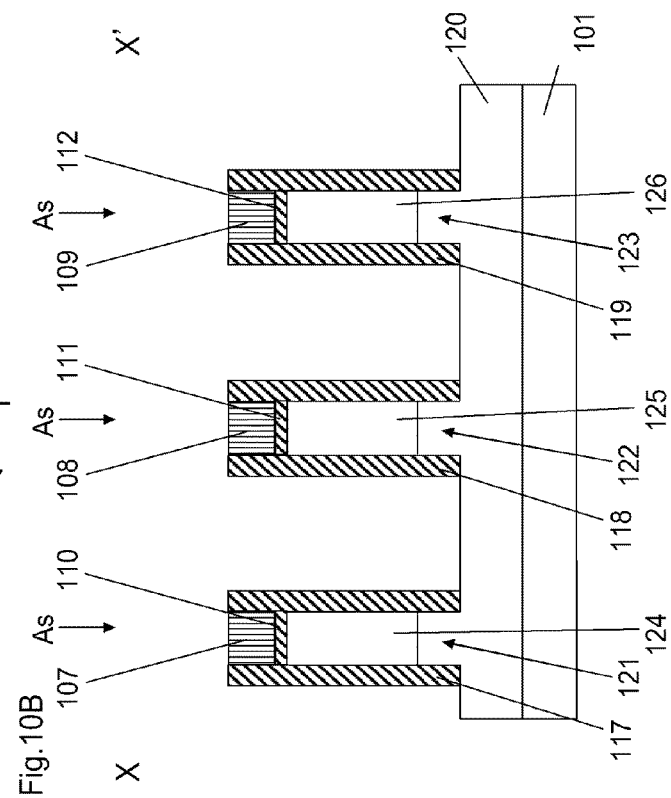

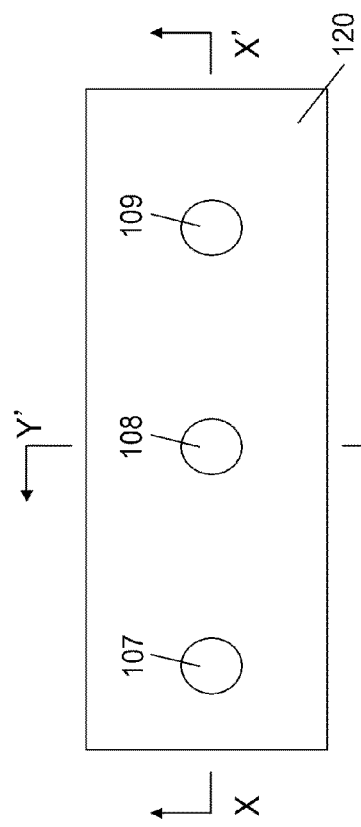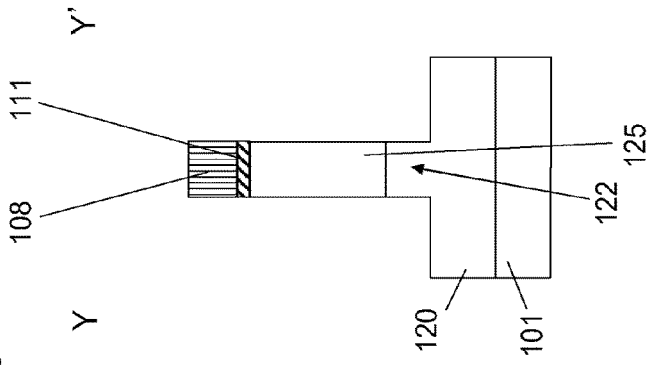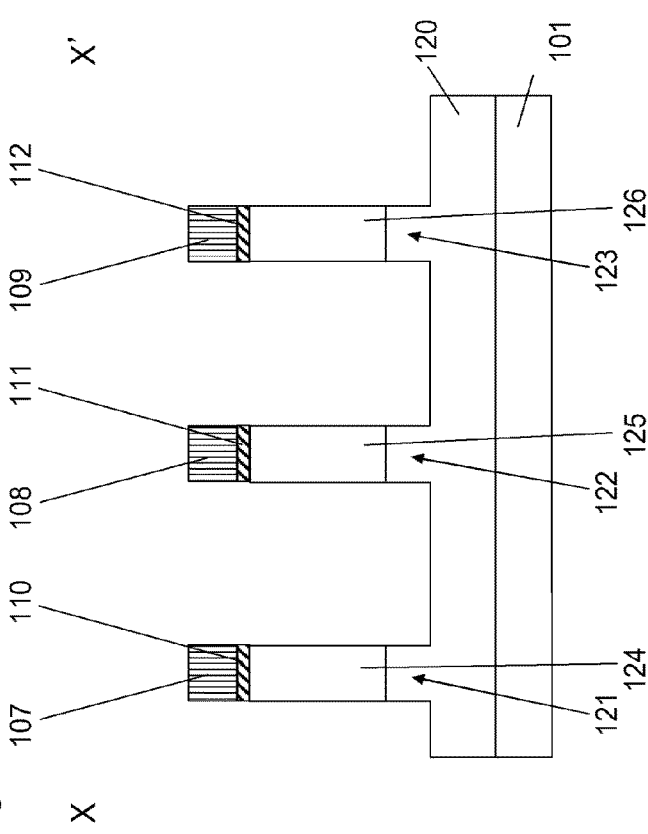

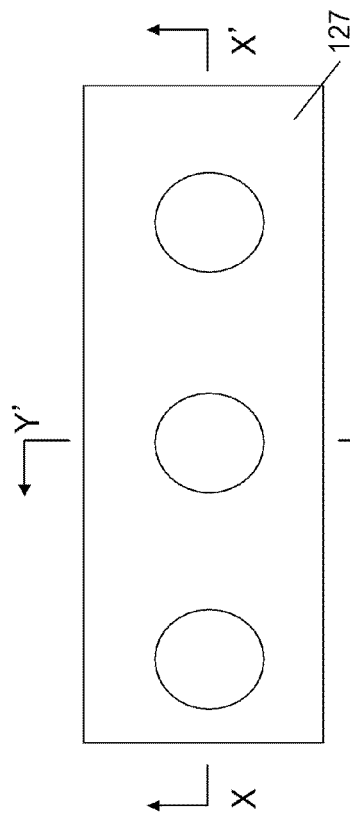
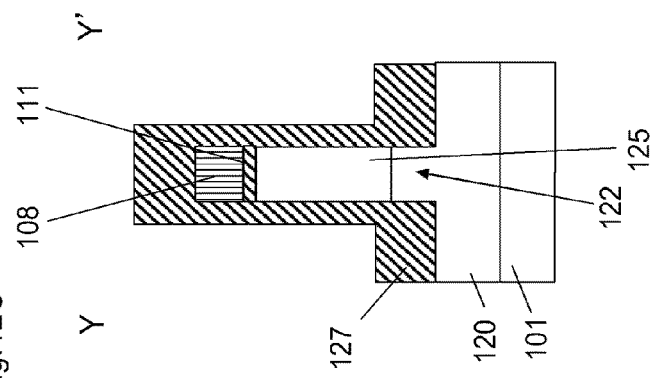
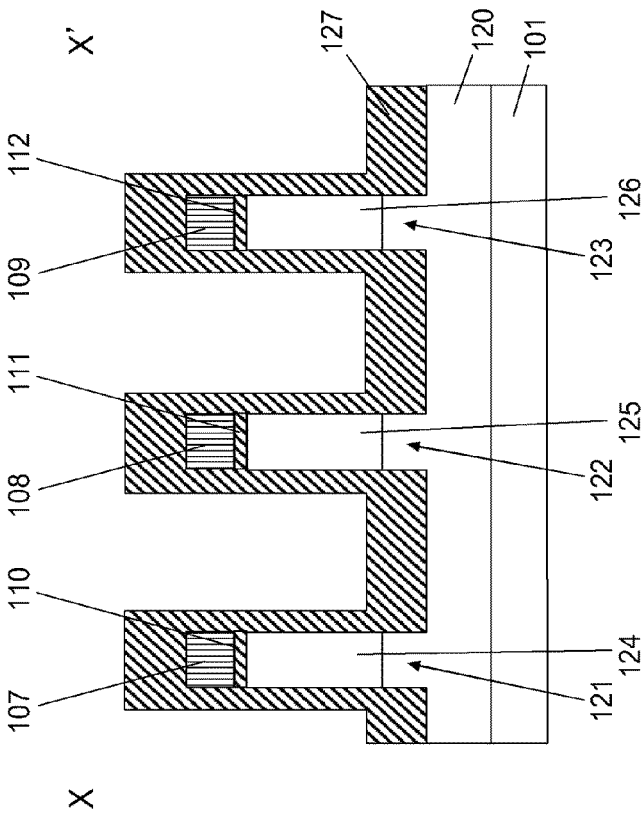

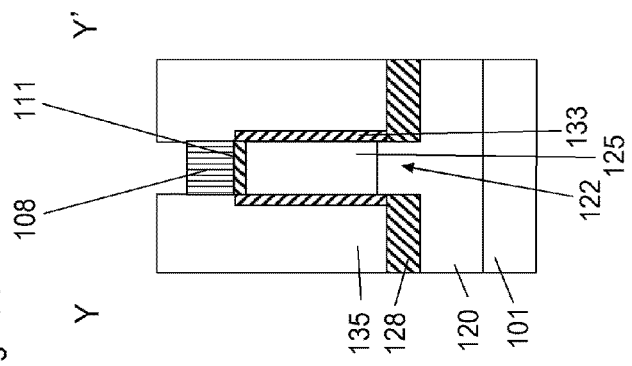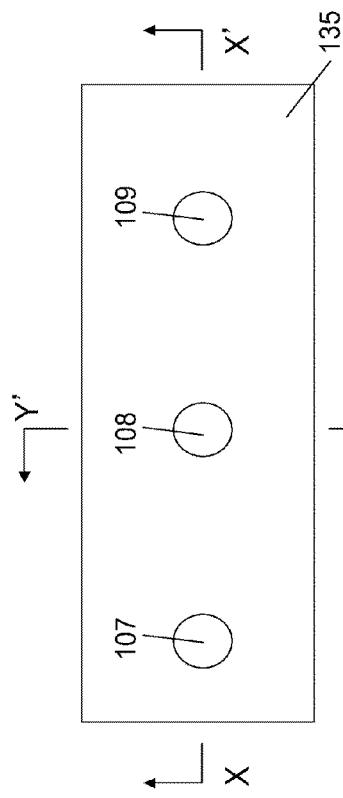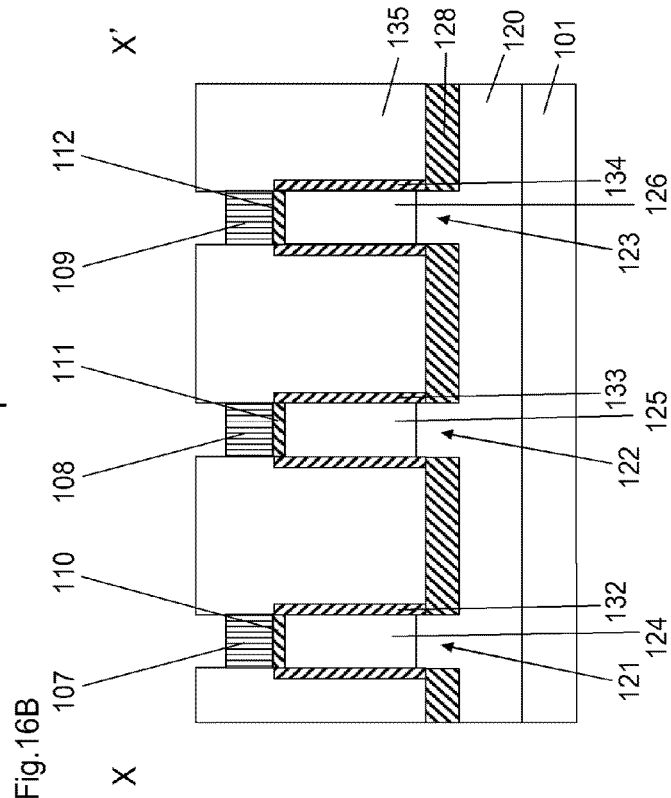

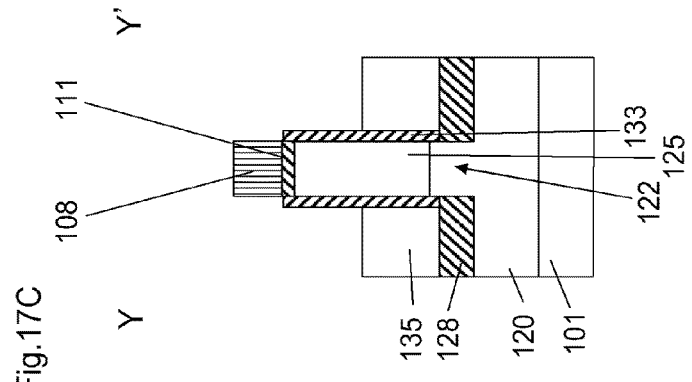
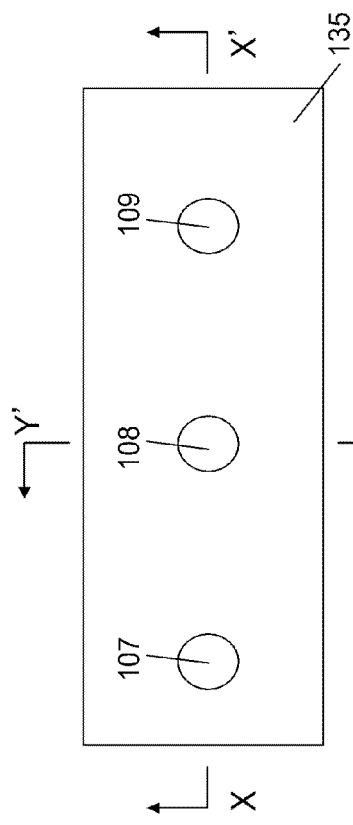
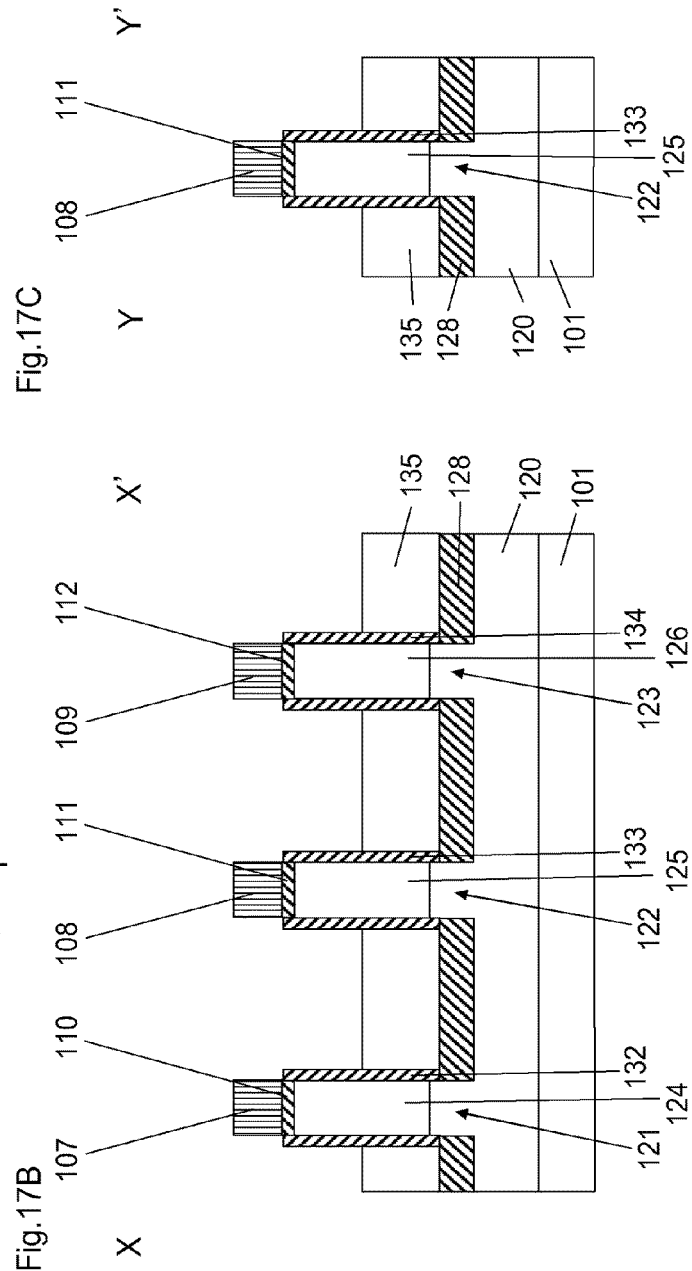

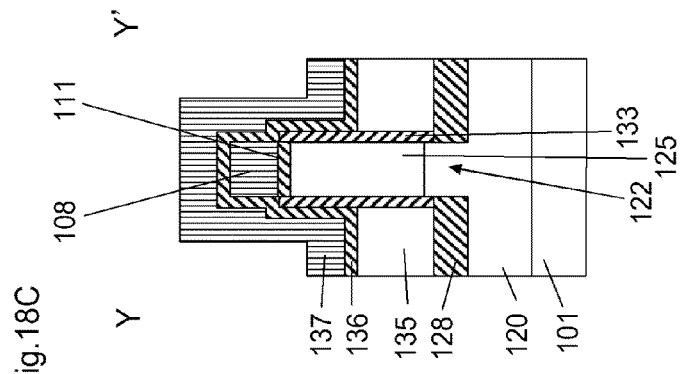
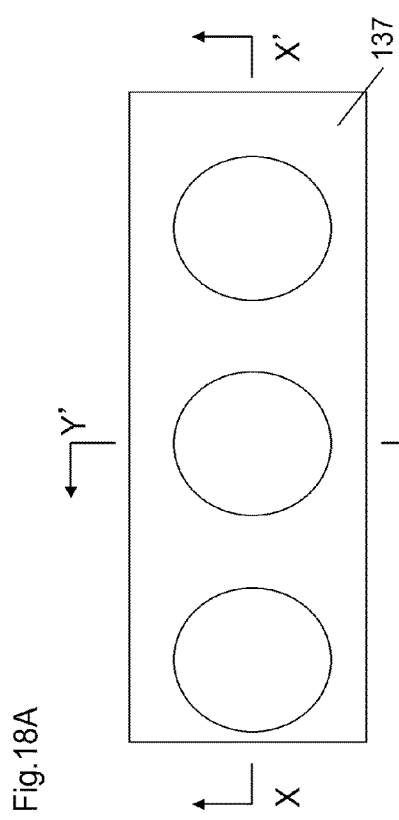
Fig.18A
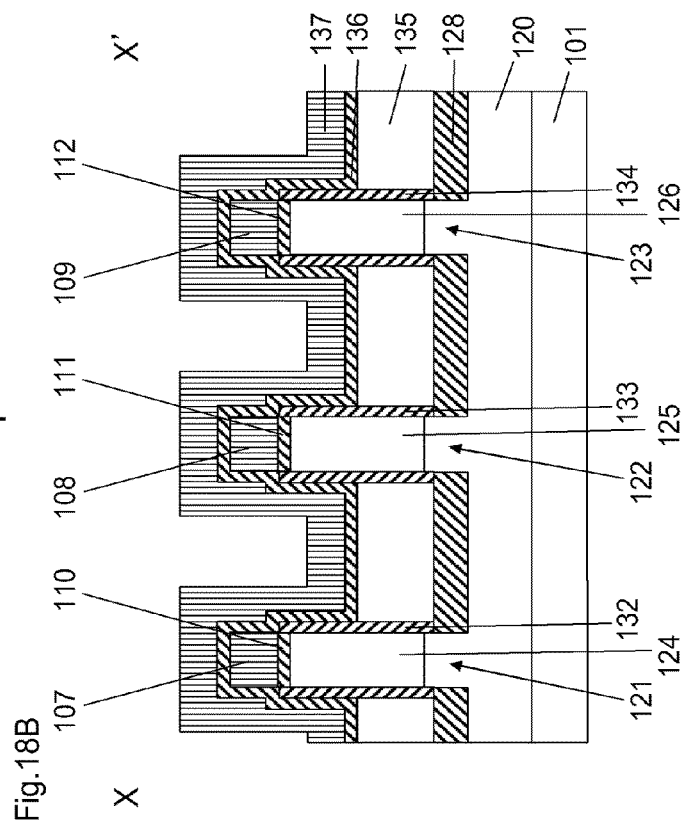
Fig.18B
Fig.18C

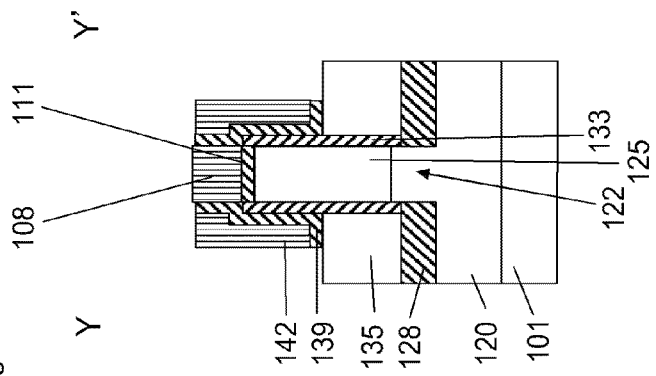
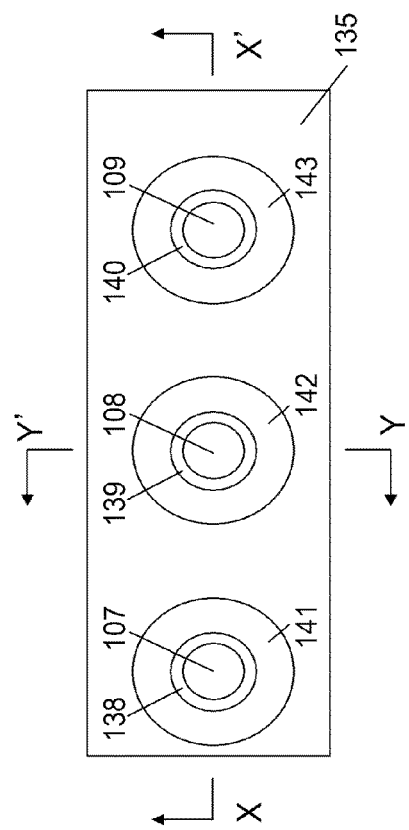
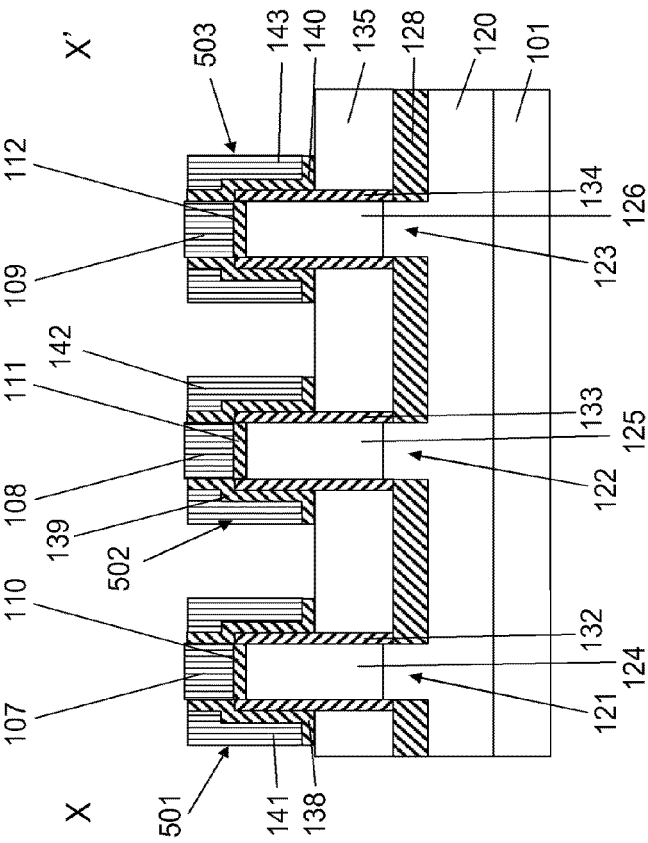

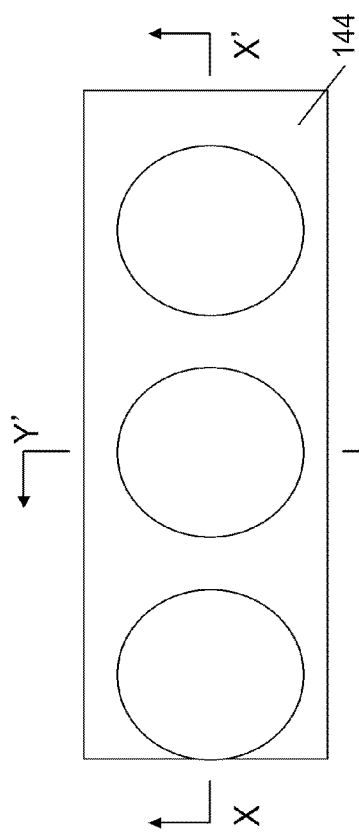
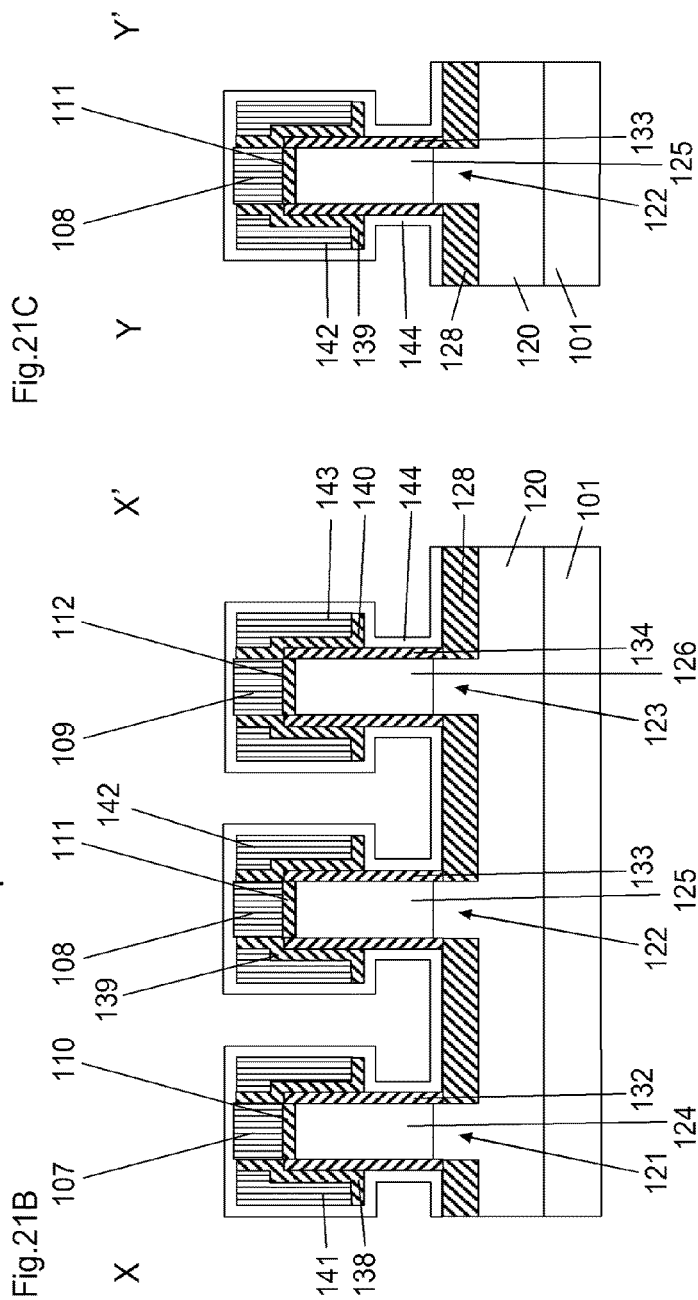
Fig.21A
Fig.21B
Fig.21C

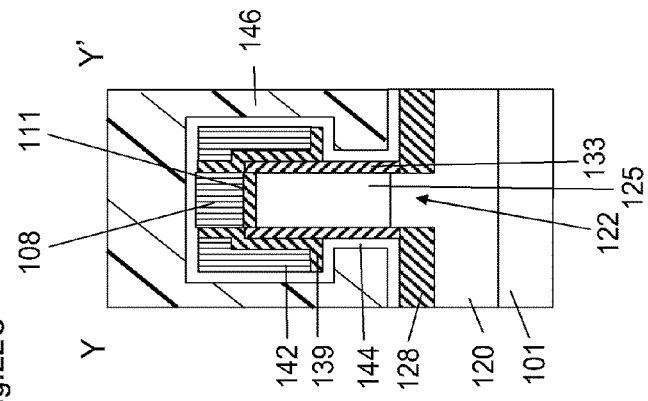
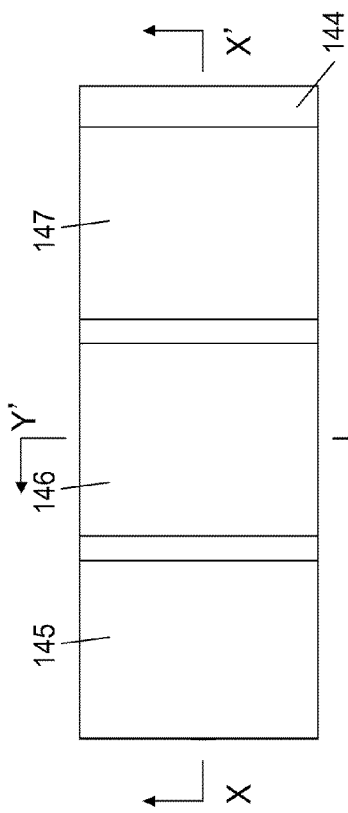
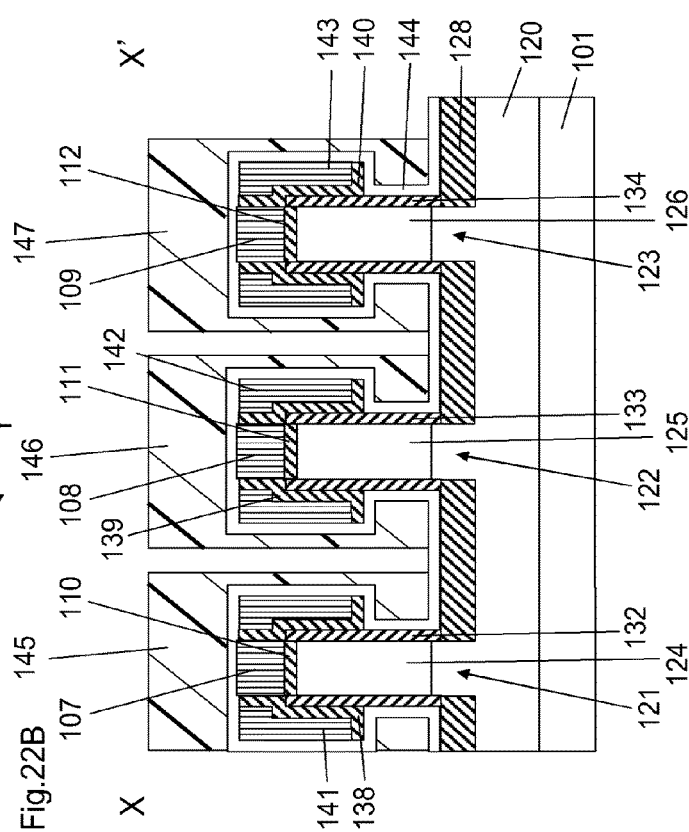

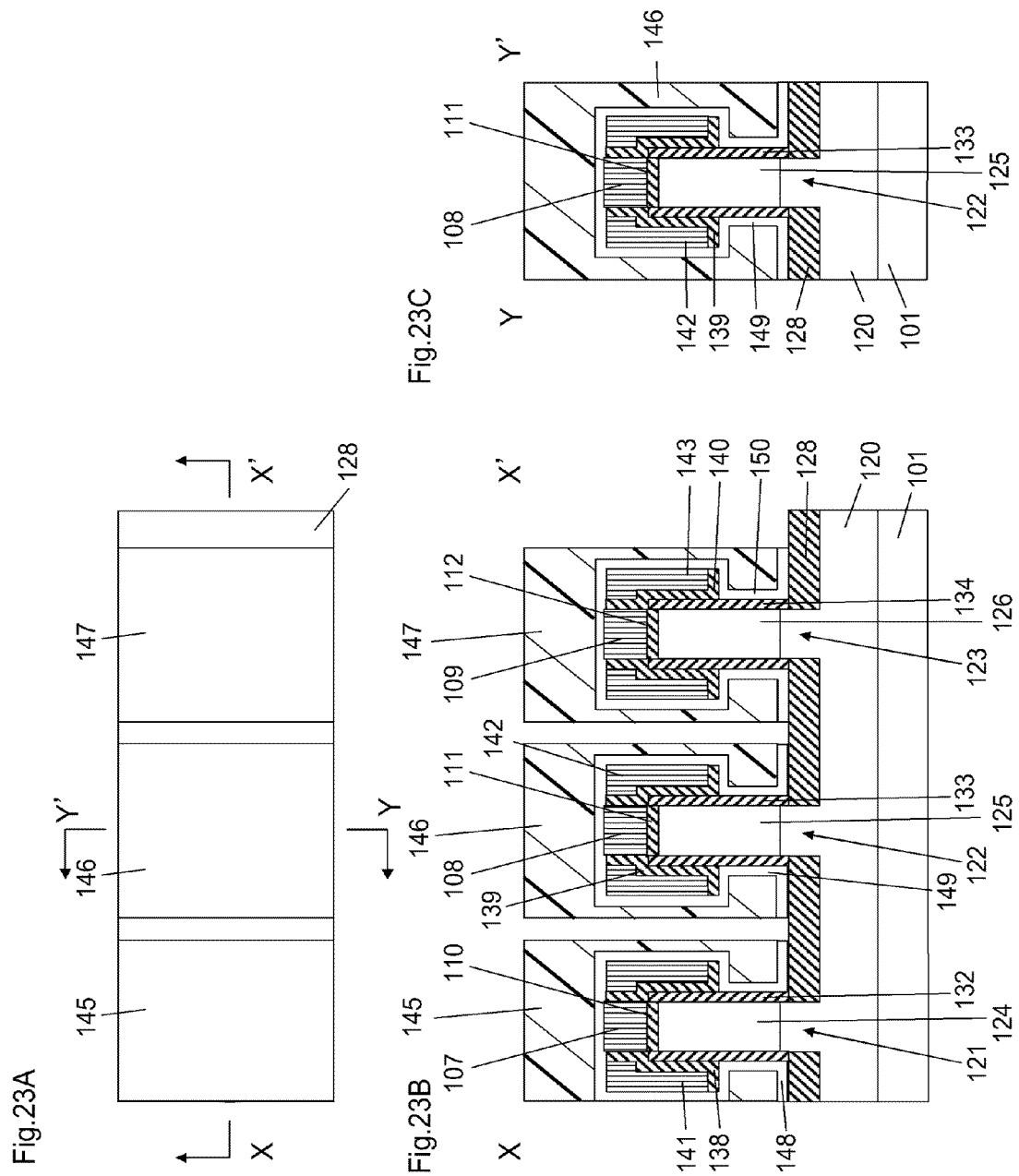

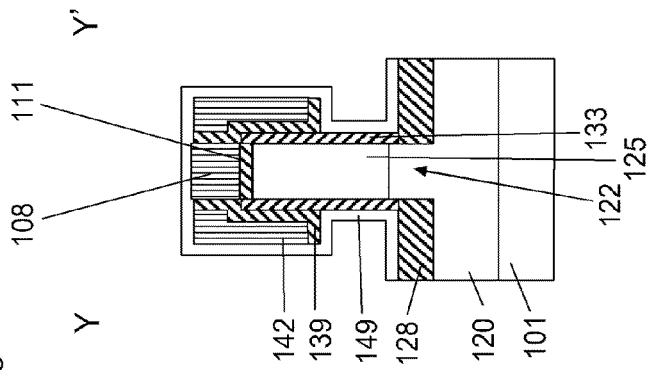
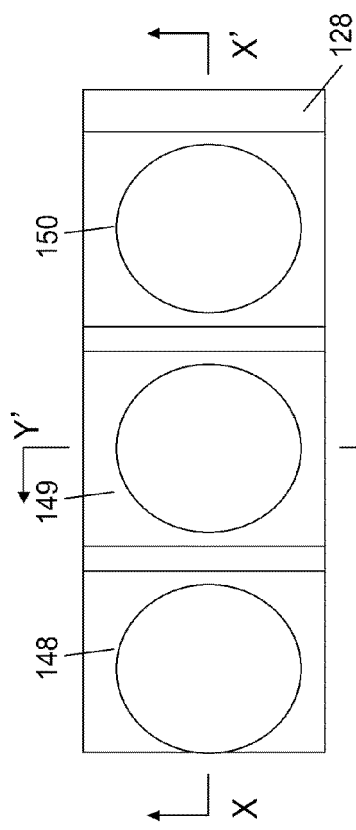
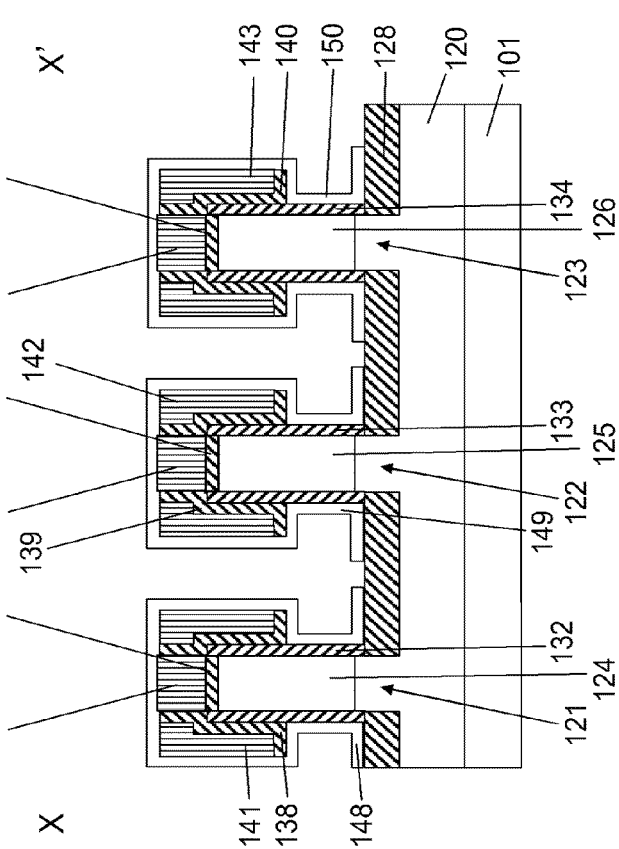
Fig.24A
Fig.24B
Fig.24C

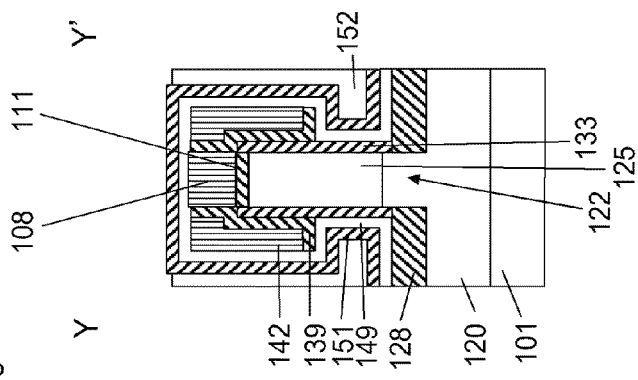
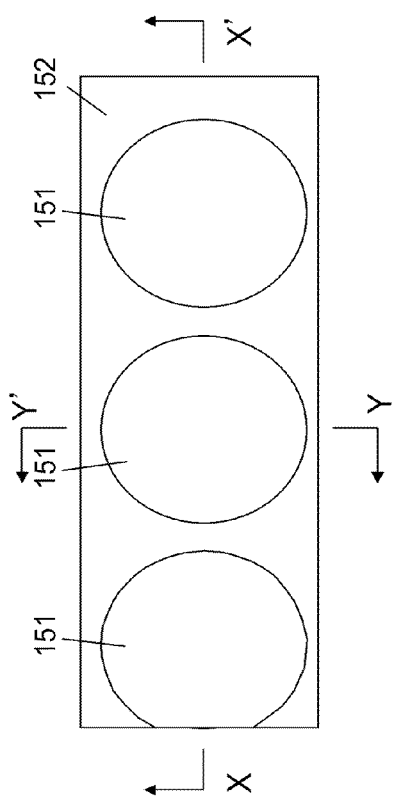
Fig.25A
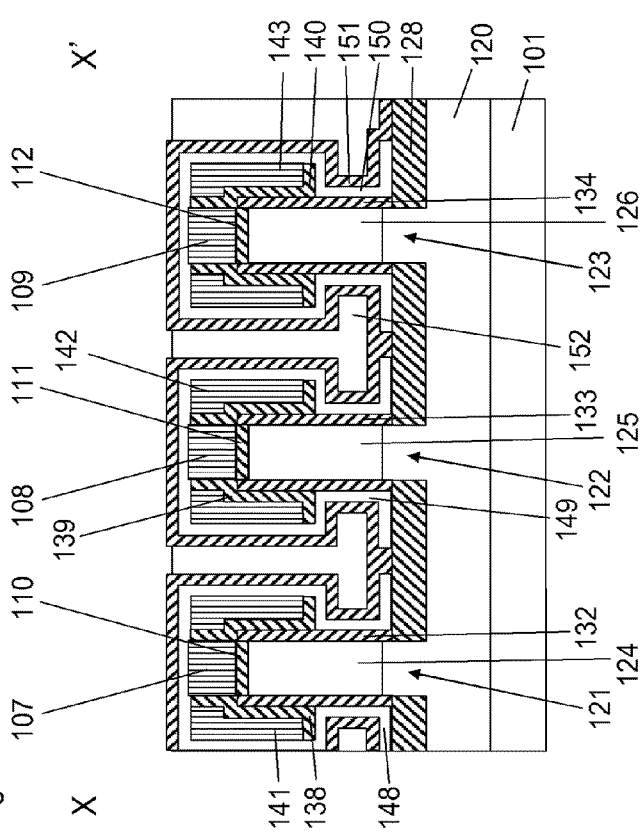
Fig.25B
Fig.25C

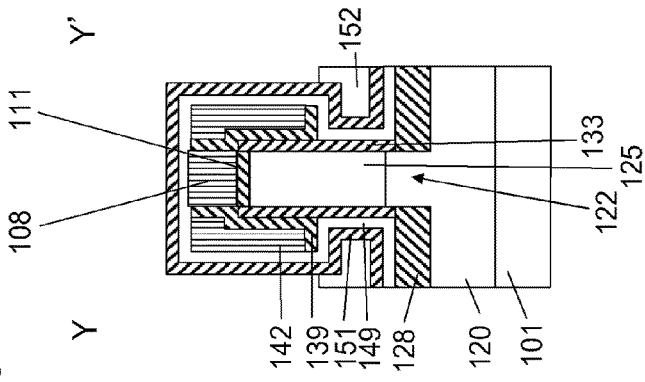
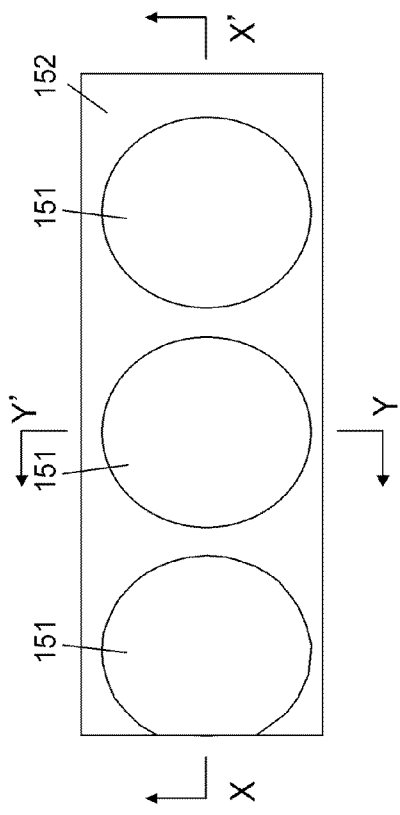
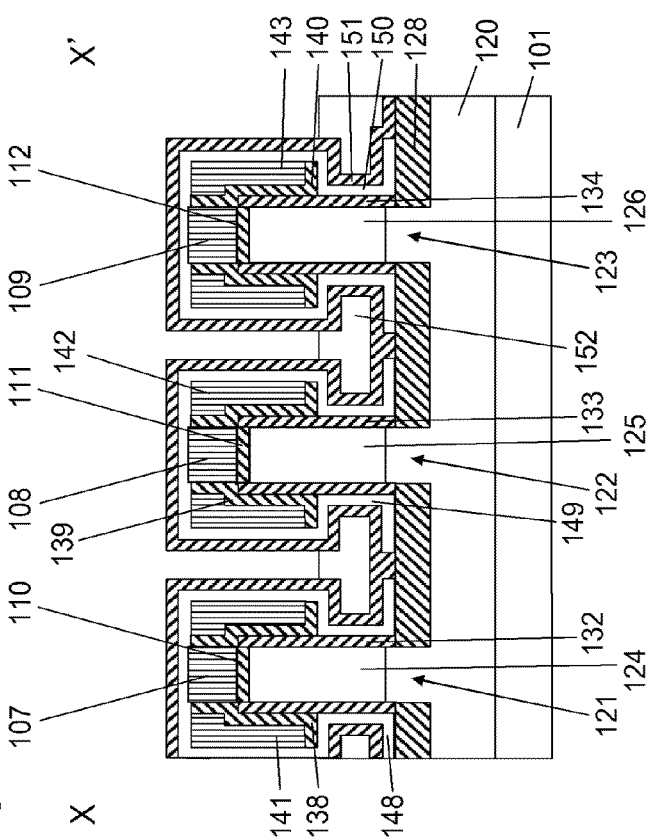

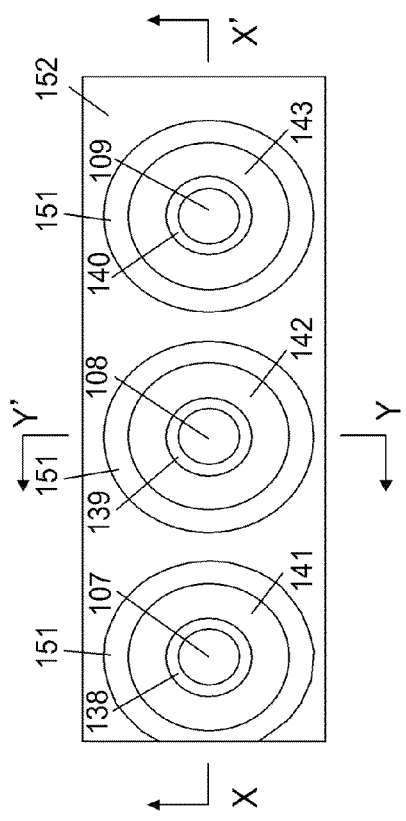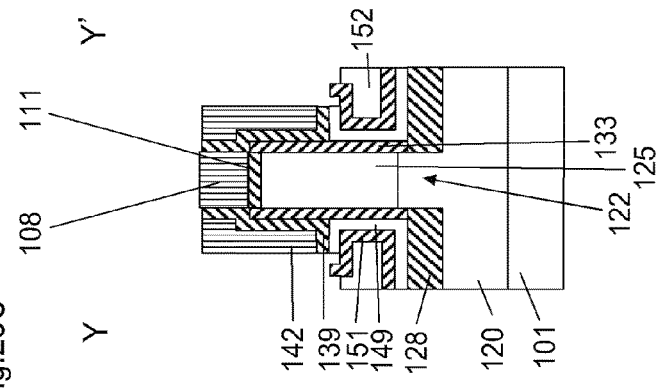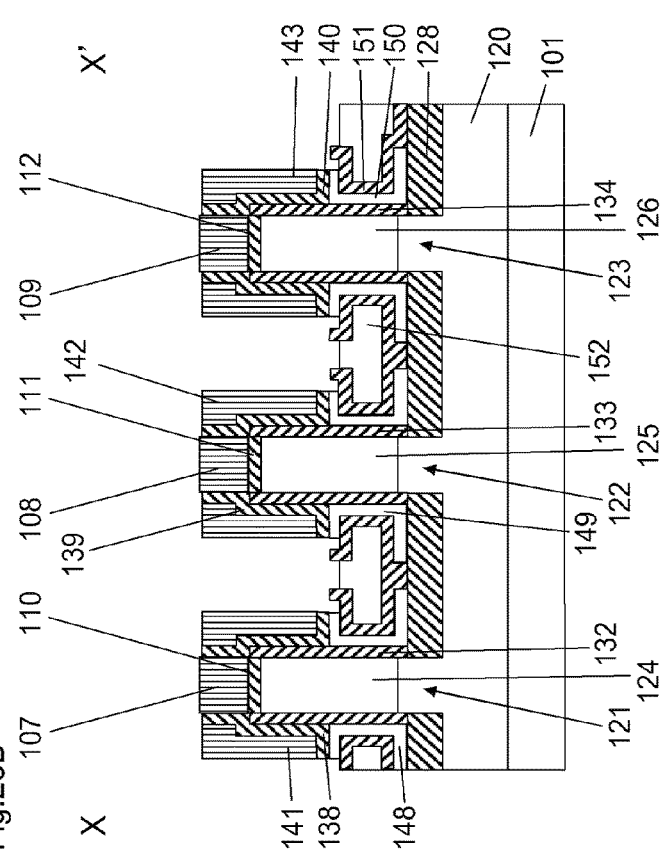

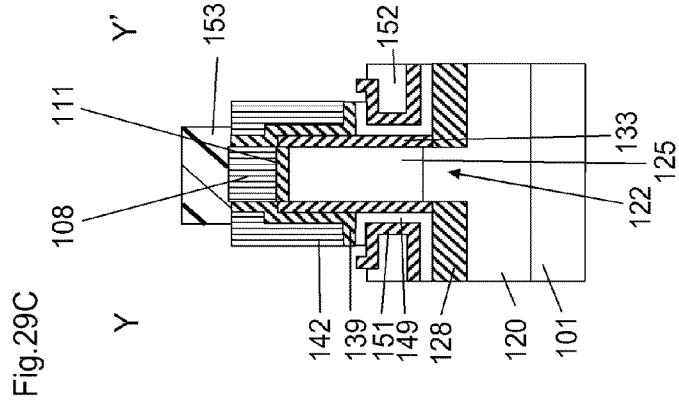
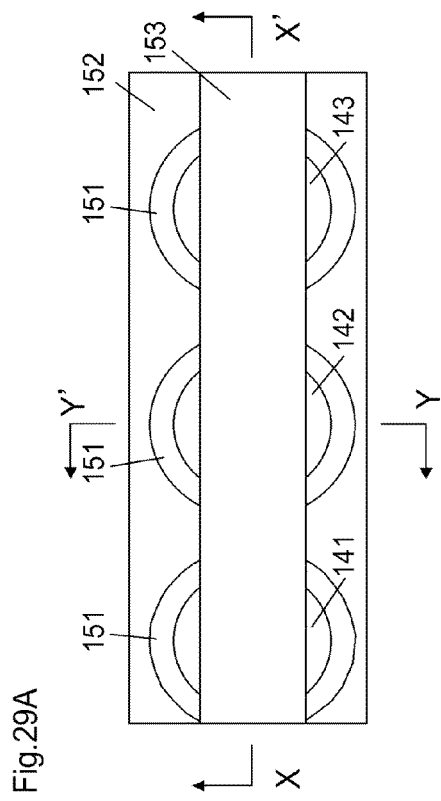
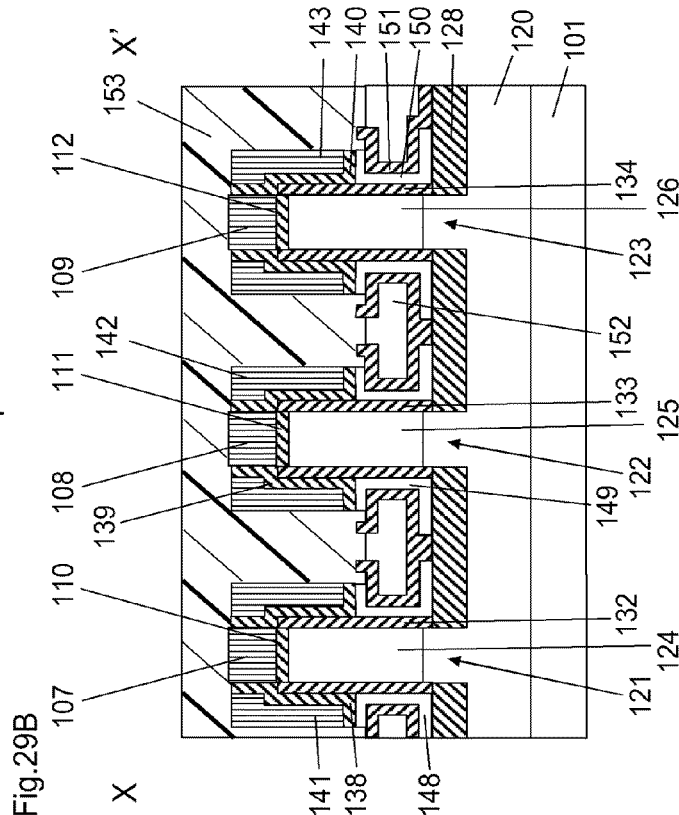

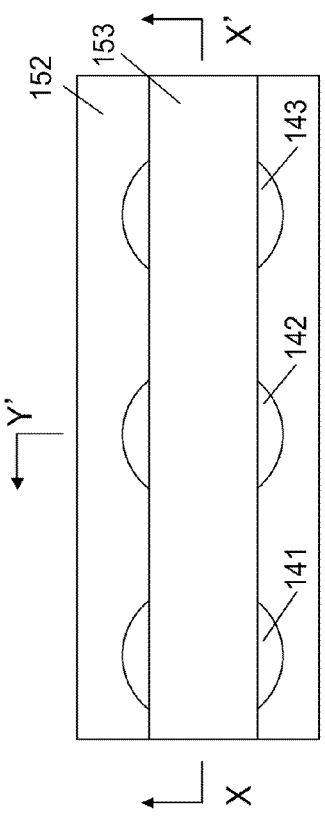
Fig.30A
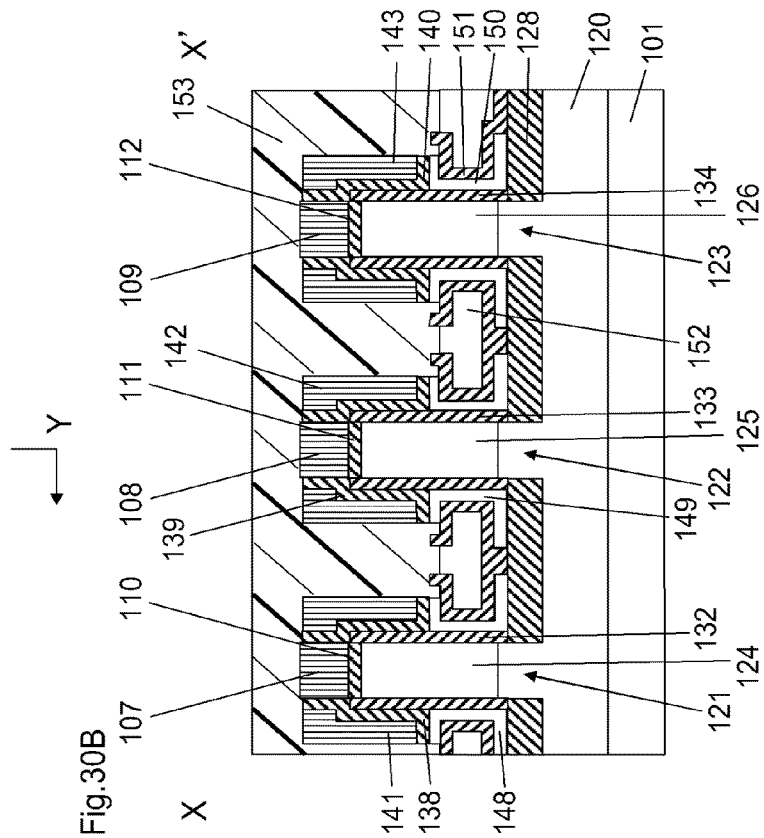
Fig.30B
Fig.30C

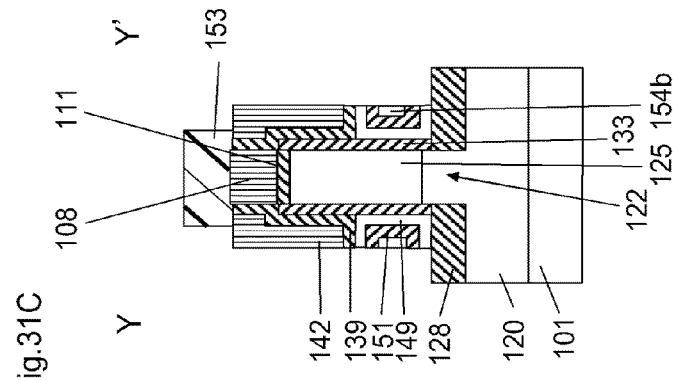
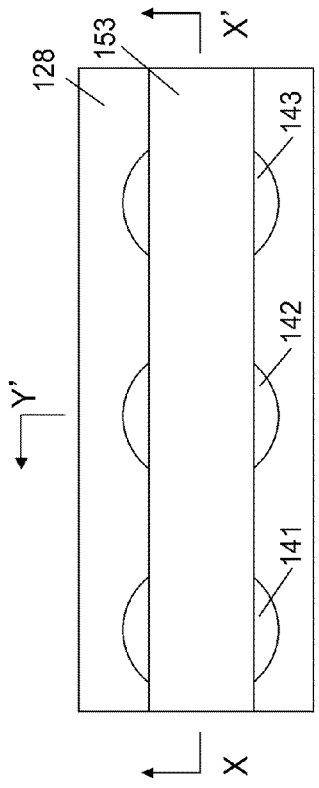
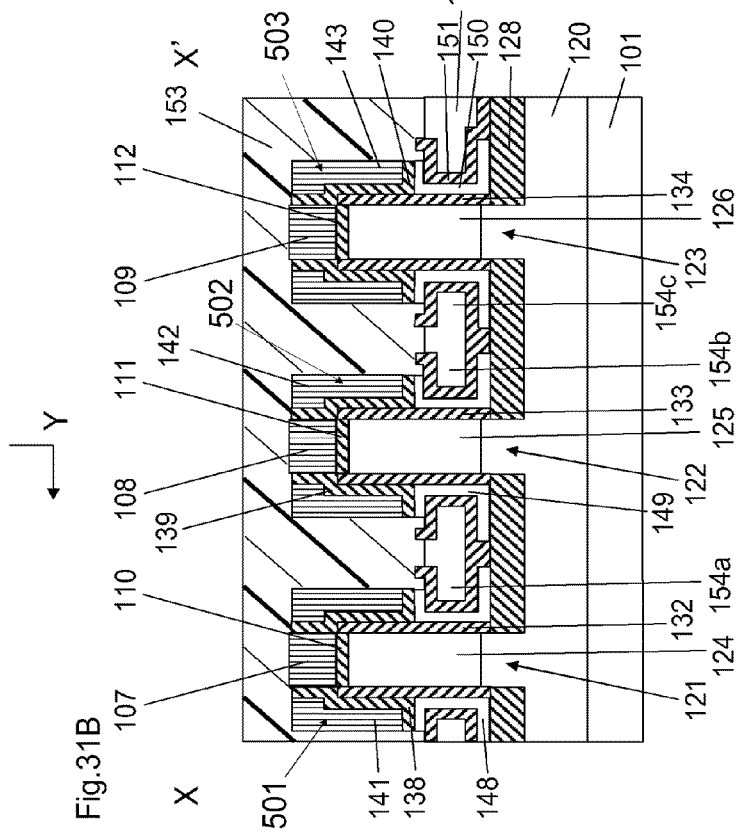
Fig.31A
Fig.31B
Fig.31C

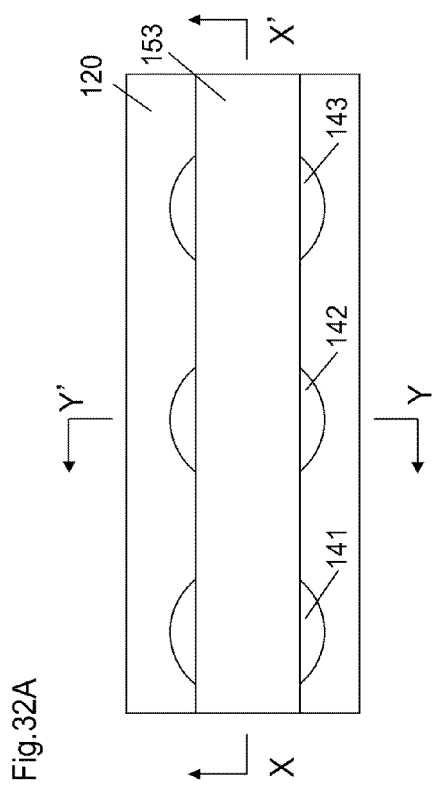
Fig.32A
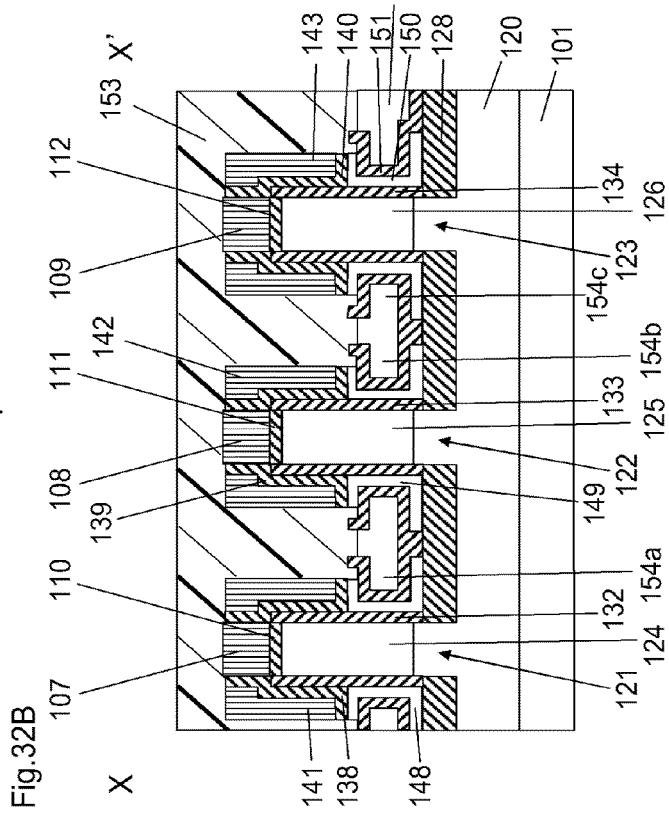
Fig.32B
Fig.32C

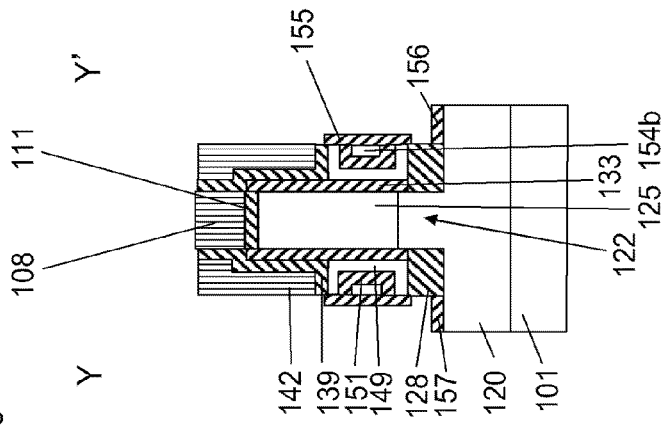
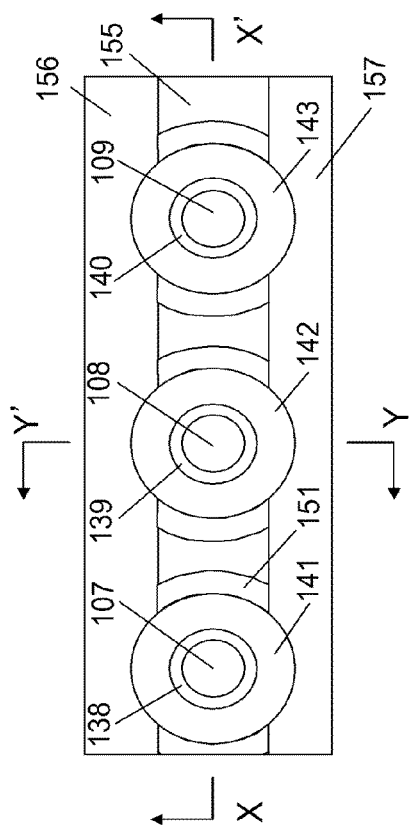
Fig.34A
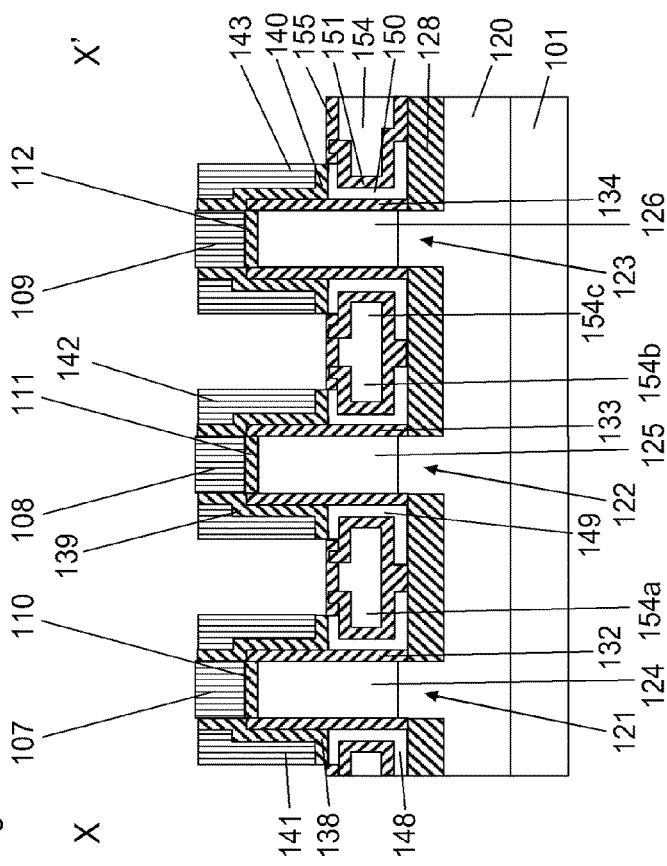
Fig.34B
Fig.34C

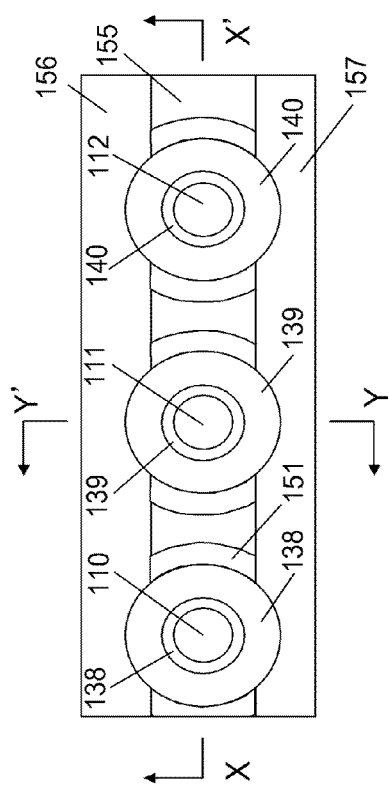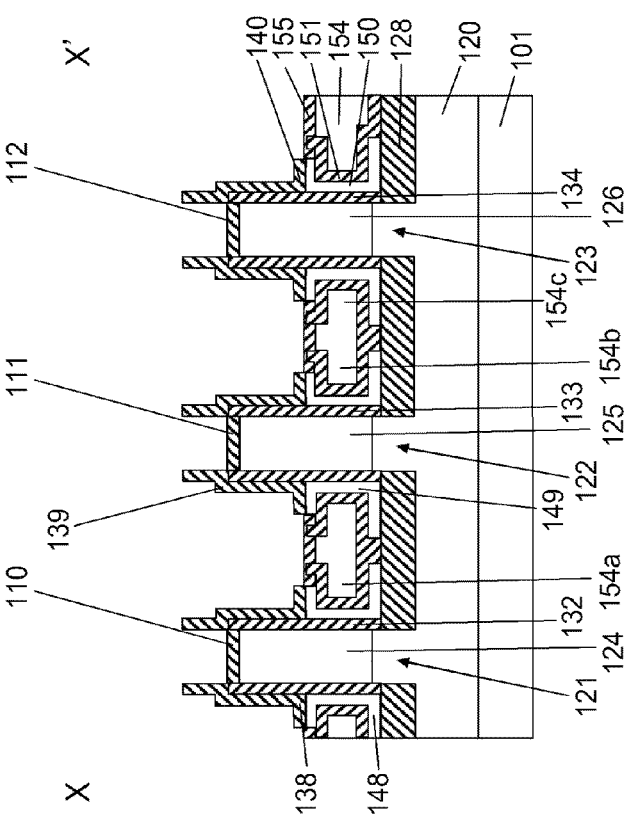

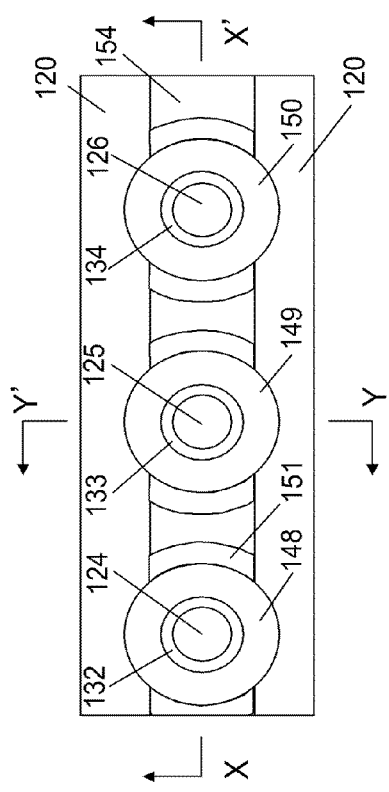
Fig.36A
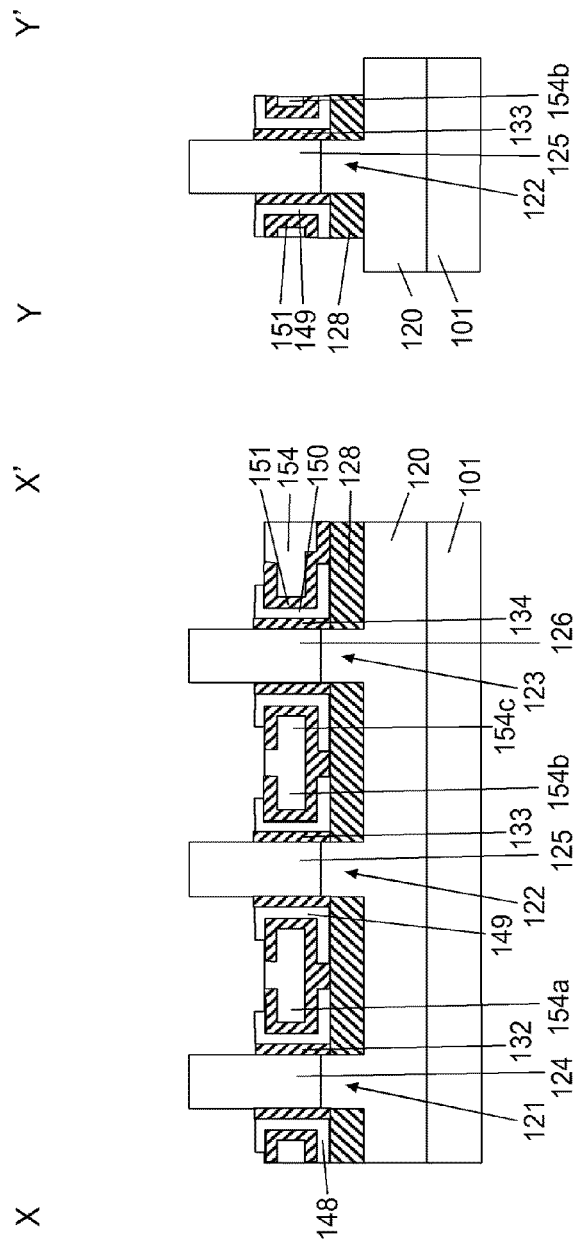
Fig.36C
Fig.36B

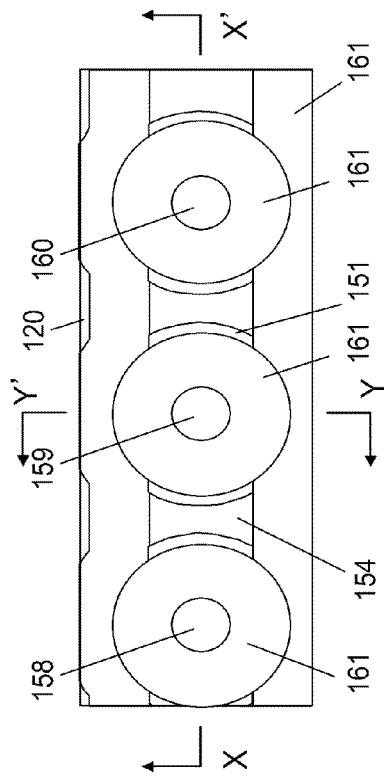
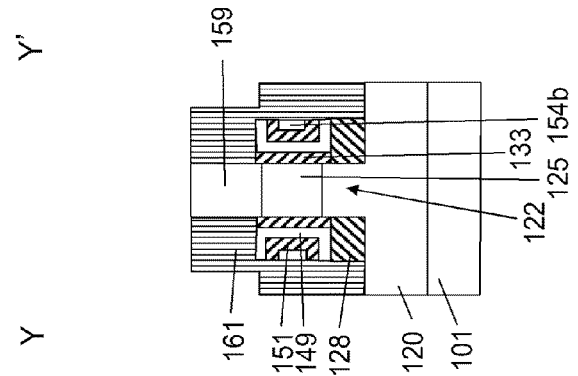
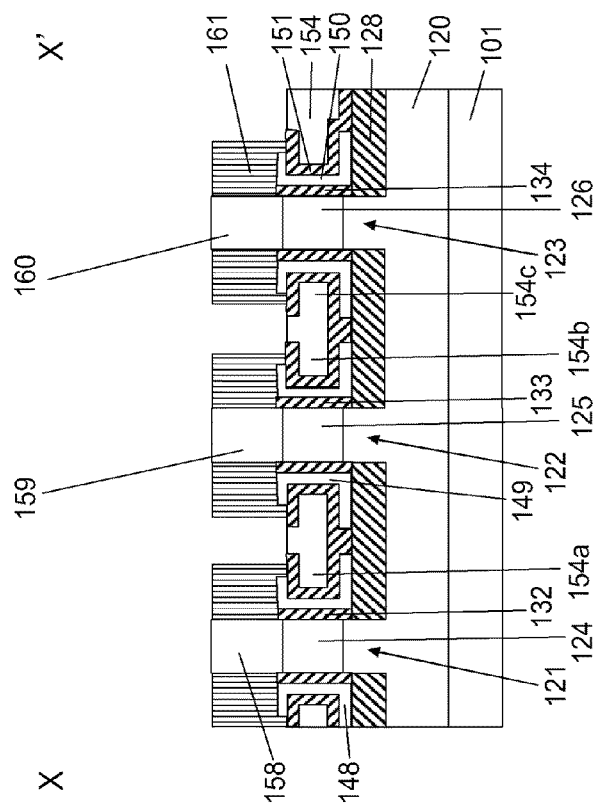

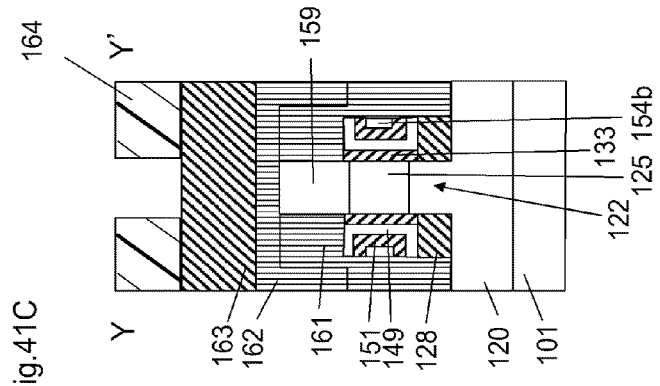
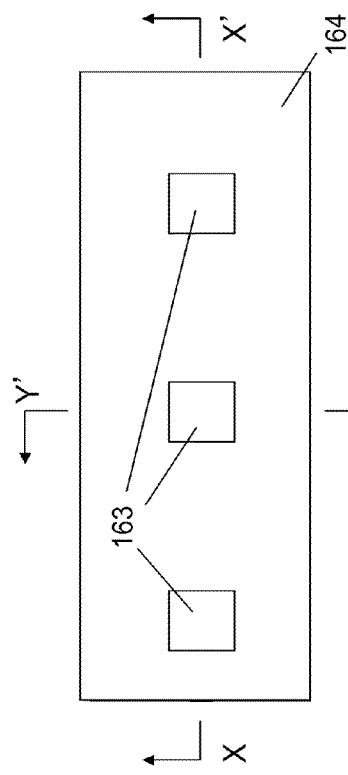
Fig.41A
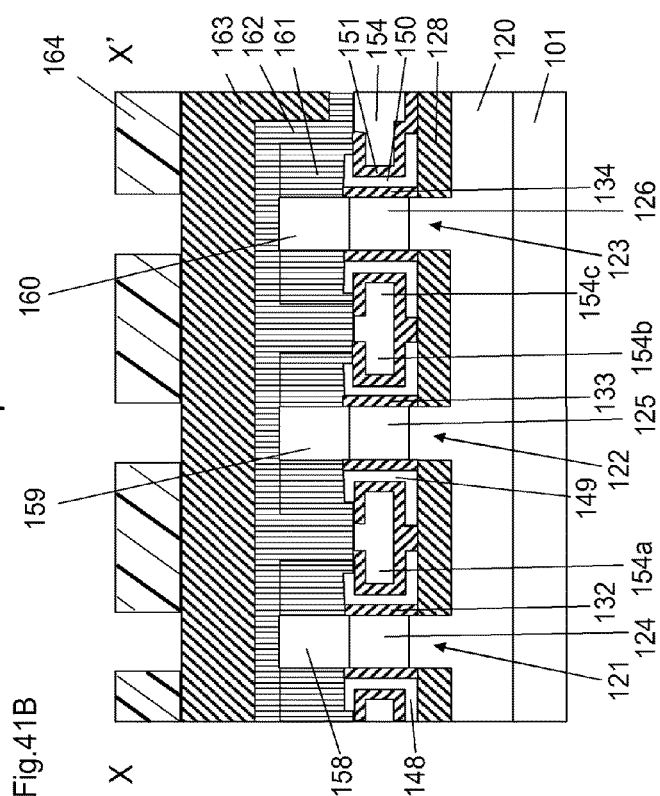
Fig.41B
Fig.41C

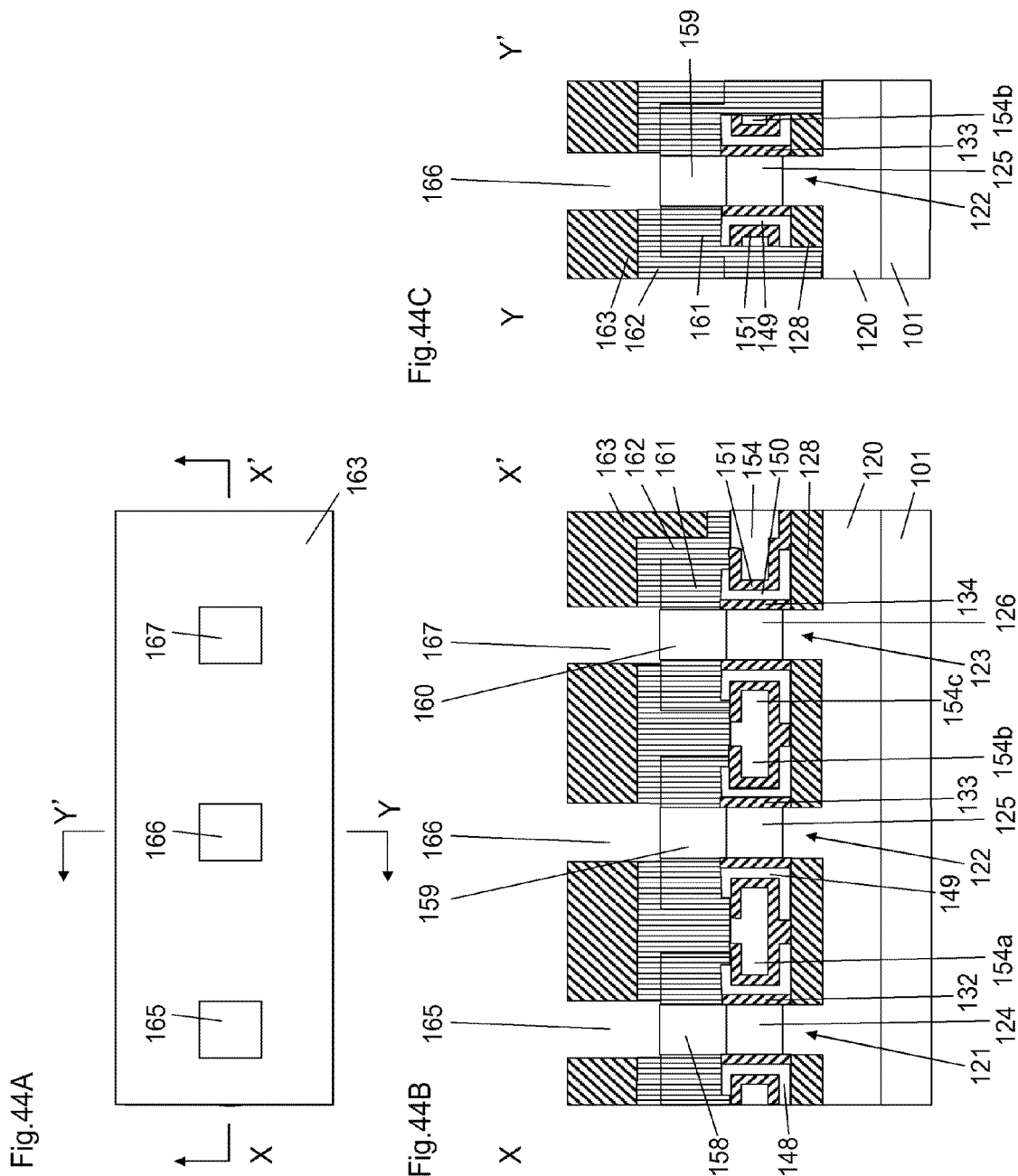

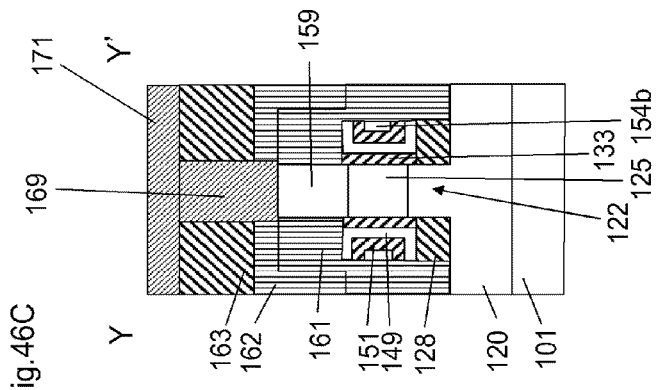
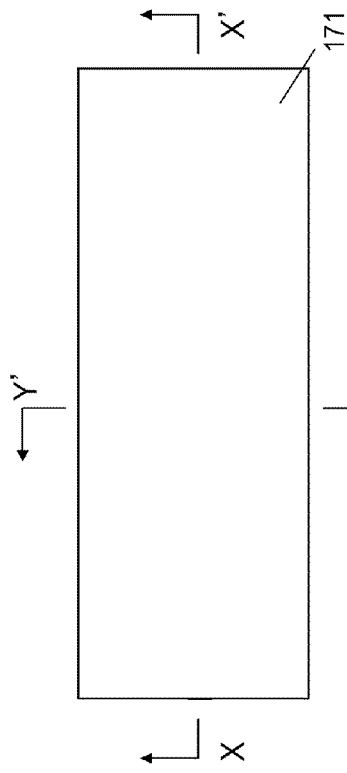
Fig.46A
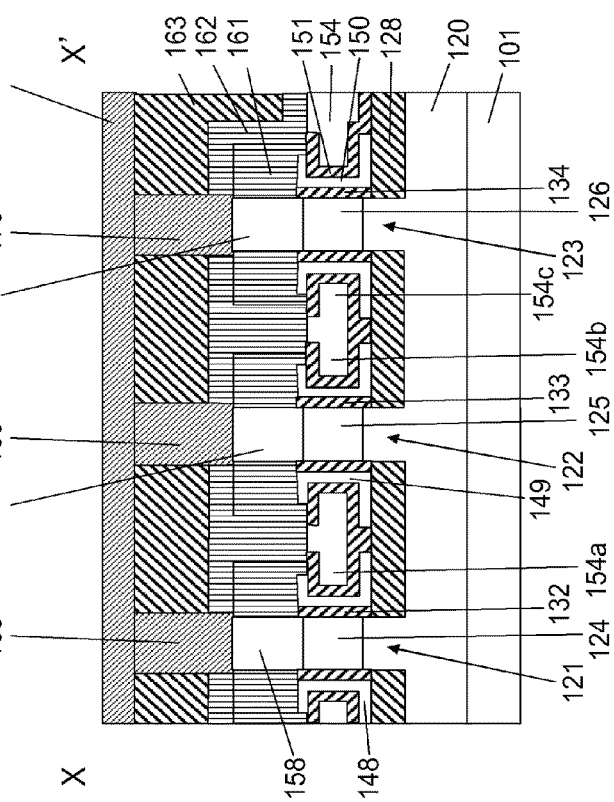
Fig.46B
Fig.46C

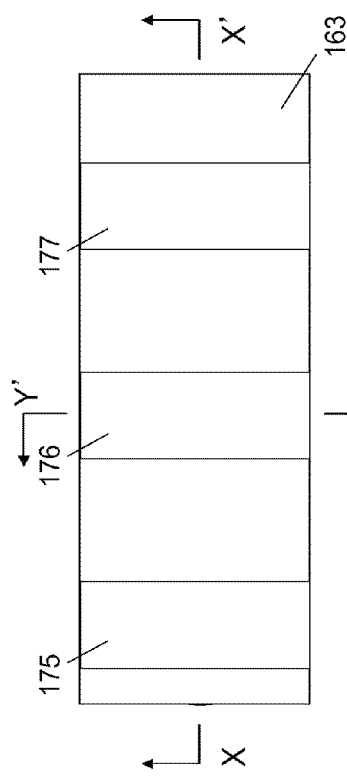
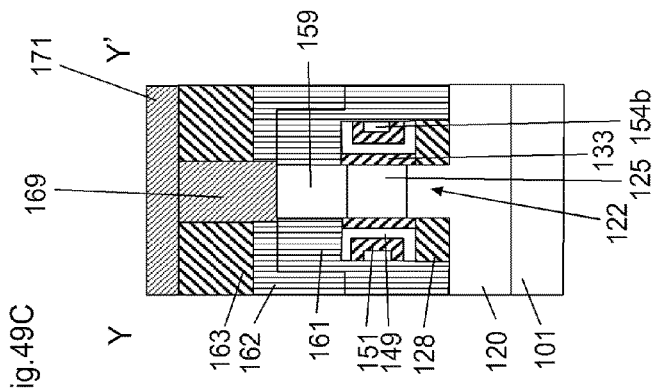
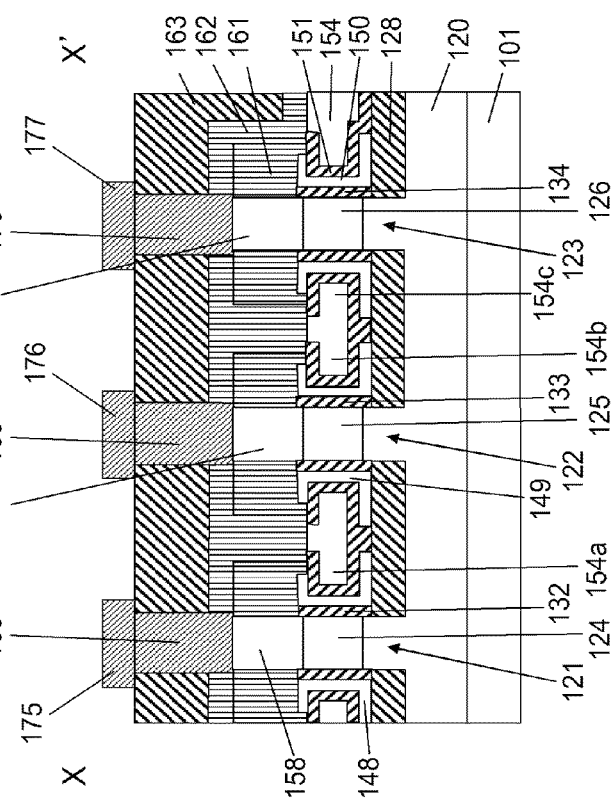
Fig.49A
Fig.49B
Fig.49C

NONVOLATILE SEMICONDUCTOR MEMORY TRANSISTOR AND METHOD FOR MANUFACTURING NONVOLATILE SEMICONDUCTOR MEMORY

RELATED APPLICATIONS

Pursuant to 35 U.S.C. §119(e), this application claims the benefit of the filing date of Provisional U.S. Patent Application Ser. No. 61/368,749 filed on Jul. 29, 2010. This application also claims priority under 35 U.S.C. §119(a) to JP2010-170870 filed on Jul. 29, 2010. The entire contents of these applications are hereby incorporated by reference.

BACKGROUND OF THE INVENTION

1. Field of the Invention

The present invention relates to a nonvolatile semiconductor memory transistor and a method for manufacturing a nonvolatile semiconductor memory.

2. Description of the Related Art

A flash memory including a control gate and a charge storage layer and designed to inject electric charge into the charge storage layer using hot electron injection, using Fowler-Nordheim current, or the like is known. Memory cells of the flash memory record unit data "1" or "0" using the difference in threshold voltage, which depends on the charge storage state of the charge storage layer.

In order to efficiently perform injection of electrons into the charge storage layer and emission of electrons from the charge storage layer, that is, writing and erasing of unit data, the capacitive coupling relationship between a floating gate and a control gate is important. The greater the capacitance between the floating gate and the control gate is, the more effectively the potential of the control gate can be transmitted to the floating gate. Therefore, writing and erasing are facilitated.

In order to increase the capacitance between the floating gate and the control gate, a Tri-Control Gate Surrounding Gate Transistor (TCG-SGT) Flash Memory Cell illustrated in FIG. 46 has been proposed (for example, see Takuya Ohba, Hiroki Nakamura, Hiroshi Sakuraba, Fujio Masuoka, "A novel tri-control gate surrounding gate transistor (TCG-SGT) nonvolatile memory cell for flash memory", Solid-State Electronics, Vol. 50, No. 6, pp. 924-928, June 2006). Since the control gate of the TCG-SGT flash memory cell has a structure that covers, in addition to the side surface of the floating gate, the upper and lower surfaces of the floating gate, the capacitance between the floating gate and the control gate can be increased, and writing and erasing are facilitated.

However, in order to increase the capacitance between the floating gate and the control gate in the TCG-SGT flash memory cell illustrated in FIG. 50, it is necessary to increase the thickness of the floating gate. If the film thickness of the floating gate is small, it is difficult to increase the capacitance between the floating gate and the control gate.

SUMMARY OF THE INVENTION

Accordingly, the present invention provides a nonvolatile semiconductor memory transistor having a structure utilizing an island-shaped semiconductor, in which the capacitance between a floating gate and a control gate can be increased, and a method for manufacturing a nonvolatile semiconductor memory.

A nonvolatile semiconductor memory transistor according to a first aspect of the present invention includes an island-shaped semiconductor, a floating gate, a control gate, and a control gate line. The island-shaped semiconductor has a source region, a channel region, and a drain region formed in the order of the source region, the channel region, and the drain region from the side of a substrate. The floating gate is arranged so as to surround an outer periphery of the channel region in such a manner that a tunnel insulating film is interposed between the floating gate and the channel region. The control gate is arranged so as to surround an outer periphery of the floating gate in such a manner that an inter-polysilicon insulating film is interposed between the control gate and the floating gate. The control gate line is electrically connected to the control gate and extending in a predetermined direction. The floating gate extends to regions below and above the control gate and to a region below the control gate line. The inter-polysilicon insulating film is arranged so as to be interposed between the floating gate and an upper surface, a lower surface, and an inner side surface of the control gate. The inter-polysilicon insulating film is arranged so as to be interposed between the control gate line and a portion of the floating gate that extends to the region below the control gate line.

Preferably, the nonvolatile semiconductor memory transistor further includes a first insulating film arranged on the substrate so as to be located below the floating gate, the first insulating film being thicker than at least one of the tunnel insulating film and the inter-polysilicon insulating film.

A method for manufacturing a nonvolatile semiconductor memory according to a second aspect of the present invention is a method for manufacturing a nonvolatile semiconductor memory including a floating gate arranged so as to surround an outer periphery of an island-shaped semiconductor with a tunnel insulating film interposed between the floating gate and the island-shaped semiconductor, a control gate arranged so as to surround an outer periphery of the floating gate with a second insulating film interposed between the control gate and the floating gate, and a control gate line electrically connected to the control gate and extending in a predetermined direction. The method includes a step of forming a plurality of island-shaped semiconductors on a source line formed at a predetermined position on a substrate; a step of forming a first insulating film between the island-shaped semiconductors that are adjacent to each other and on the source line; a step of forming a floating gate film by depositing a conductive material on the first insulating film; a step of forming a resist on the floating gate film, the resist having a groove extending in a direction perpendicular to the predetermined direction in which the control gate line extends; a step of forming a floating gate for each of the island-shaped semiconductors using the resist by separating the floating gate film from a portion that is a lower region of the groove and that is on the first insulating film by etching; a step of forming the second insulating film on the floating gate; a step of forming, on the second insulating film, a control gate that surrounds an outer periphery of each of the island-shaped semiconductors; a step of forming the control gate line connecting the control gates of adjacent island-shaped semiconductors among the island-shaped semiconductors; and a step of etching the floating gates so that the control gates and the floating gates overlap one another in a vertical direction with the second insulating film therebetween.

According to the present invention, it is possible to provide a nonvolatile semiconductor memory transistor having a structure utilizing an island-shaped semiconductor, in which the capacitance between a floating gate and a control gate can be increased, and a method for manufacturing a nonvolatile semiconductor memory.

BRIEF DESCRIPTION OF THE DRAWINGS

FIG. 2A is a plan view of a nonvolatile semiconductor memory according to an embodiment of the present invention, FIG. 2B is a cross-sectional view taken along line X-X' of FIG. 2A, and FIG. 2C is a cross-sectional view taken along line Y-Y' of FIG. 2A.

FIG. 3A is a plan view illustrating a method for manufacturing a nonvolatile semiconductor memory according to an embodiment of the present invention, FIG. 3B is a cross-sectional view taken along line X-X' of FIG. 3A, and FIG. 3C is a cross-sectional view taken along line Y-Y' of FIG. 3A.

FIG. 5A is a plan view illustrating the method for manufacturing a nonvolatile semiconductor memory according to the embodiment of the present invention, FIG. 5B is a cross-sectional view taken along line X-X' of FIG. 5A, and FIG. 5C is a cross-sectional view taken along line Y-Y' of FIG. 5A.

FIG. 7A is a plan view illustrating the method for manufacturing a nonvolatile semiconductor memory according to the embodiment of the present invention, FIG. 7B is a cross-sectional view taken along line X-X' of FIG. 7A, and FIG. 7C is a cross-sectional view taken along line Y-Y' of FIG. 7A.

FIG. 8A is a plan view illustrating the method for manufacturing a nonvolatile semiconductor memory according to the embodiment of the present invention, FIG. 8B is a cross-sectional view taken along line X-X' of FIG. 8A, and FIG. 8C is a cross-sectional view taken along line Y-Y' of FIG. 8A.

FIG. 9A is a plan view illustrating the method for manufacturing a nonvolatile semiconductor memory according to the embodiment of the present invention, FIG. 9B is a cross-sectional view taken along line X-X' of FIG. 9A, and FIG. 9C is a cross-sectional view taken along line Y-Y' of FIG. 9A.

FIG. 10A is a plan view illustrating the method for manufacturing a nonvolatile semiconductor memory according to the embodiment of the present invention, FIG. 10B is a cross-sectional view taken along line X-X' of FIG. 10A, and FIG. 10C is a cross-sectional view taken along line Y-Y' of FIG. 10A.

FIG. 11A is a plan view illustrating the method for manufacturing a nonvolatile semiconductor memory according to the embodiment of the present invention, FIG. 11B is a cross-sectional view taken along line X-X' of FIG. 11A, and FIG. 11C is a cross-sectional view taken along line Y-Y' of FIG. 11A.

FIG. 12A is a plan view illustrating the method for manufacturing a nonvolatile semiconductor memory according to the embodiment of the present invention, FIG. 12B is a cross-sectional view taken along line X-X' of FIG. 12A, and FIG. 12C is a cross-sectional view taken along line Y-Y' of FIG. 12A.

FIG. 16A is a plan view illustrating the method for manufacturing a nonvolatile semiconductor memory according to the embodiment of the present invention, FIG. 16B is a cross-sectional view taken along line X-X' of FIG. 16A, and FIG. 16C is a cross-sectional view taken along line Y-Y' of FIG. 16A.

FIG. 17A is a plan view illustrating the method for manufacturing a nonvolatile semiconductor memory according to the embodiment of the present invention, FIG. 17B is a cross-sectional view taken along line X-X' of FIG. 17A, and FIG. 17C is a cross-sectional view taken along line Y-Y' of FIG. 17A.

FIG. 18A is a plan view illustrating the method for manufacturing a nonvolatile semiconductor memory according to the embodiment of the present invention, FIG. 18B is a cross-sectional view taken along line X-X' of FIG. 18A, and FIG. 18C is a cross-sectional view taken along line Y-Y' of FIG. 18A.

FIG. 19A is a plan view illustrating the method for manufacturing a nonvolatile semiconductor memory according to the embodiment of the present invention, FIG. 19B is a cross-sectional view taken along line X-X' of FIG. 19A, and FIG. 19C is a cross-sectional view taken along line Y-Y' of FIG. 19A.

FIG. 21A is a plan view illustrating the method for manufacturing a nonvolatile semiconductor memory according to the embodiment of the present invention, FIG. 21B is a cross-sectional view taken along line X-X' of FIG. 21A, and FIG. 21C is a cross-sectional view taken along line Y-Y' of FIG. 21A.

FIG. 22A is a plan view illustrating the method for manufacturing a nonvolatile semiconductor memory according to the embodiment of the present invention, FIG. 22B is a cross-sectional view taken along line X-X' of FIG. 22A, and FIG. 22C is a cross-sectional view taken along line Y-Y' of FIG. 22A.

FIG. 23A is a plan view illustrating the method for manufacturing a nonvolatile semiconductor memory according to the embodiment of the present invention, FIG. 23B is a cross-sectional view taken along line X-X' of FIG. 23A, and FIG. 23C is a cross-sectional view taken along line Y-Y' of FIG. 23A.

FIG. 24A is a plan view illustrating the method for manufacturing a nonvolatile semiconductor memory according to the embodiment of the present invention, FIG. 24B is a cross-sectional view taken along line X-X' of FIG. 24A, and FIG. 24C is a cross-sectional view taken along line Y-Y' of FIG. 24A.

FIG. 25A is a plan view illustrating the method for manufacturing a nonvolatile semiconductor memory according to the embodiment of the present invention, FIG. 25B is a cross-sectional view taken along line X-X' of FIG. 25A, and FIG. 25C is a cross-sectional view taken along line Y-Y' of FIG. 25A.

FIG. 26A is a plan view illustrating the method for manufacturing a nonvolatile semiconductor memory according to the embodiment of the present invention, FIG. 26B is a cross-sectional view taken along line X-X' of FIG. 26A, and FIG. 26C is a cross-sectional view taken along line Y-Y' of FIG. 26A.

FIG. 28A is a plan view illustrating the method for manufacturing a nonvolatile semiconductor memory according to the embodiment of the present invention, FIG. 28B is a cross-sectional view taken along line X-X' of FIG. 28A, and FIG. 28C is a cross-sectional view taken along line Y-Y' of FIG. 28A.

FIG. 29A is a plan view illustrating the method for manufacturing a nonvolatile semiconductor memory according to the embodiment of the present invention, FIG. 29B is a cross-sectional view taken along line X-X' of FIG. 29A, and FIG. 29C is a cross-sectional view taken along line Y-Y' of FIG. 29A.

FIG. 30A is a plan view illustrating the method for manufacturing a nonvolatile semiconductor memory according to the embodiment of the present invention, FIG. 30B is a cross-sectional view taken along line X-X' of FIG. 30A, and FIG. 30C is a cross-sectional view taken along line Y-Y' of FIG. 30A.

FIG. 31A is a plan view illustrating the method for manufacturing a nonvolatile semiconductor memory according to the embodiment of the present invention, FIG. 31B is a cross-sectional view taken along line X-X' of FIG. 31A, and FIG. 31C is a cross-sectional view taken along line Y-Y' of FIG. 31A.

FIG. 32A is a plan view illustrating the method for manufacturing a nonvolatile semiconductor memory according to the embodiment of the present invention, FIG. 32B is a cross-sectional view taken along line X-X' of FIG. 32A, and FIG. 32C is a cross-sectional view taken along line Y-Y' of FIG. 32A.

FIG. 34A is a plan view illustrating the method for manufacturing a nonvolatile semiconductor memory according to the embodiment of the present invention, FIG. 34B is a cross-sectional view taken along line X-X' of FIG. 34A, and FIG. 34C is a cross-sectional view taken along line Y-Y' of FIG. 34A.

FIG. 35A is a plan view illustrating the method for manufacturing a nonvolatile semiconductor memory according to the embodiment of the present invention, FIG. 35B is a cross-sectional view taken along line X-X' of FIG. 35A, and FIG. 35C is a cross-sectional view taken along line Y-Y' of FIG. 35A.

FIG. 36A is a plan view illustrating the method for manufacturing a nonvolatile semiconductor memory according to the embodiment of the present invention, FIG. 36B is a cross-sectional view taken along line X-X' of FIG. 36A, and FIG. 36C is a cross-sectional view taken along line Y-Y' of FIG. 36A.

FIG. 39A is a plan view illustrating the method for manufacturing a nonvolatile semiconductor memory according to the embodiment of the present invention, FIG. 39B is a cross-sectional view taken along line X-X' of FIG. 39A, and FIG. 39C is a cross-sectional view taken along line Y-Y' of FIG. 39A.

FIG. 41A is a plan view illustrating the method for manufacturing a nonvolatile semiconductor memory according to the embodiment of the present invention, FIG. 41B is a cross-sectional view taken along line X-X' of FIG. 41A, and FIG. 41C is a cross-sectional view taken along line Y-Y' of FIG. 41A.

FIG. 44A is a plan view illustrating the method for manufacturing a nonvolatile semiconductor memory according to the embodiment of the present invention, FIG. 44B is a cross-sectional view taken along line X-X' of FIG. 44A, and FIG. 44C is a cross-sectional view taken along line Y-Y' of FIG. 44A.

FIG. 46A is a plan view illustrating the method for manufacturing a nonvolatile semiconductor memory according to the embodiment of the present invention, FIG. 46B is a cross-sectional view taken along line X-X' of FIG. 46A, and FIG. 46C is a cross-sectional view taken along line Y-Y' of FIG. 46A.

FIG. 49A is a plan view illustrating the method for manufacturing a nonvolatile semiconductor memory according to the embodiment of the present invention, FIG. 49B is a cross-sectional view taken along line X-X' of FIG. 49A, and FIG. 49C is a cross-sectional view taken along line Y-Y' of FIG. 49A.

DESCRIPTION OF THE PREFERRED EMBODIMENTS

An embodiment of the present invention will be described hereinafter with reference to the drawings. The present invention is not limited to the following embodiment.

Figure 1:
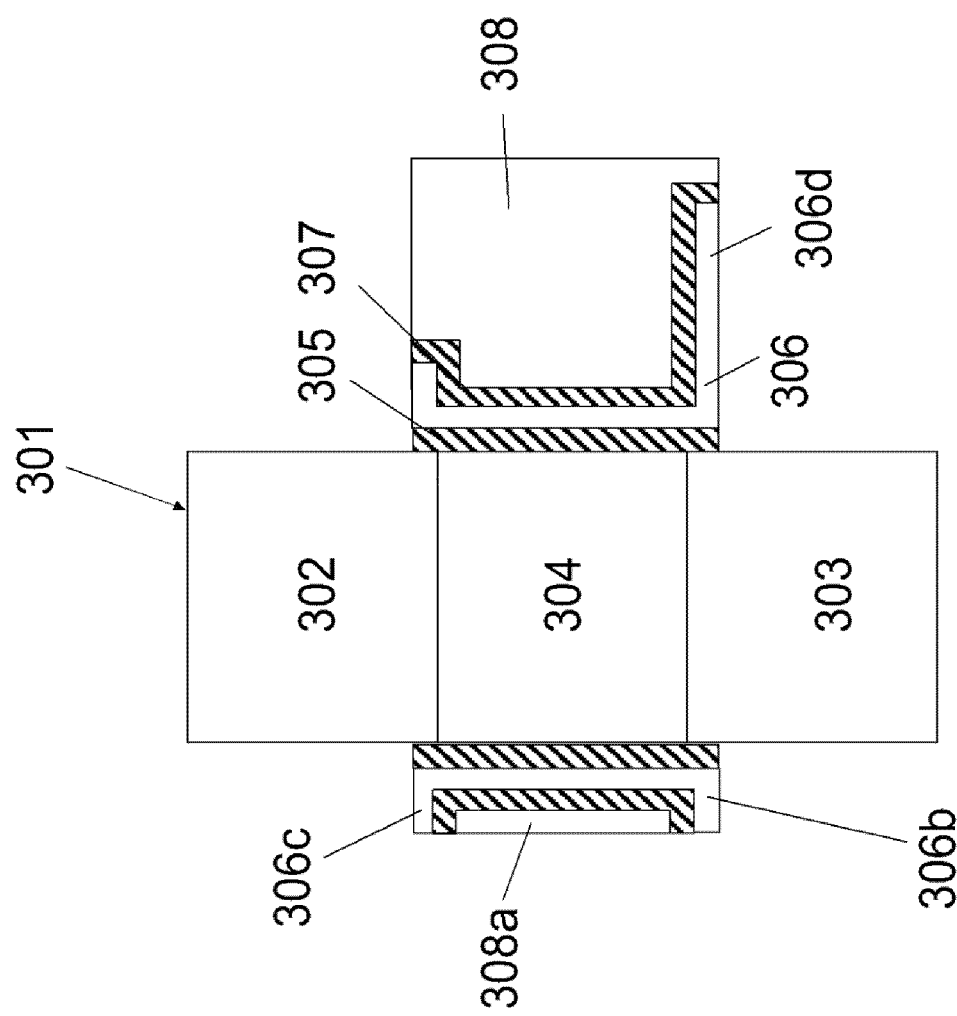
FIG. 1 is a cross-sectional view illustrating a main part of a nonvolatile semiconductor memory transistor according to an embodiment of the present invention.

FIG. 1 illustrates a cross-sectional view of a nonvolatile semiconductor memory transistor according to an embodiment of the present invention.

As illustrated in FIG. 1, the nonvolatile semiconductor memory transistor is configured such that a source region 303, a channel region 304, and a drain region 302 are formed in this order from the substrate side and constitute a cylindrical island-shaped semiconductor 301. The nonvolatile semiconductor memory transistor further includes a floating gate 306 arranged so as to surround the outer periphery of the channel region 304 with a tunnel insulating film 305 interposed between the floating gate 306 and the channel region 304, a control gate 308a arranged so as to surround the outer periphery of the floating gate 306 with an inter-polysilicon insulating film 307 interposed between the control gate 308a and the floating gate 306, and a control gate line 308 electrically connected to the control gate 308a and extending in a predetermined direction (to the right in FIG. 1).

The floating gate 306 extends to regions below and above the control gate 308a and to a region below the control gate line 308. Further, an inter-polysilicon insulating film 307 is arranged so as to be interposed between the floating gate 306 and the upper, lower, and inner side surfaces of the control gate 308a. The inter-polysilicon insulating film 307 is also arranged so as to be interposed between a third floating gate portion 306d extending to the lower surface of the control gate line 308 and the lower surface of the control gate line 308.

As illustrated in FIG. 1, the floating gate 306 includes a first floating gate portion 306b facing the lower surface of the control gate 308a, a second floating gate portion 306c facing the upper surface of the control gate 308a, and the floating gate portion 306d facing the lower surface of the control gate line 308. The first floating gate portion 306b, the second floating gate portion 306c, and the third floating gate portion 306d enable an increase in capacitance (electrostatic capacitance) consisting of first capacitance between the floating gate 306 and the control gate 308a and second capacitance between the floating gate 306 and the control gate line 308.

Figures 2A, 2B, 2C:
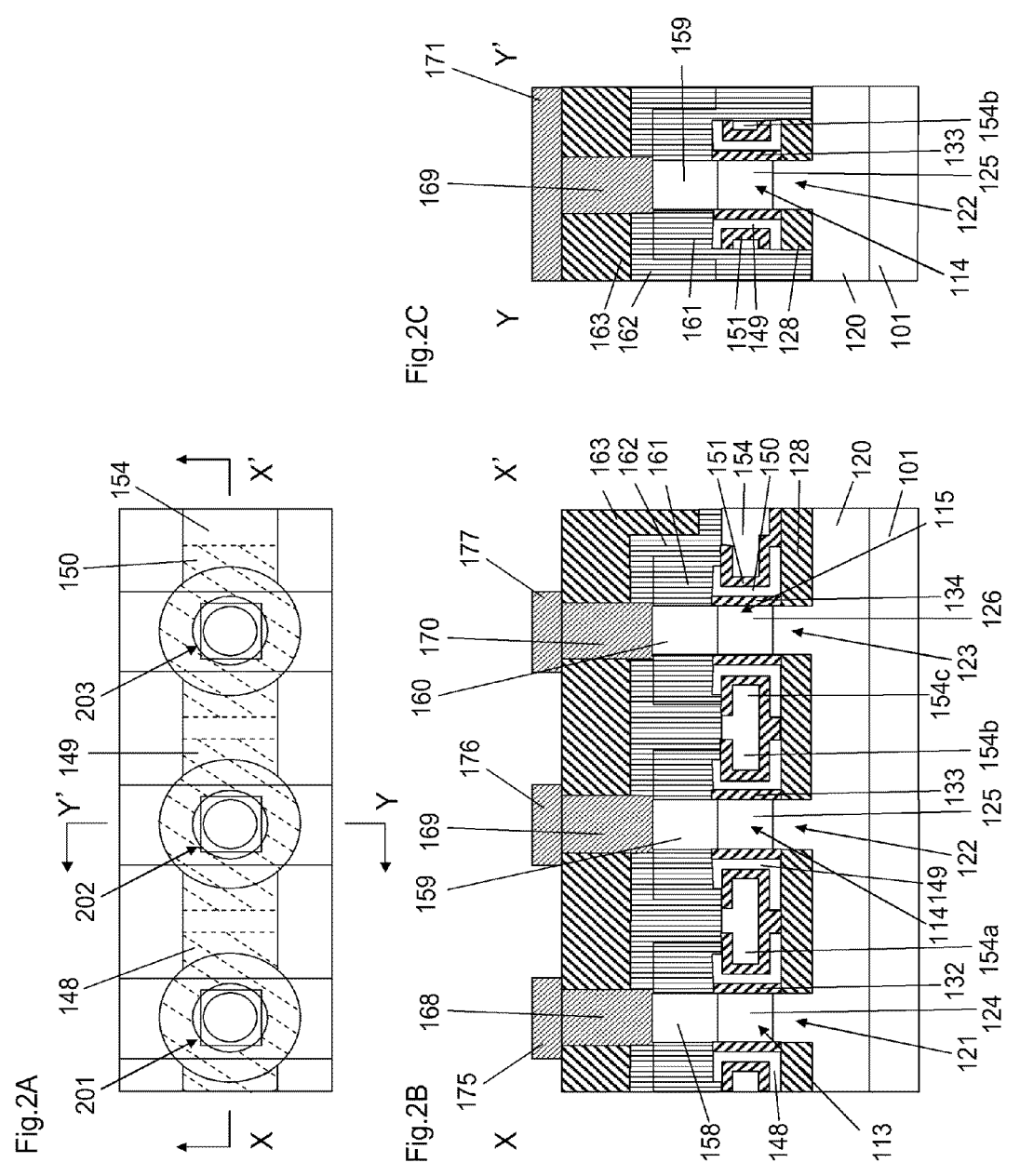

FIG. 2A, FIG. 2B, and FIG. 2C illustrate a plan view of a nonvolatile semiconductor memory according to this embodiment, an X-X' cross-sectional view of FIG. 2A, and a Y-Y' cross-sectional view of FIG. 2A, respectively.

As illustrated in FIG. 2A and FIG. 2B, the nonvolatile semiconductor memory is configured such that a plurality of (in the figures, three) nonvolatile semiconductor memory transistors 201, 202, and 203 each having the structure illustrated in FIG. 1 are arranged in a plurality of row directions among row and column directions on a silicon substrate 101 so as to be aligned in a straight line at substantially equal angles and intervals.

In the nonvolatile semiconductor memory illustrated in FIG. 2A to FIG. 2C, the nonvolatile semiconductor memory transistor 201 is arranged in the first column on the silicon substrate 101.

As illustrated in FIG. 2A and FIG. 2B, in the nonvolatile semiconductor memory transistor 201, a source region 121, a channel region 124, and a drain region 158 are formed in this order from the silicon substrate 101 side, and constitute an island-shaped semiconductor 113.

The nonvolatile semiconductor memory transistor 201 includes a floating gate 148 that is arranged so as to surround the outer periphery of the channel region 124 in such a manner that a tunnel insulating film 132 is interposed between the floating gate 148 and the channel region 124, and a control gate 154a that is arranged so as to surround the outer periphery of the floating gate 148 in such a manner that an inter-polysilicon insulating film 151 is interposed between the control gate 154a and the floating gate 148. A control gate line 154 extending in a predetermined direction (in the horizontal direction in FIG. 2B) between the nonvolatile semiconductor memory transistors 201 and 202 is electrically connected to the control gate 154a (in FIG. 2B, the control gate 154a and the control gate line 154 are illustrated in an integrated manner).

As illustrated in FIG. 2B, the floating gate 148 includes portions facing the upper and lower surfaces of the control gate 154a (which correspond to the second floating gate portion 306c and the first floating gate portion 306b in FIG. 1, respectively), and a portion facing the lower surface of the control gate line 154 (which corresponds to the third floating gate portion 306d in FIG. 1).

In the nonvolatile semiconductor memory transistor 201, an oxide film (first insulating film) 128 that is thicker than the tunnel insulating film 132 and the inter-polysilicon insulating film 151 is arranged on the lower surface of the floating gate 148. Here, the thickness of the oxide film 128 is larger than the thickness of the tunnel insulating film 132 and the inter-polysilicon insulating film 151. However, this is not meant to be limiting, and the oxide film 128 may be thicker than at least one of the tunnel insulating film 132 and the inter-polysilicon insulating film 151.

In the nonvolatile semiconductor memory illustrated in FIG. 2A to FIG. 2C, the nonvolatile semiconductor memory transistor 202 is arranged in the second column on the silicon substrate 101.

As illustrated in FIG. 2A, FIG. 2B, and FIG. 2C, in the nonvolatile semiconductor memory transistor 202, a source region 122, a channel region 125, and a drain region 159 are formed in this order from the silicon substrate 101 side, and constitute an island-shaped semiconductor 114.

The nonvolatile semiconductor memory transistor 202 includes a floating gate 149 that is arranged so as to surround the outer periphery of the channel region 125 in such a manner that a tunnel insulating film 133 is interposed between the floating gate 149 and the channel region 125, and a control gate 154b that is arranged so as to surround the outer periphery of the floating gate 149 in such a manner that the inter-polysilicon insulating film 151 is interposed between the control gate 154b and the floating gate 149. The control gate line 154 extending in a predetermined direction (in the horizontal direction in FIG. 2B) between the nonvolatile semiconductor memory transistors 202 and 203 is electrically connected to the control gate 154a (in FIG. 2B, the control gate 154b and the control gate line 154 are illustrated in an integrated manner).

As illustrated in FIG. 2B, the floating gate 149 includes portions facing the upper and lower surfaces of the control gate 154b (which correspond to the second floating gate portion 306c and the first floating gate portion 306b in FIG. 1, respectively), and a portion facing the lower surface of the control gate line 154 (which corresponds to the third floating gate portion 306d in FIG. 1).

In the nonvolatile semiconductor memory transistor 202, the oxide film (first insulating film) 128 that is thicker than the tunnel insulating film 133 and the inter-polysilicon insulating film 151 is arranged on the lower surface of the floating gate 149. Here, the thickness of the oxide film 128 is larger than the thickness of the tunnel insulating film 133 and the inter-polysilicon insulating film 151. However, this is not meant to be limiting, and the oxide film 128 may be thicker than at least one of the tunnel insulating film 133 and the inter-polysilicon insulating film 151.

In the nonvolatile semiconductor memory illustrated in FIG. 2A to FIG. 2C, the nonvolatile semiconductor memory transistor 203 is arranged in the third column on the silicon substrate 101.

As illustrated in FIG. 2A and FIG. 2B, in the nonvolatile semiconductor memory transistor 203, a source region 123, a channel region 126, and a drain region 160 are formed in this order from the silicon substrate 101 side, and constitute an island-shaped semiconductor 115.

The nonvolatile semiconductor memory transistor 203 includes a floating gate 150 that is arranged so as to surround the outer periphery of the channel region 126 in such a manner that a tunnel insulating film 134 is interposed between the floating gate 150 and the channel region 126, and a control gate 154c that is arranged so as to surround the outer periphery of the floating gate 150 in such a manner that the inter-polysilicon insulating film 151 is interposed between the control gate 154c and the floating gate 150. The control gate line 154 extending in a predetermined direction (in the horizontal direction in FIG. 2B) is electrically connected to the control gate 154c (in FIG. 2B, the control gate 154c and the control gate line 154 are illustrated in an integrated manner).

As illustrated in FIG. 2B, the floating gate 150 includes portions facing the upper and lower surfaces of the control gate 154c (which correspond to the second floating gate portion 306c and the first floating gate portion 306b in FIG. 1, respectively), and a portion facing the lower surface of the control gate line 154 (which corresponds to the third floating gate portion 306d in FIG. 1).

In the nonvolatile semiconductor memory transistor 203, the oxide film (first insulating film) 128 that is thicker than the tunnel insulating film 134 and the inter-polysilicon insulating film 151 is arranged on the lower surface of the floating gate 150. Here, the thickness of the oxide film 128 is larger than the thickness of the tunnel insulating film 134 and the inter-polysilicon insulating film 151. However, this is not meant to be limiting, and the oxide film 128 may be thicker than at least one of the tunnel insulating film 134 and the inter-polysilicon insulating film 151.

In the nonvolatile semiconductor memory illustrated in FIG. 2A to FIG. 2C, the source regions 121, 122, and 123 of the nonvolatile semiconductor memory transistors 201, 202, and 203 are formed in lower portions of the island-shaped semiconductors 113, 114, and 115 of the nonvolatile semiconductor memory transistors 201, 202, and 203, respectively, and are electrically connected to a source line 120 on the top of the silicon substrate 101. Further, the drain regions 158, 159, and 160 of the nonvolatile semiconductor memory transistors 201, 202, and 203 are connected to bit lines 175, 176, and 177 via contacts 168, 169, and 170, respectively.

An example of a manufacturing process for forming a memory cell array structure of the nonvolatile semiconductor memory according to the embodiment of the present invention will be described hereinafter with reference to FIGS. 3A to 49C.

Referring to FIG. 3A to FIG. 3C, an oxide film 102 is deposited on the top of a silicon substrate 101. After that, a nitride film 103 is deposited from above the oxide film 102.

Figure 4C:
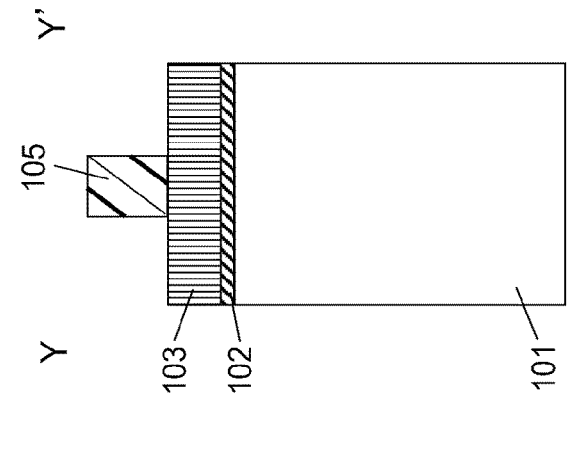
FIG. 4C is a cross-sectional view taken along line Y-Y' of FIG. 4A.
Figure 4A:
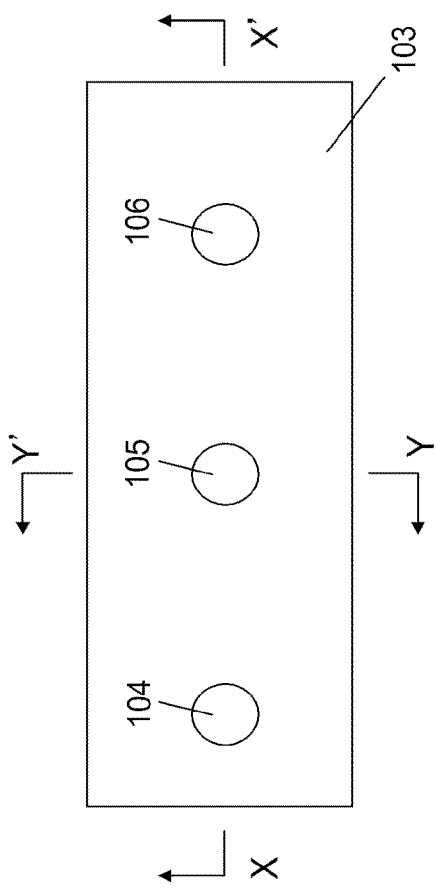
FIG. 4A is a plan view illustrating the method for manufacturing a nonvolatile semiconductor memory according to the embodiment of the present invention.
Figure 4B:
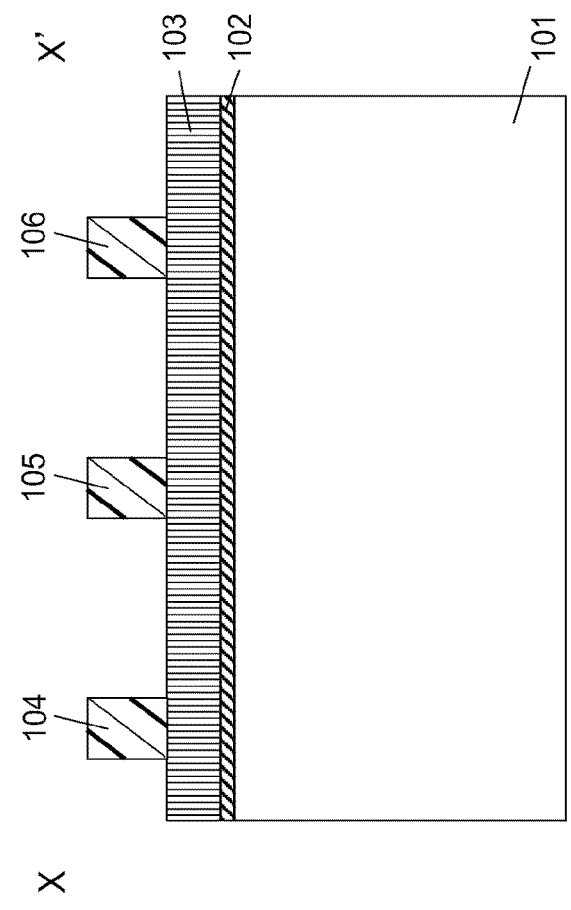
FIG. 4B is a cross-sectional view taken along line X-X' of FIG. 4A.

Subsequently, referring to FIG. 4A to FIG. 4C, resists 104, 105, and 106 for forming island-shaped semiconductors 113, 114, and 115 (see FIG. 2A to FIG. 2C) are formed at predetermined positions on the top of the nitride film 103.

Subsequently, referring to FIG. 5A to FIG. 5C, the nitride film 103 and the oxide film 102 are etched by reactive ion etching (RIE) using the resists 104, 105, and 106 as masks. Thereby, a hard mask made of a nitride film 107 and an oxide film 110, a hard mask made of a nitride film 108 and an oxide film 111, and a hard mask made of a nitride film 109 and an oxide film 112 are formed on the top of the silicon substrate 101.

Figure 6C:
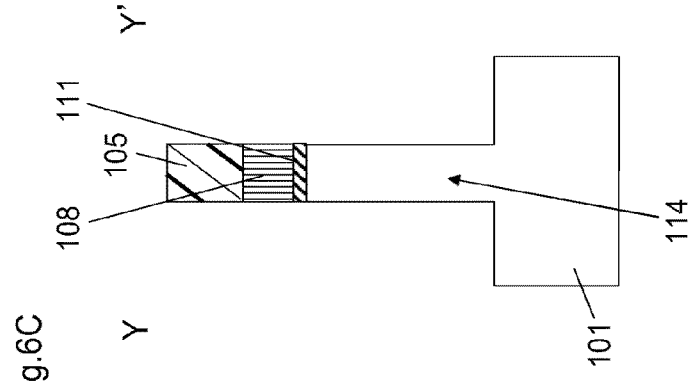
FIG. 6C is a cross-sectional view taken along line Y-Y' of FIG. 6A.
Figure 6A:
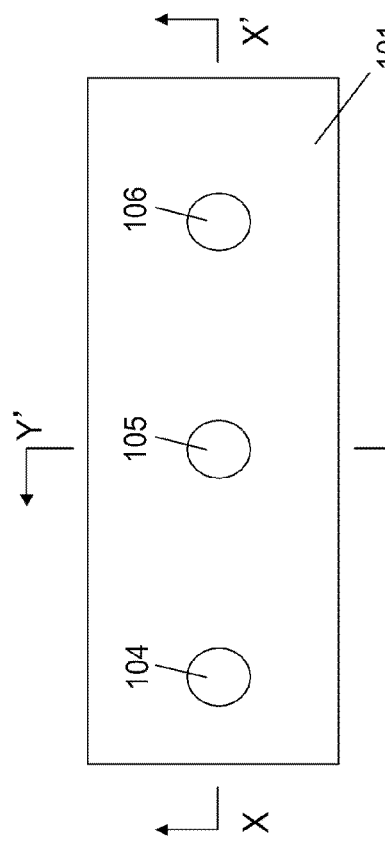
FIG. 6A is a plan view illustrating the method for manufacturing a nonvolatile semiconductor memory according to the embodiment of the present invention.
Figure 6B:
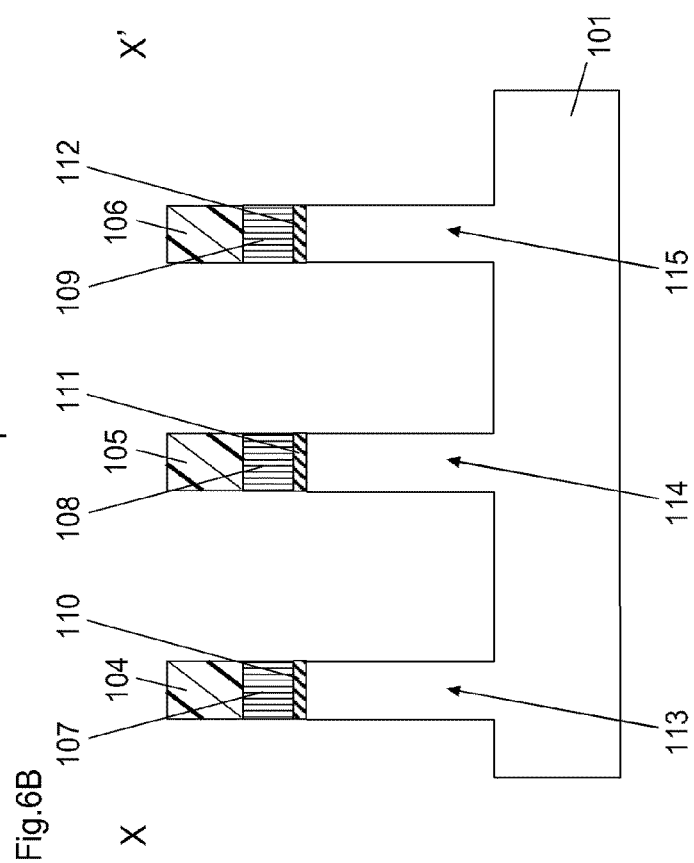
FIG. 6B is a cross-sectional view taken along line X-X' of FIG. 6A.

Subsequently, referring to FIG. 6A to FIG. 6C, further, the silicon substrate 101 is etched by reactive ion etching using the resists 104, 105, and 106 as masks, and the island-shaped semiconductors 113, 114, and 115 are formed.

Subsequently, referring to FIG. 7A to FIG. 7C, the resists 104, 105, and 106 are stripped.

Subsequently, referring to FIG. 8A to FIG. 8C, an oxide film 116 is deposited on the outer peripheral wall surfaces of the island-shaped semiconductors 113, 114, and 115 and on the bottom surfaces of the gaps between the island-shaped semiconductors 113, 114, and 115.

Subsequently, referring to FIG. 9A to FIG. 9C, the oxide film 116 is etched, and oxide film sidewalls 117, 118, and 119 are formed on the outer peripheral wall surfaces of the island-shaped semiconductors 113, 114, and 115, respectively.

Subsequently, referring to FIG. 10A to FIG. 10C, arsenic (see arrows As) is injected into the silicon substrate 101 to form a source line 120 that is an n-type (second conductivity type) semiconductor on the surface of the silicon substrate 101. Further, source regions 121, 122, and 123 are formed in lower portions of the island-shaped semiconductors 113, 114, and 115 (see FIG. 9A to FIG. 9C), respectively, so as to be electrically connected to the source line 120. At this time, channel regions 124, 125, and 126 are formed between the source region 121 and the nitride film 107 and oxide film 110, between the source region 122 and the nitride film 108 and oxide film 111, and between the source region 123 and the nitride film 109 and oxide film 112, respectively.

Subsequently, referring to FIG. 11A to FIG. 11C, the oxide film sidewalls 117, 118, and 119 are removed by etching.

Subsequently, referring to FIG. 12A to FIG. 12C, an oxide film 127 is deposited on the top of the source line 120, on the top of the nitride films 107, 108, and 109, and on the outer peripheral wall surfaces of the island-shaped semiconductors 113, 114, and 115 (see FIG. 9A to FIG. 9C) so that the oxide film 127 on the top of the source line 120 and the nitride films 107, 108, and 109 becomes thick while the oxide film 127 on the outer peripheral wall surfaces becomes thin.

Figure 13C:
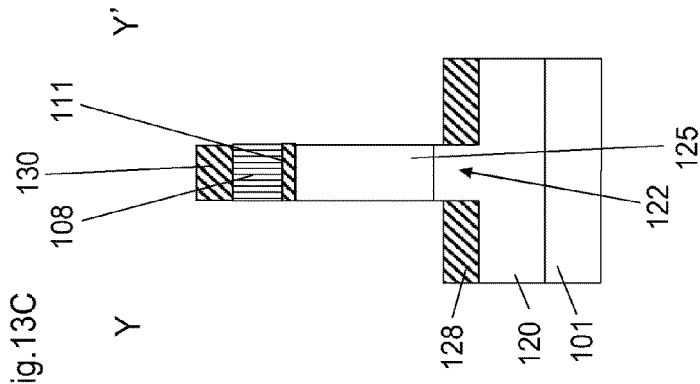
FIG. 13C is a cross-sectional view taken along line Y-Y' of FIG. 13A.
Figure 13A:
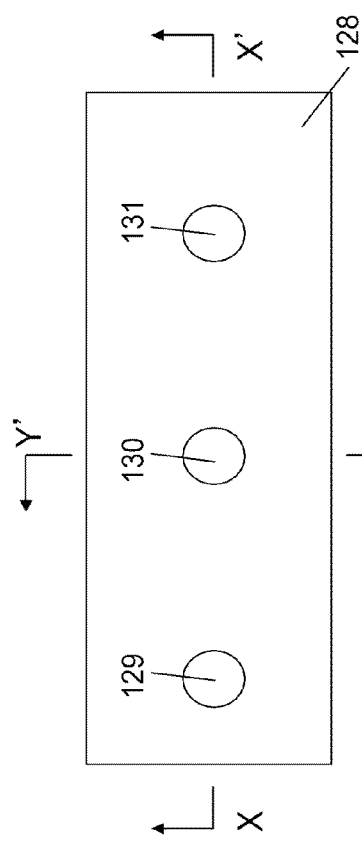
FIG. 13A is a plan view illustrating the method for manufacturing a nonvolatile semiconductor memory according to the embodiment of the present invention.
Figure 13B:
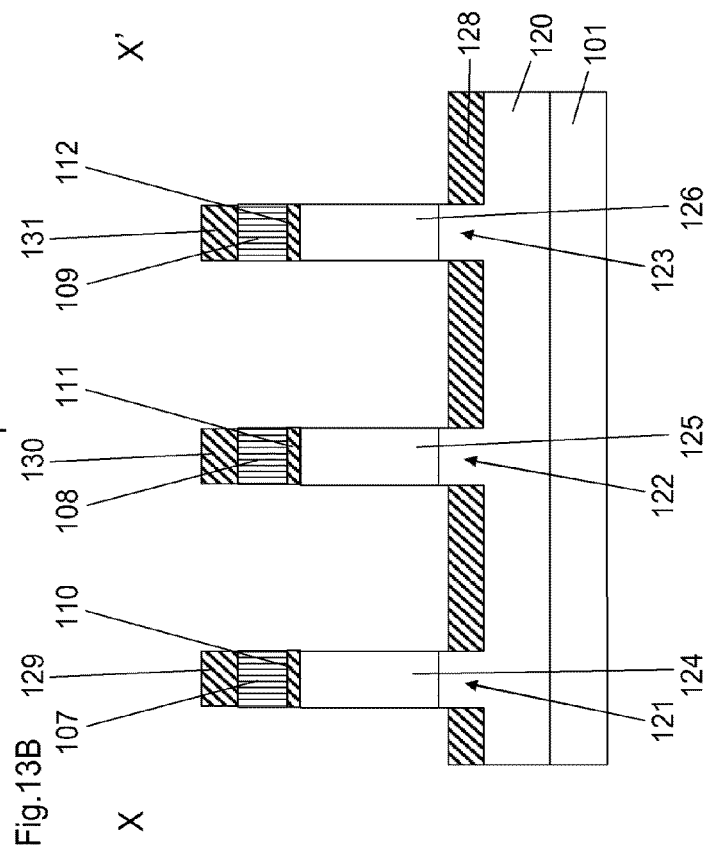
FIG. 13B is a cross-sectional view taken along line X-X' of FIG. 13A.

Subsequently, referring to FIG. 13A to FIG. 13C, the portions of the oxide film 127 deposited on the outer peripheral wall surfaces of the island-shaped semiconductors 113, 114, and 115 (see FIG. 9A to FIG. 9C) are etched by isotropic etching. Therefore, even after the removal of the portions of the oxide film 127 on the outer peripheral wall surfaces of the island-shaped semiconductors 113, 114, and 115 by etching, an oxide film 128 which is an insulating film remains on the gaps between the adjacent island-shaped semiconductors 113, 114, and 115 (see FIG. 9A to FIG. 9C) and on the top of the source line 120. Further, oxide films 129, 130, and 131 remain in a disk shape on the top of the nitride films 107, 108, and 109, respectively. In this manner, the oxide film 127 remains as the oxide films 129, 130, and 131 because of the following reason: Referring to FIG. 12A to FIG. 12C, the oxide film 127 is deposited on the top of the source line 120 and on the top of the nitride films 107, 108, and 109 so as to become thick while the oxide film 127 is deposited on the outer peripheral wall surfaces of the island-shaped semiconductors 113, 114, and 115 so as to become thin, and, additionally, the oxide film 127 has been subjected to isotropic etching in which etching progresses at the same speed in all directions. The oxide film 128 remaining on the top of the source line 120 becomes the first insulating film 128 (see FIG. 2B and FIG. 2C) in resulting nonvolatile semiconductor memory transistors 201, 202, and 203, respectively, and contributes to the reduction in the capacitance between the floating gates 148, 149, and 150 and the source line 120.

Figure 14A:
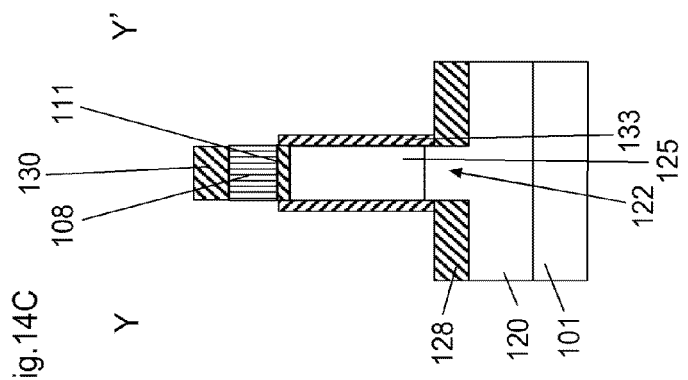
FIG. 14A is a plan view illustrating the method for manufacturing a nonvolatile semiconductor memory according to the embodiment of the present invention.
Figure 14B:
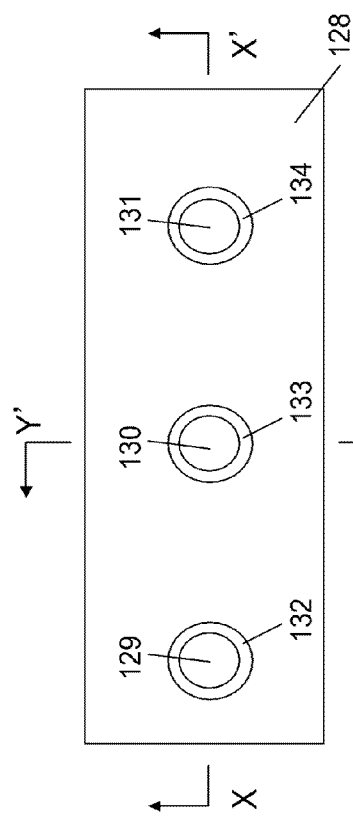
FIG. 14B is a cross-sectional view taken along line X-X' of FIG. 14A.
Figure 14C:
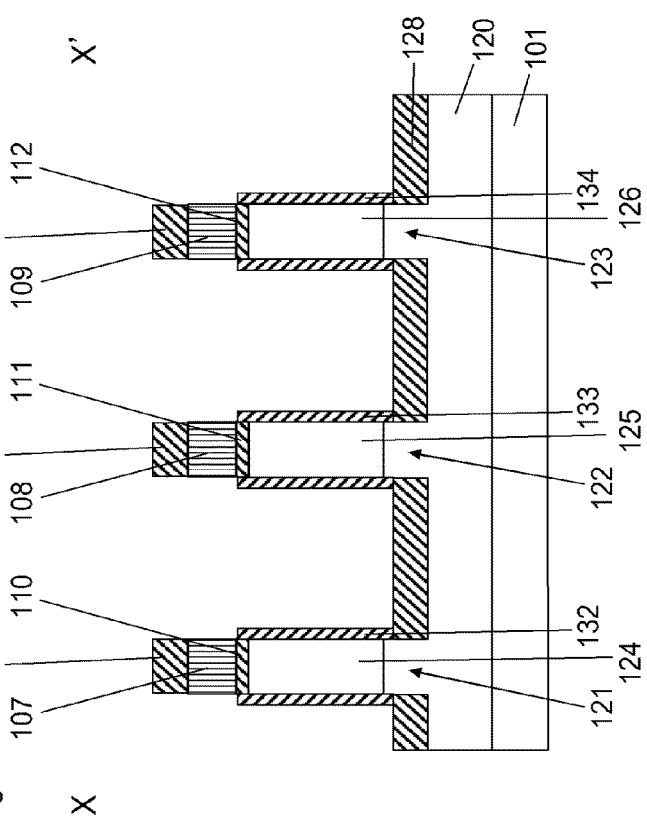
FIG. 14C is a cross-sectional view taken along line Y-Y' of FIG. 14A.

Subsequently, referring to FIG. 14A to FIG. 14C, tunnel insulating films 132, 133, and 134 are formed on the outer peripheral wall surfaces of the island-shaped semiconductors 113, 114, and 115 (see FIG. 9A to FIG. 9C), respectively, by gate oxidation.

Figure 15A:
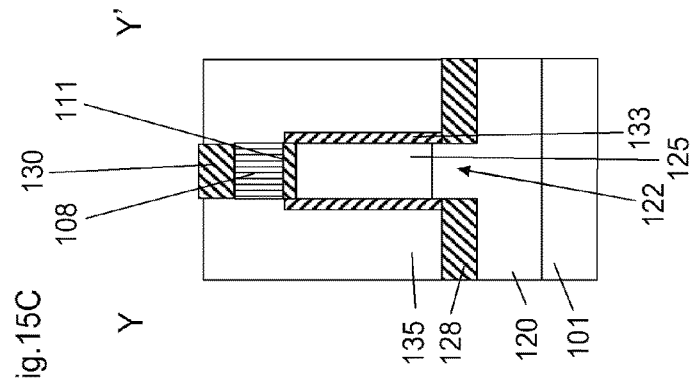
FIG. 15A is a plan view illustrating the method for manufacturing a nonvolatile semiconductor memory according to the embodiment of the present invention.
Figure 15B:
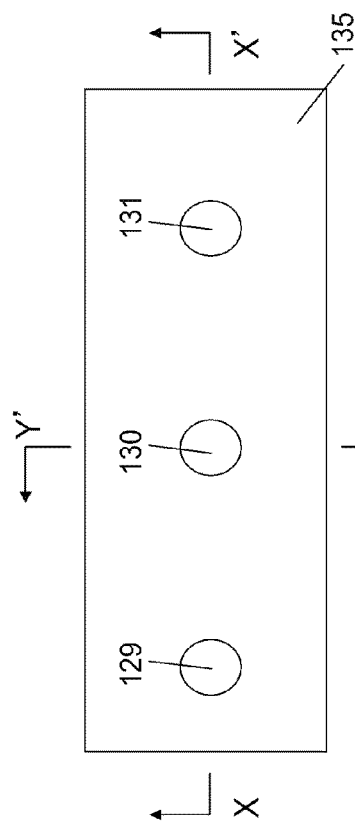
FIG. 15B is a cross-sectional view taken along line X-X' of FIG. 15A.
Figure 15C:
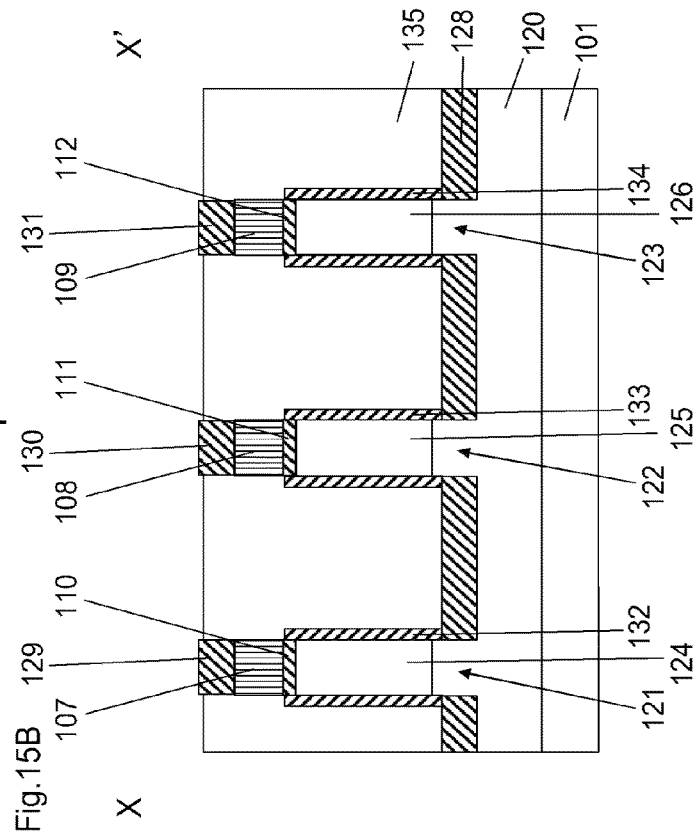
FIG. 15C is a cross-sectional view taken along line Y-Y' of FIG. 15A.

Subsequently, referring to FIG. 15A to FIG. 15C, a polysilicon layer 135 serving as a floating gate, which is a conductive material, is deposited and planarized so as to be buried in the gaps between the island-shaped semiconductors 113, 114, and 115 that are adjacent to each other (see FIG. 9A to FIG. 9C), and the oxide films 129, 130, and 131 are exposed.

Subsequently, referring to FIG. 16A to FIG. 16C, the oxide films 129, 130, and 131 are removed by etching.

Subsequently, referring to FIG. 17A to FIG. 17C, the polysilicon layer 135 is etched back to a predetermined depth by etching. With this etching back, the gate length of the resulting nonvolatile semiconductor memory transistors 201 to 203 (see FIG. 2A to FIG. 2C) is determined.

Subsequently, referring to FIG. 18A to FIG. 18C, an oxide film 136 is deposited. After that, a nitride film 137 is deposited from above the oxide film 136.

Subsequently, referring to FIG. 19A to FIG. 19C, the nitride film 137 and the oxide film 136 are etched by anisotropic etching. Further, the nitride film 137 and the oxide film 136 remain in a sidewall shape on the outer peripheral wall surfaces of the island-shaped semiconductors 113, 114, and 115 and the tunnel insulating films 132, 133, and 134, and on the outer peripheral wall surfaces of the nitride film 107 and oxide film 110, the nitride film 108 and oxide film 111, and the nitride film 109 and oxide film 112. Therefore, an insulating film sidewall 501 made of a nitride film 141 and an oxide film 138, an insulating film sidewall 502 made of a nitride film 142 and an oxide film 139, and an insulating film sidewall 503 made of a nitride film 143 and an oxide film 140 are formed.

Figure 20C:
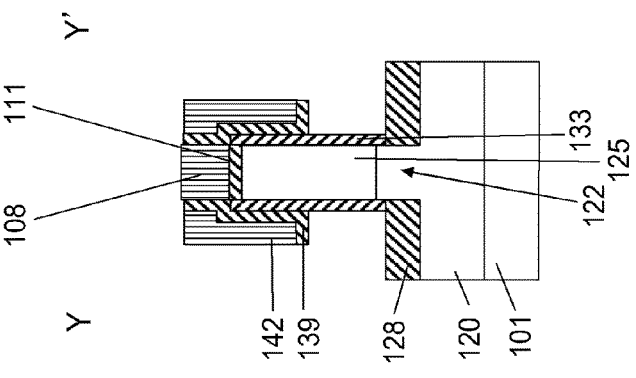
FIG. 20C is a cross-sectional view taken along line Y-Y' of FIG. 20A.
Figure 20A:
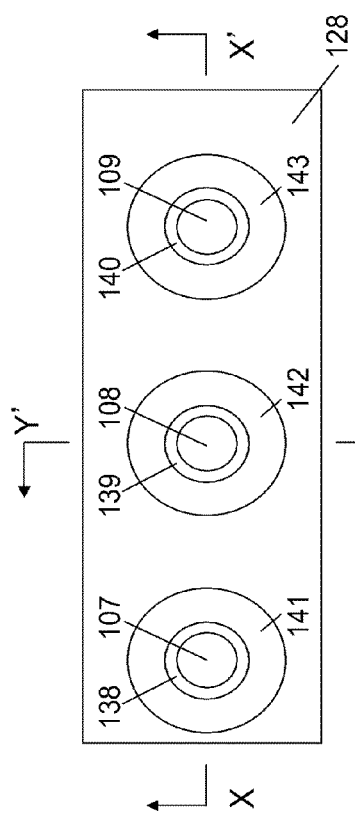
FIG. 20A is a plan view illustrating the method for manufacturing a nonvolatile semiconductor memory according to the embodiment of the present invention.
Figure 20B:
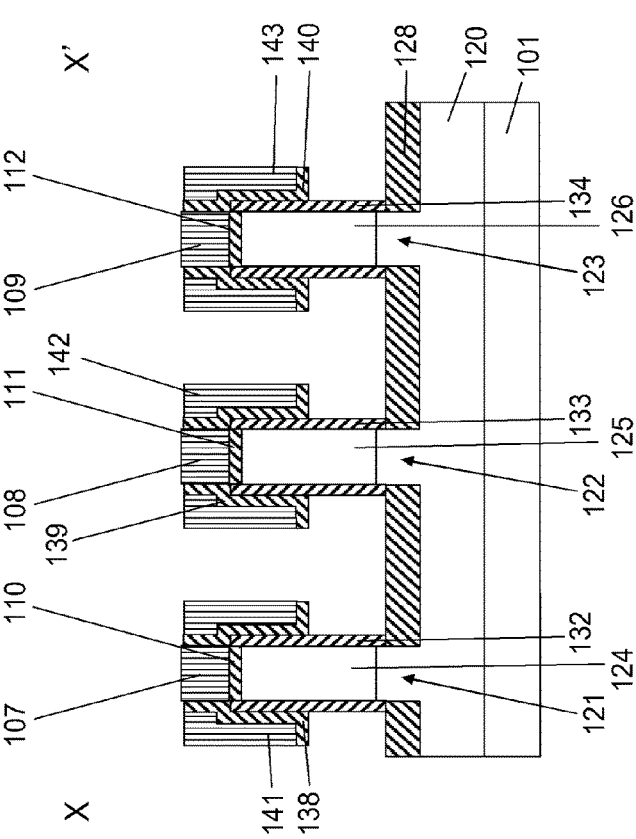
FIG. 20B is a cross-sectional view taken along line X-X' of FIG. 20A.

Subsequently, referring to FIG. 20A to FIG. 20C, the polysilicon layer 135 is removed by etching.

Subsequently, referring to FIG. 21A to FIG. 21C, a polysilicon layer 144 serving as a floating gate is deposited. Here, the exposed tunnel insulating films 132, 133, and 134 may be stripped, and thereafter different tunnel insulating films may be deposited in the stripped portions. After that, the polysilicon layer 144 may be deposited.

Subsequently, referring to FIG. 22A to FIG. 22C, resists 145, 146, and 147 having grooves extending in the direction perpendicular to the direction (the horizontal direction in FIG. 22B) in which a control gate line extends are formed.

Subsequently, referring to FIG. 23A to FIG. 23C, the polysilicon layer 144 is separated by removing portions that are on the oxide film 128 and that are below the grooves by etching using the resists 145, 146, and 147 as masks, and floating gates 148, 149, and 150 are formed for the island-shaped semiconductors 113, 114, and 115, respectively (see FIG. 9A to FIG. 9C).

Subsequently, referring to FIG. 24A to FIG. 24C, the resists 145, 146, and 147 are stripped.

Subsequently, referring to FIG. 25A to FIG. 25C, an inter-polysilicon insulating film 151 is formed. After that, a polysilicon layer 152 is deposited on the top of the inter-polysilicon insulating film 151, and planarized using CMP (Chemical Mechanical Polishing) so that the inter-polysilicon insulating film 151 is exposed. Here, the inter-polysilicon insulating film 151 may be formed of either a layered structure of an oxide film, an oxide film, a nitride film, and an oxide film, or of a high dielectric film.

Subsequently, referring to FIG. 26A to FIG. 26C, the polysilicon layer 152 is etched back to a predetermined depth by etching.

Figure 27C:
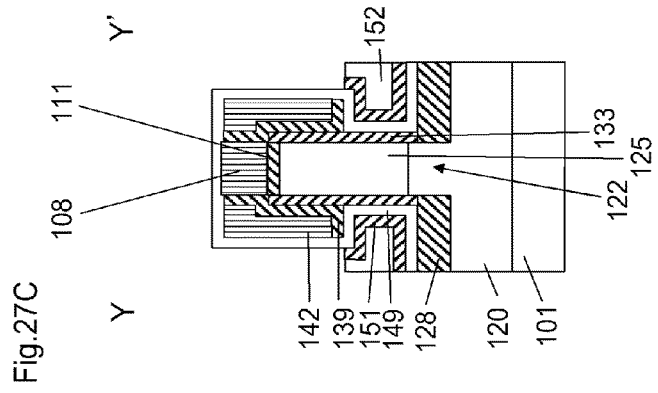
FIG. 27C is a cross-sectional view taken along line Y-Y' of FIG. 27A.
Figure 27A:
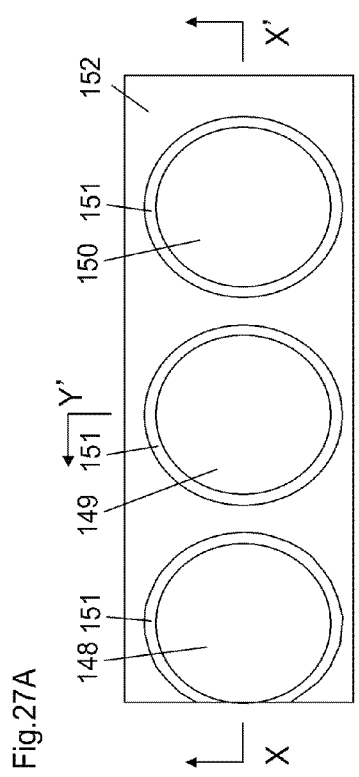
FIG. 27A is a plan view illustrating the method for manufacturing a nonvolatile semiconductor memory according to the embodiment of the present invention.
Figure 27B:
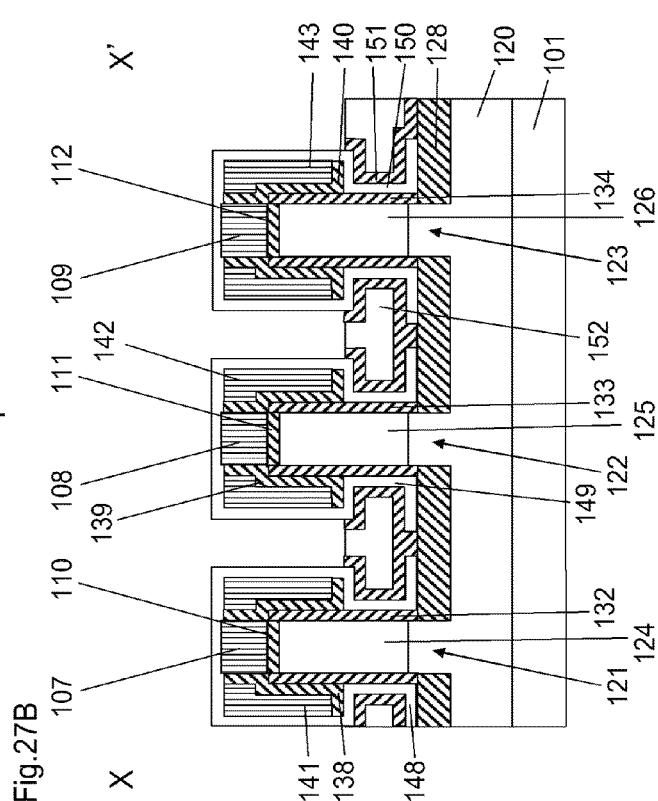
FIG. 27B is a cross-sectional view taken along line X-X' of FIG. 27A.

Subsequently, referring to FIG. 27A to FIG. 27C, the exposed portions of the inter-polysilicon insulating film 151 are removed by etching.

Subsequently, referring to FIG. 28A to FIG. 28C, the exposed portions of the floating gates 148, 149, and 150 and a portion of the polysilicon layer 152 are removed by etching.

Subsequently, referring to FIG. 29A to FIG. 29C, a resist 153 for forming a control gate line 154 is formed on the nitride films 107, 108, and 109.

Subsequently, referring to FIG. 30A to FIG. 30C, the exposed portions of the inter-polysilicon insulating film 151 are etched.

Subsequently, referring to FIG. 31A to FIG. 31C, control gates 154a, 154b, and 154c and a control gate line 154 are formed by etching the polysilicon layer 152, the inter-polysilicon insulating film 151, and the floating gates 148, 149, and 150 using the insulating film sidewalls 501, 502, and 503 and the resist 153 as masks so that the control gates 154a, 154b, and 154c overlap the floating gates 148, 149, and 150, respectively, in the vertical direction with the inter-polysilicon insulating film 151 therebetween. Then, portions facing the upper and lower surfaces of the control gates 154a, 154b, and 154c (which correspond to the second floating gate portion 306c and the first floating gate portion 306b in FIG. 1, respectively), and a portion facing the lower surface of the control gate line 154 (which corresponds to the third floating gate portion 306d in FIG. 1) are formed in the floating gates 148, 149, and 150.

Subsequently, referring to FIG. 32A to FIG. 32C, the exposed portions of the oxide film 128 are etched, and a first insulating film 128 is formed.

Figure 33C:
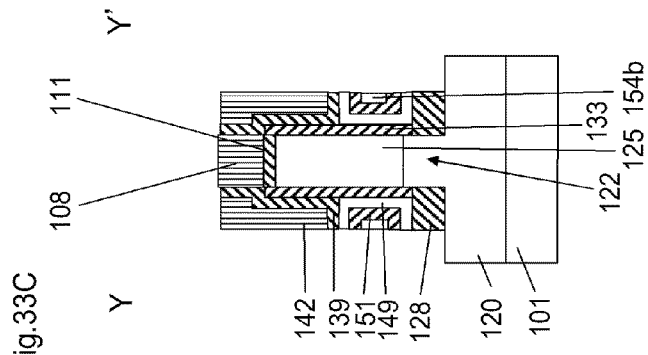
FIG. 33C is a cross-sectional view taken along line Y-Y' of FIG. 33A.
Figure 33A:
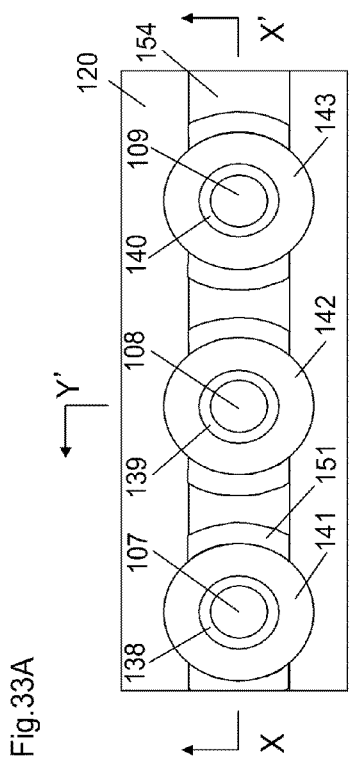
FIG. 33A is a plan view illustrating the method for manufacturing a nonvolatile semiconductor memory according to the embodiment of the present invention.
Figure 33B:
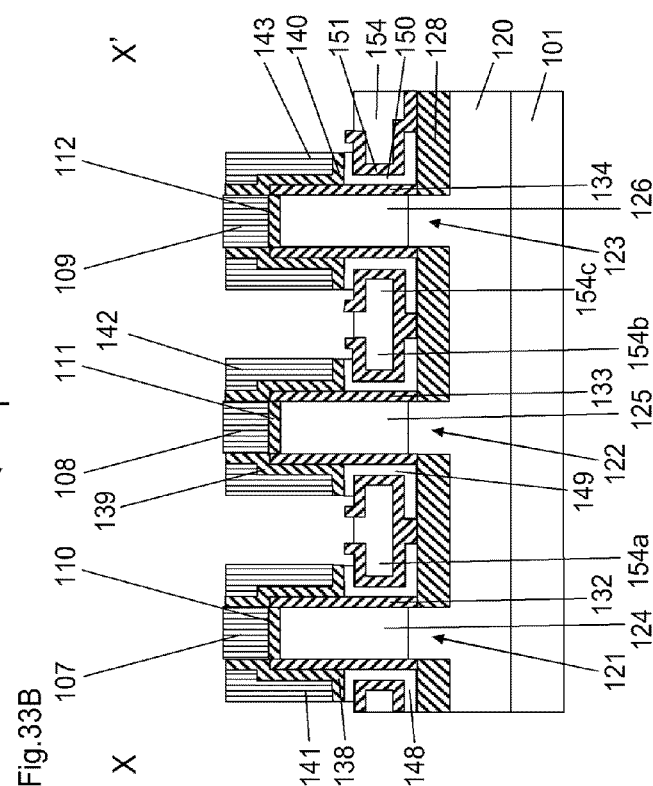
FIG. 33B is a cross-sectional view taken along line X-X' of FIG. 33A.

Subsequently, referring to FIG. 33A to FIG. 33C, the resist 153 is stripped.

Subsequently, referring to FIG. 34A to FIG. 34C, the surface layer portions of the control gate line 154, the floating gates 148, 149, and 150, and the source line 120 are oxidized to form an oxide film 155 on the top of the control gate line 154 and the floating gates 148, 149, and 150 and to form oxide films 156 and 157 on the top of the source line 120.

Subsequently, referring to FIG. 35A to FIG. 35C, the nitride films 107, 108, and 109 and the nitride films 141, 142, and 143 are stripped.

Subsequently, referring to FIG. 36A to FIG. 36C, the oxide films 110, 111, and 112, the oxide films 138, 139, and 140, the oxide films 155, 156, and 157, and the tunnel insulating films 132, 133, and 134 are stripped, and the channel regions 124, 125, and 126 of the island-shaped semiconductors 113, 114, and 115 (see FIG. 9A to FIG. 9C) are exposed.

Figure 37A:
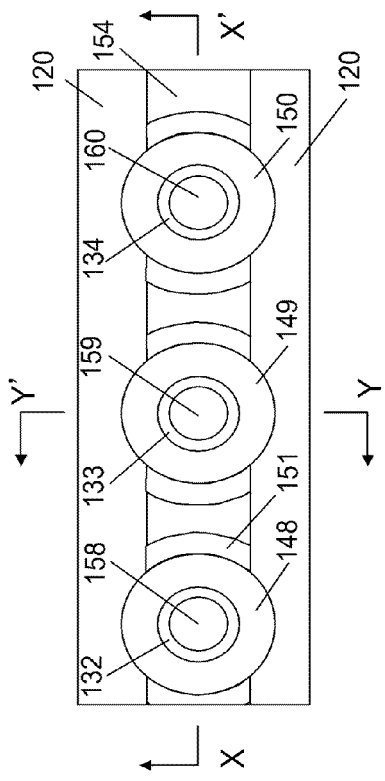
FIG. 37A is a plan view illustrating the method for manufacturing a nonvolatile semiconductor memory according to the embodiment of the present invention.
Figure 37C:
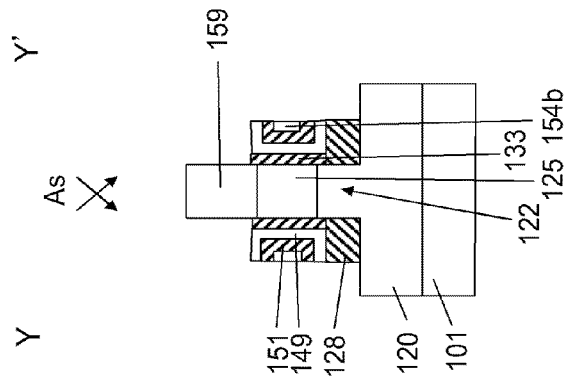
FIG. 37C is a cross-sectional view taken along line Y-Y' of FIG. 37A.
Figure 37B:
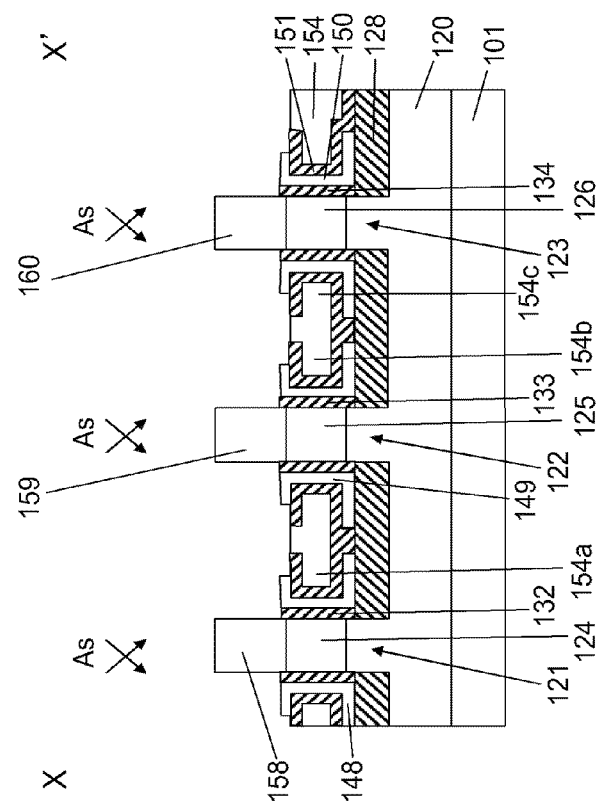
FIG. 37B is a cross-sectional view taken along line X-X' of FIG. 37A.

Subsequently, referring to FIG. 37A to FIG. 37C, arsenic (see arrows As) is injected into the top layer portions of the channel regions 124, 125, and 126 of the island-shaped semiconductors 113, 114, and 115, respectively, and drain regions 158, 159, and 160 that are n-type semiconductors are formed.

Figure 38C:
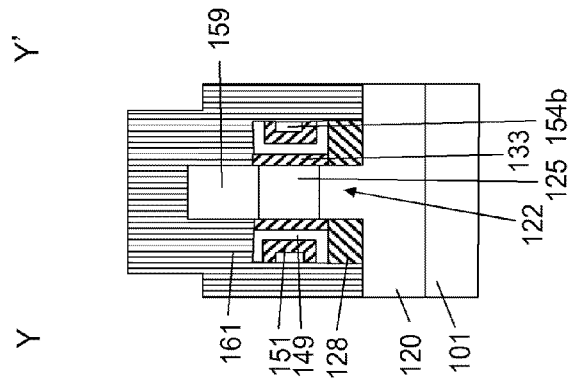
FIG. 38C is a cross-sectional view taken along line Y-Y' of FIG. 38A.
Figure 38A:
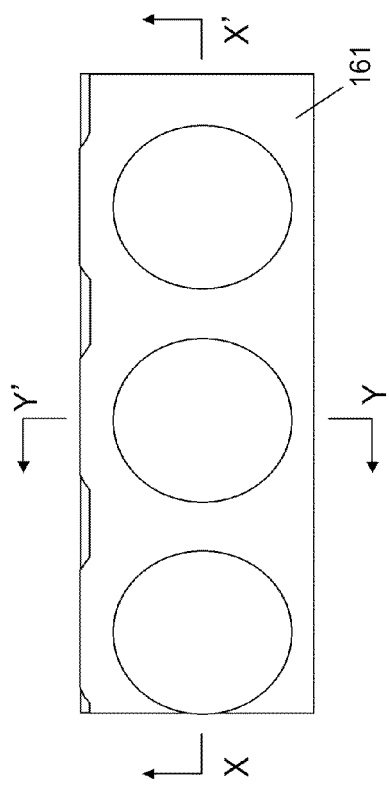
FIG. 38A is a plan view illustrating the method for manufacturing a nonvolatile semiconductor memory according to the embodiment of the present invention.
Figure 38B:
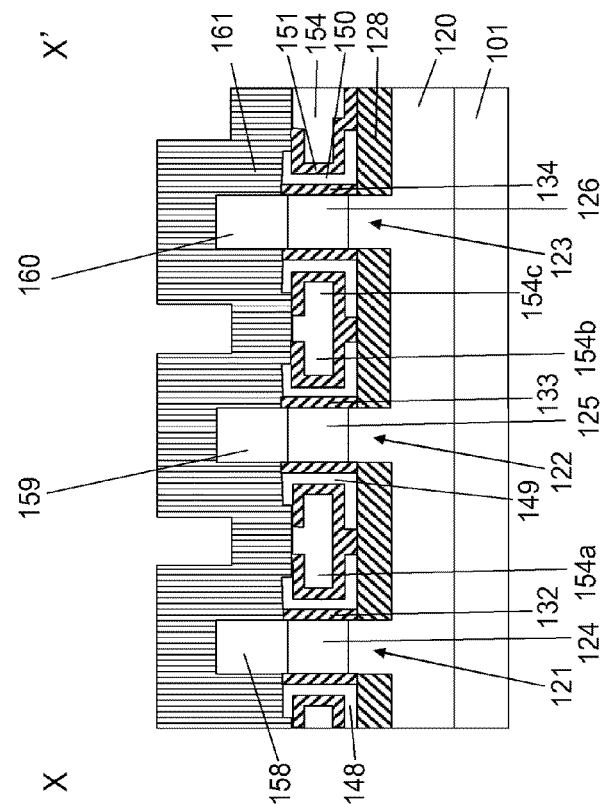
FIG. 38B is a cross-sectional view taken along line X-X' of FIG. 38A.

Subsequently, referring to FIG. 38A to FIG. 38C, a nitride film 161 is deposited so as to cover the island-shaped semiconductors 113, 114, and 115 (see FIG. 9A to FIG. 9C) and the source line 120.

Subsequently, referring to FIG. 39A to FIG. 39C, the nitride film 161 is etched so as to remain in a sidewall shape on the sidewalls of the island-shaped semiconductors 113, 114, and 115 (see FIG. 9A to FIG. 9C) and on the sidewall of the control gate line 154.

Figure 40A:
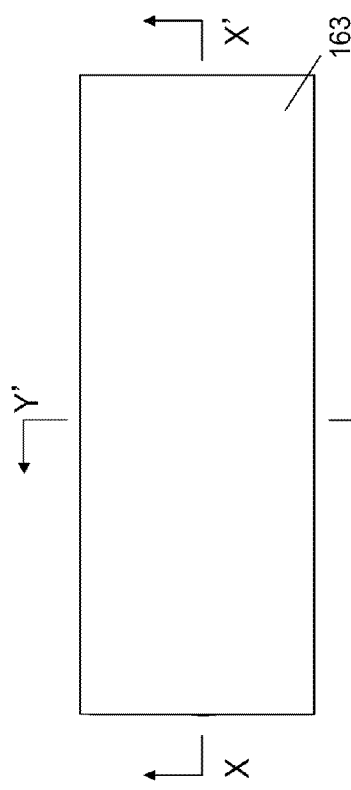
FIG. 40A is a plan view illustrating the method for manufacturing a nonvolatile semiconductor memory according to the embodiment of the present invention.
Figure 40C:
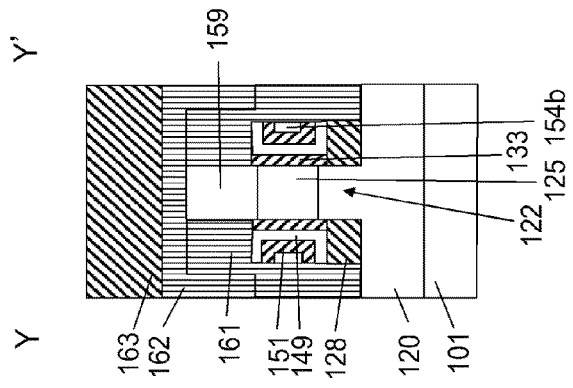
FIG. 40C is a cross-sectional view taken along line Y-Y' of FIG. 40A.
Figure 40B:
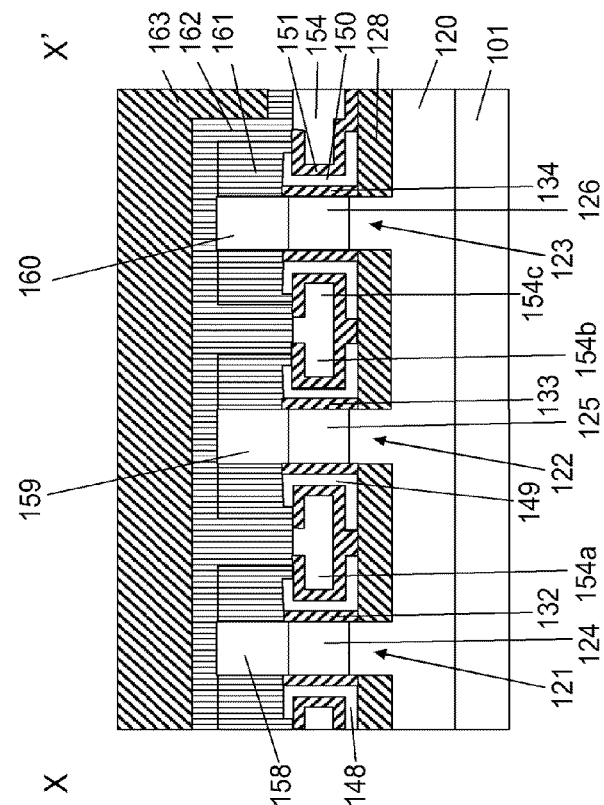
FIG. 40B is a cross-sectional view taken along line X-X' of FIG. 40A.

Subsequently, referring to FIG. 40A to FIG. 40C, a contact stopper 162 is deposited using an insulating material so as to cover the island-shaped semiconductors 113, 114, and 115 and the nitride film 161. Additionally, an interlayer film 163 is deposited on the top layer of the contact stopper 162, and thereafter planarized using CMP.

Subsequently, referring to FIG. 41A to FIG. 41C, a resist 164 for forming contact holes 165, 166, and 167 (see FIG. 42A to FIG. 42C) is formed at a predetermined position on the top of the interlayer film 163.

Figure 42A:
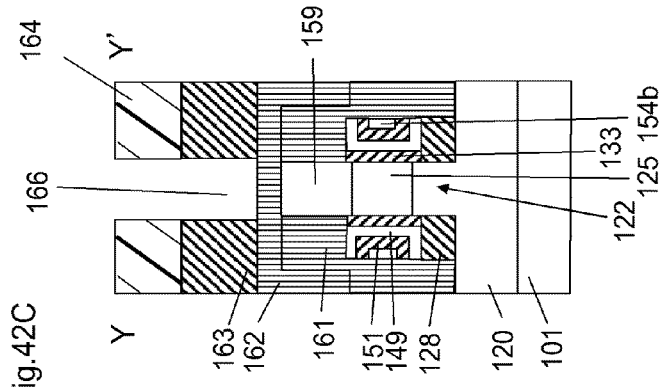
FIG. 42A is a plan view illustrating the method for manufacturing a nonvolatile semiconductor memory according to the embodiment of the present invention.
Figure 42B:
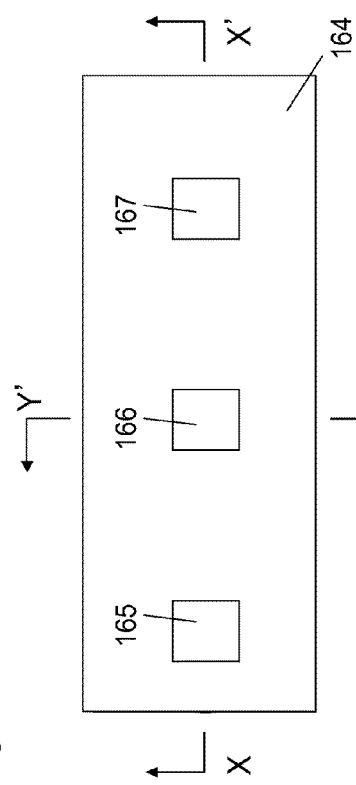
FIG. 42B is a cross-sectional view taken along line X-X' of FIG. 42A.
Figure 42C:
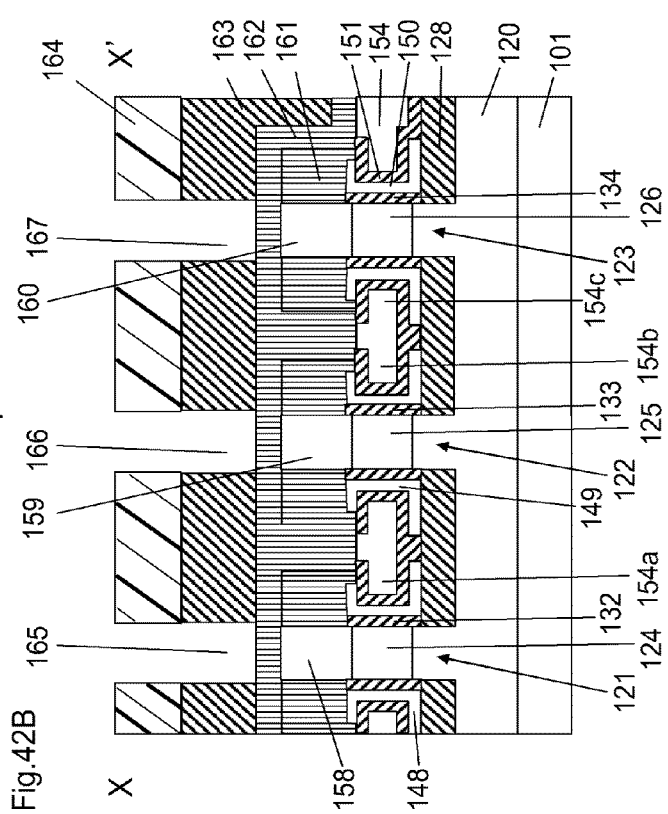
FIG. 42C is a cross-sectional view taken along line Y-Y' of FIG. 42A.

Subsequently, referring to FIG. 42A to FIG. 42C, the interlayer film 163 is etched using the resist 164 as a mask to form the contact holes 165, 166, and 167, and the portions of the surface of the contact stopper 162 are exposed.

Figure 43C:
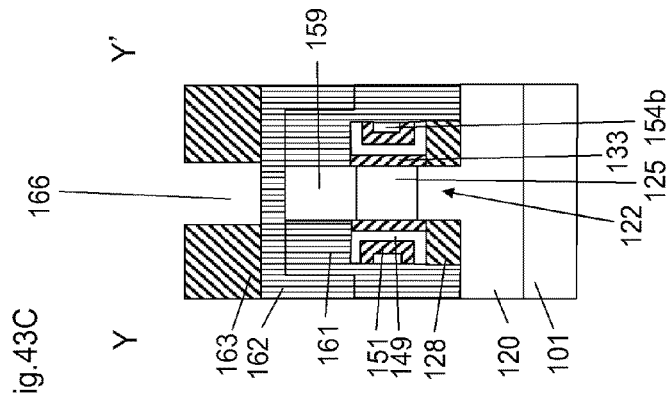
FIG. 43C is a cross-sectional view taken along line Y-Y' of FIG. 43A.
Figure 43A:
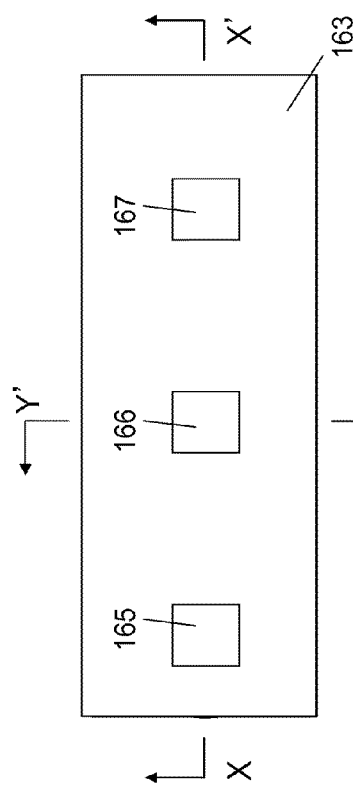
FIG. 43A is a plan view illustrating the method for manufacturing a nonvolatile semiconductor memory according to the embodiment of the present invention.
Figure 43B:
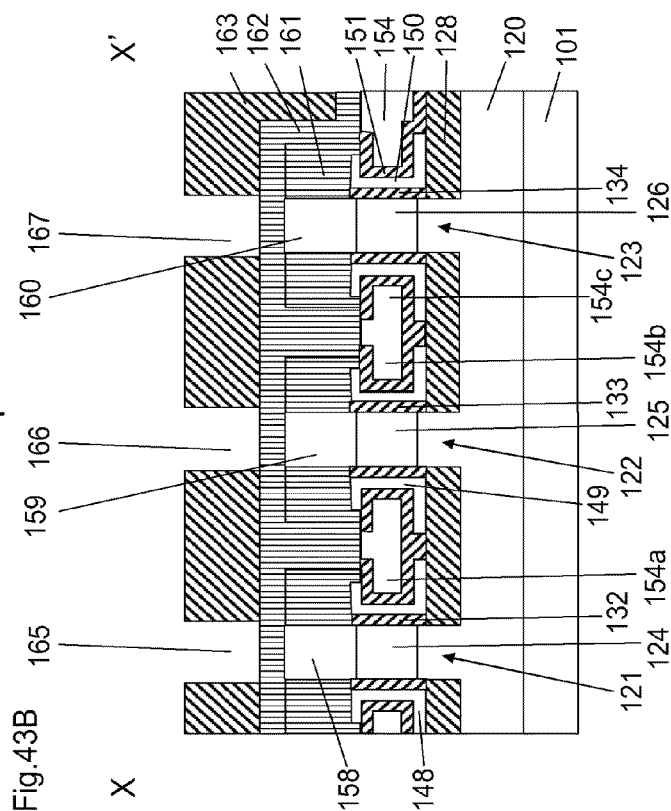
FIG. 43B is a cross-sectional view taken along line X-X' of FIG. 43A.

Subsequently, referring to FIG. 43A to FIG. 43C, the resist 164 is stripped.

Subsequently, referring to FIG. 44A to FIG. 44C, the portions of the contact stopper 162 which are located on the bottom portions of the contact holes 165, 166, and 167 are removed by etching.

Figure 45A:
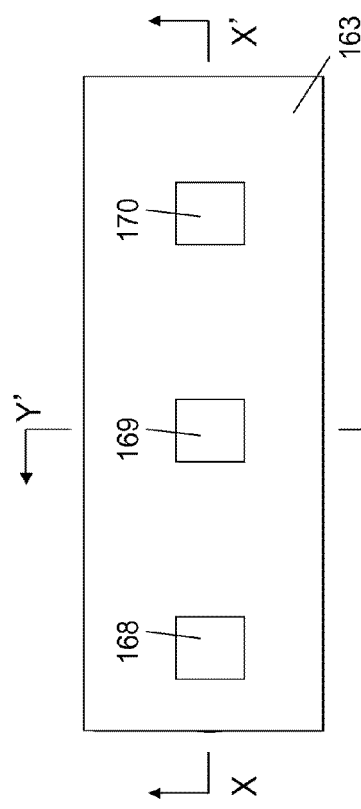
FIG. 45A is a plan view illustrating the method for manufacturing a nonvolatile semiconductor memory according to the embodiment of the present invention.
Figure 45C:
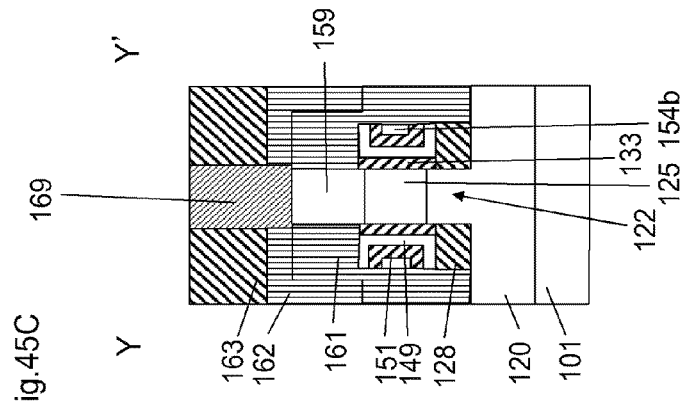
FIG. 45C is a cross-sectional view taken along line Y-Y' of FIG. 45A.
Figure 45B:
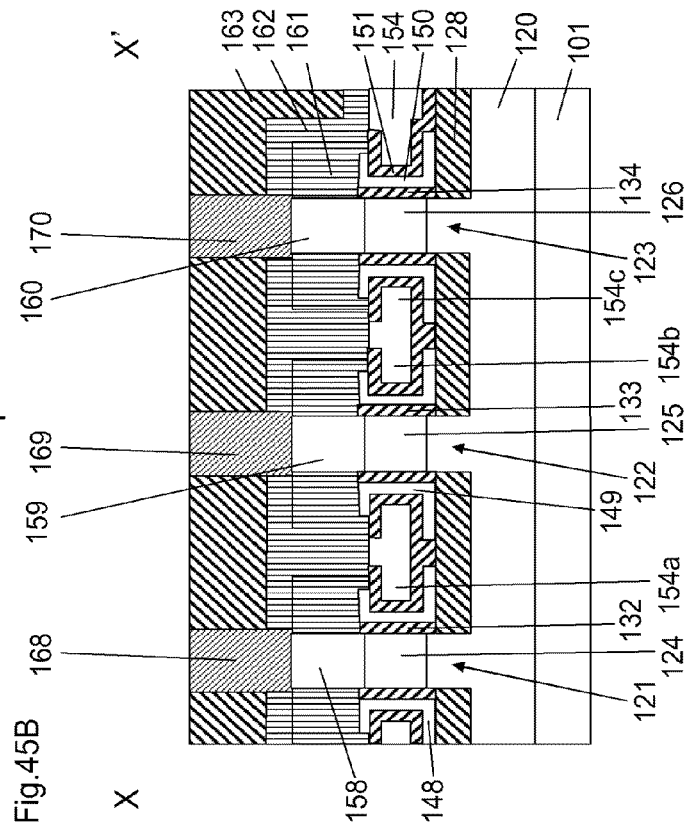
FIG. 45B is a cross-sectional view taken along line X-X' of FIG. 45A.

Subsequently, referring to FIG. 45A to FIG. 45C, contacts 168, 169, and 170 are formed using a conductive material in the contact holes 165, 166, and 167, respectively, and are electrically connected to the drain regions 158, 159, and 160 of the island-shaped semiconductors 113, 114, and 115 (see FIG. 9A to FIG. 9C), respectively.

Subsequently, referring to FIG. 46A to FIG. 46C, a metal 171 is deposited using a metal material on the top of the interlayer film 163 and the contacts 168, 169, and 170.

Figure 47A:
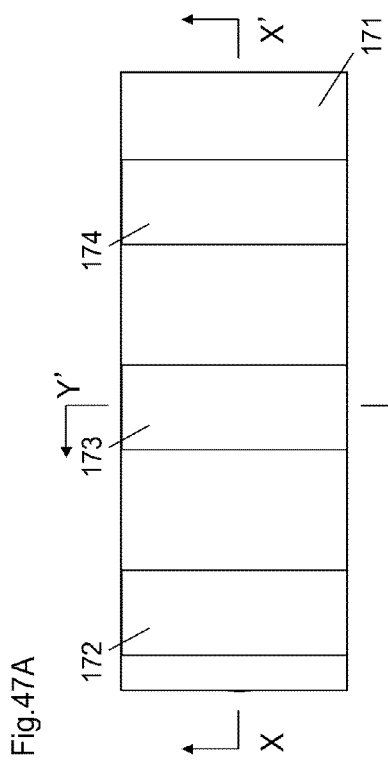
FIG. 47A is a plan view illustrating the method for manufacturing a nonvolatile semiconductor memory according to the embodiment of the present invention.
Figure 47B:
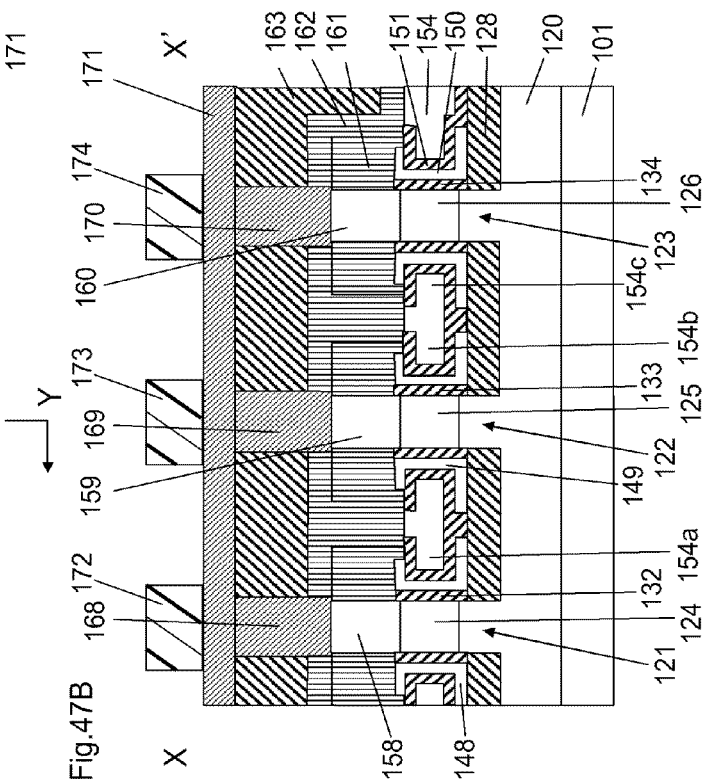
FIG. 47B is a cross-sectional view taken along line X-X' of FIG. 47A.
Figure 47C:
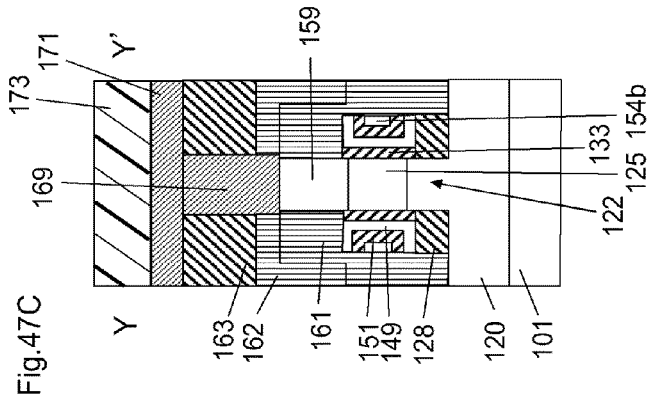
FIG. 47C is a cross-sectional view taken along line Y-Y' of FIG. 47A.

Subsequently, referring to FIG. 47A to FIG. 47C, resists 172, 173, and 174 for forming bit lines 175, 176, and 177 (see FIGS. 48A to 48C) of the resulting nonvolatile semiconductor memory transistors 201, 202, and 203, respectively, are formed on the top of the metal 171.

Figure 48A:
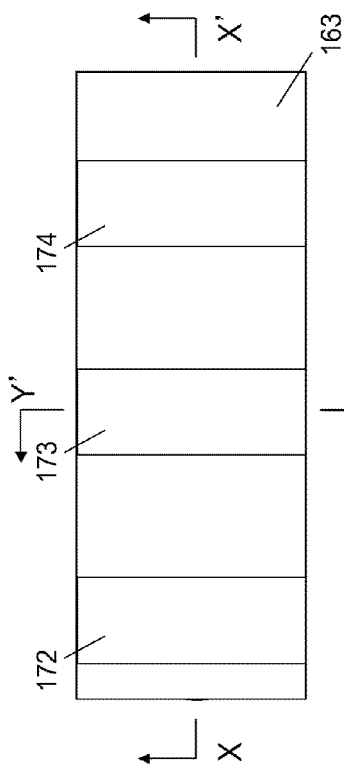
FIG. 48A is a plan view illustrating the method for manufacturing a nonvolatile semiconductor memory according to the embodiment of the present invention.
Figure 48C:
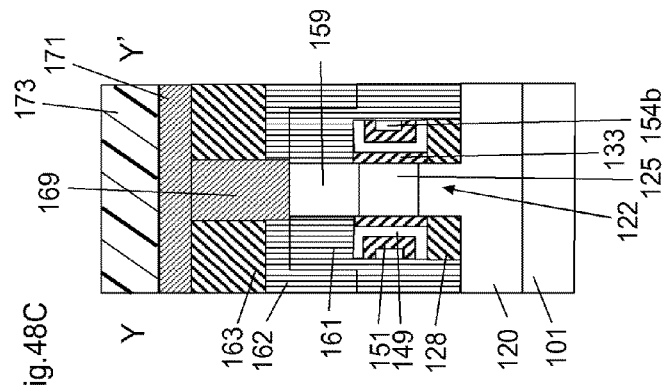
FIG. 48C is a cross-sectional view taken along line Y-Y' of FIG. 48A.
Figure 48B:
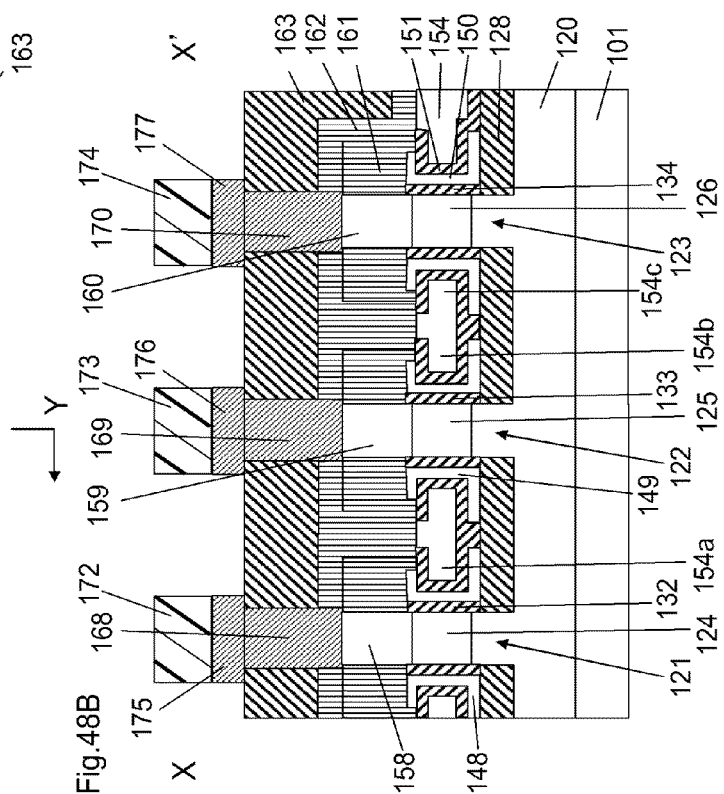
FIG. 48B is a cross-sectional view taken along line X-X' of FIG. 48A.
Figure 50:
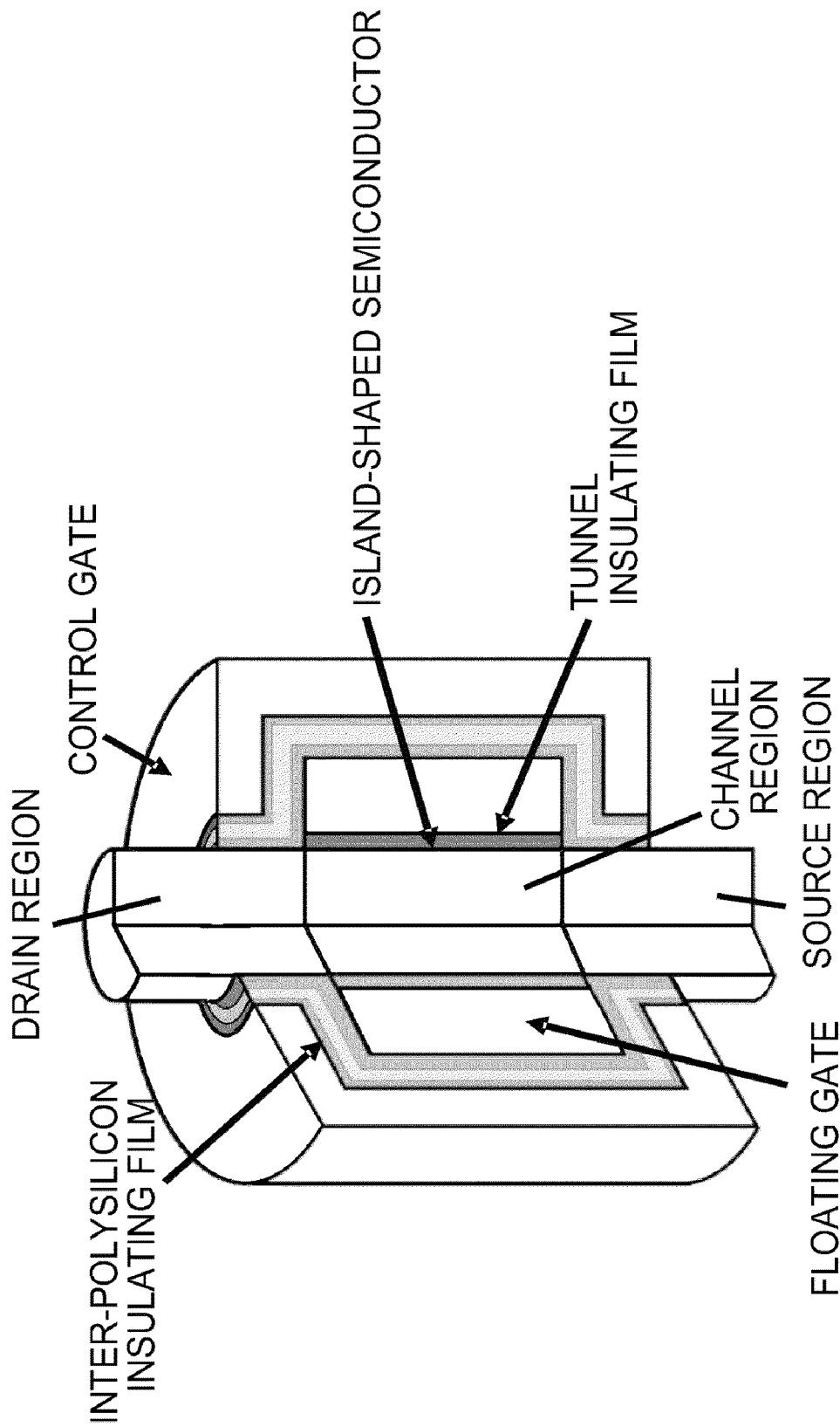
FIG. 50 is a cross-sectional view of an SGT flash memory of the related art.

Subsequently, referring to FIG. 48A to FIG. 48C, the metal 171 is etched using the resists 172, 173, and 174 as masks to form the bit lines 175, 176, and 177.

Subsequently, referring to FIG. 49A to FIG. 49C, the resists 172, 173, and 174 are stripped.

Therefore, the formation of the nonvolatile semiconductor memory illustrated in FIG. 2A to FIG. 2C is completed.

It is to be understood that the present invention can embrace various embodiments and modifications without departing from the broad spirit and scope of the present invention. In addition, the foregoing embodiment is used to describe an example of the present invention, and is not intended to limit the scope of the present invention.

What is claimed is:

1. A method for manufacturing a nonvolatile semiconductor memory including a floating gate arranged so as to surround an outer periphery of an island-shaped semiconductor with a tunnel insulating film interposed between the floating gate and the island-shaped semiconductor, a control gate arranged so as to surround an outer periphery of the floating gate with a second insulating film interposed between the control gate and the floating gate, and a control gate line electrically connected to the control gate and extending in a predetermined direction, the method comprising:
a step of forming a plurality of island-shaped semiconductors on a source line formed at a predetermined position on a substrate;
a step of forming a first insulating film between the island-shaped semiconductors that are adjacent to each other and on the source line;
a step of forming a floating gate film by depositing a conductive material on the first insulating film;
a step of forming a resist on the floating gate film, the resist having a groove extending in a direction perpendicular to the predetermined direction in which the control gate line extends;
a step of forming a floating gate for each of the island-shaped semiconductors using the resist by separating the floating gate film from a portion that is a lower region of the groove and that is on the first insulating film by etching;
a step of forming the second insulating film on the floating gate;
a step of forming, on the second insulating film, a control gate that surrounds an outer periphery of each of the island-shaped semiconductors;
a step of forming the control gate line connecting the control gates of adjacent island-shaped semiconductors among the island-shaped semiconductors; and
a step of etching the floating gates so that the control gates and the floating gates overlap one another in a vertical direction with the second insulating film therebetween.

2. A nonvolatile semiconductor memory transistor comprising:
an island-shaped semiconductor having a source region, a channel region, and a drain region formed in the order of the source region, the channel region, and the drain region from the side of a substrate;
a floating gate arranged so as to surround an outer periphery of the channel region in such a manner that a tunnel insulating film is interposed between the floating gate and the channel region;
a control gate arranged so as to surround an outer periphery of the floating gate in such a manner that an inter-polysilicon insulating film is interposed between the control gate and the floating gate; and a control gate line electrically connected to the control gate and extending in a predetermined direction, wherein the floating gate extends to regions below and above the control gate and to a region below the control gate line, wherein the inter-polysilicon insulating film is arranged so as to be interposed between the floating gate and an upper surface, a lower surface, and an inner side surface of the control gate, and wherein the inter-polysilicon insulating film is arranged so as to be interposed between the control gate line and a portion of the floating gate that extends to the region below the control gate line.

3. The nonvolatile semiconductor memory transistor according to claim 2, further comprising a first insulating film arranged on the substrate so as to be located below the floating gate, the first insulating film being thicker than at least one of the tunnel insulating film and the inter-polysilicon insulating film.

* * * * *